United States Patent
Jinta

(10) Patent No.: US 7,843,221 B2
(45) Date of Patent: Nov. 30, 2010

(54) SEMICONDUCTOR DEVICE, DISPLAY PANEL AND ELECTRONIC EQUIPMENT

(75) Inventor: Seiichiro Jinta, Aichi (JP)

(73) Assignee: Sony Corporation, Tokyo (JP)

(*) Notice: Subject to any disclaimer, the term of this patent is extended or adjusted under 35 U.S.C. 154(b) by 32 days.

(21) Appl. No.: 12/320,962

(22) Filed: Feb. 10, 2009

(65) Prior Publication Data

US 2009/0237123 A1    Sep. 24, 2009

(30) Foreign Application Priority Data

Mar. 18, 2008    (JP) ............................... 2008-068900

(51) Int. Cl.
*H03K 19/0175* (2006.01)
*H03K 19/094* (2006.01)

(52) U.S. Cl. ............................ 326/68; 326/88; 327/390; 345/92

(58) Field of Classification Search ................. 326/68, 326/27, 83, 88; 327/108, 390; 345/87, 92
See application file for complete search history.

(56) References Cited

U.S. PATENT DOCUMENTS 5,870,071 A * 2/1999 Kawahata .................. 345/100

FOREIGN PATENT DOCUMENTS

JP    2005-149624    6/2005

* cited by examiner

*Primary Examiner*—Daniel D Chang
(74) *Attorney, Agent, or Firm*—Rader, Fishman & Grauer PLLC

(57) ABSTRACT

The present invention provides a semiconductor device having a buffer circuit formed on an insulating substrate using single-channel type thin film transistors, wherein the buffer circuit has an output stage which including first and second thin film transistors connected in series between first and second power sources, and the output terminal potential of the output stage is switched to the potential of the first or second power source in a complementary manner by the input timings of a set signal adapted to control the first thin film transistor and a reset signal adapted to control the second thin film transistor.

15 Claims, 67 Drawing Sheets k: EVEN NUMBER
N: INTEGER

FIG.21A INs
FIG.21B INr
FIG.21C OUT

FIG. 23A INs
FIG. 23B INr
FIG. 23C A
FIG. 23D OUT

FIG.25A INs
FIG.25B INr
FIG.25C A
FIG.25D OUT

FIG. 40A INs
FIG. 40B INr
FIG. 40C A
FIG. 40D B
FIG. 40E OUT

FIG.42A INs 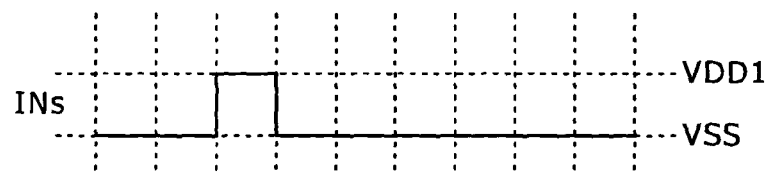
FIG.42B INr 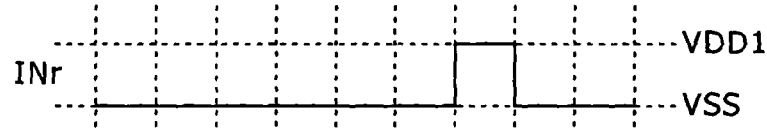
FIG.42C D 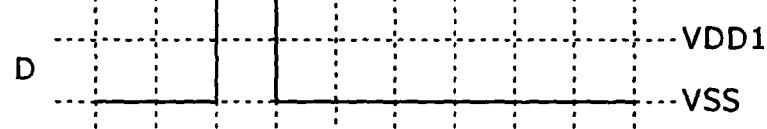
FIG.42D E 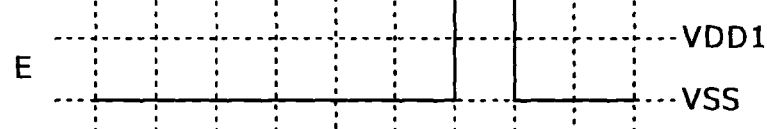
FIG.42E B 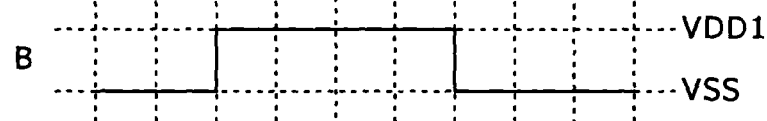
FIG.42F A 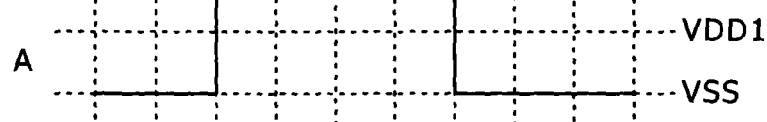
FIG.42G C 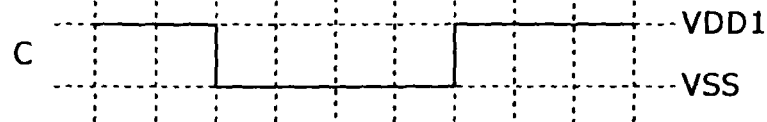
FIG.42H OUT 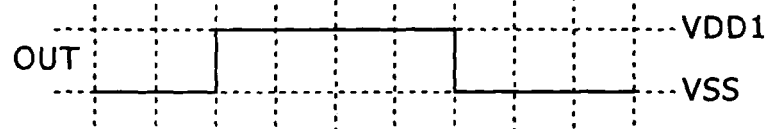

FIG.44A INs 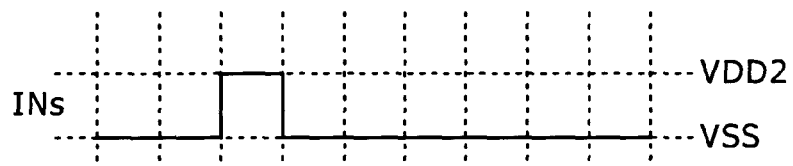
FIG.44B INr 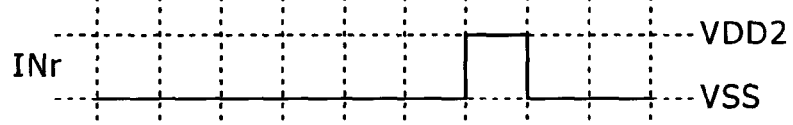
FIG.44C D 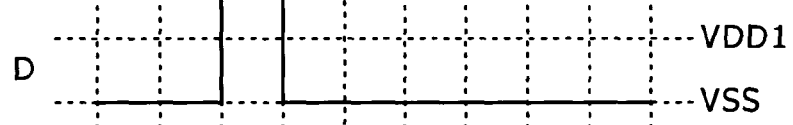
FIG.44D E 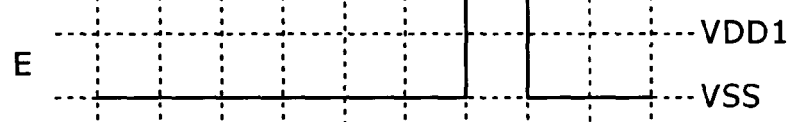
FIG.44E B 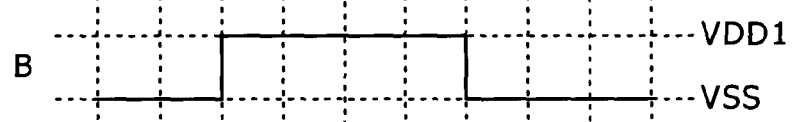
FIG.44F A 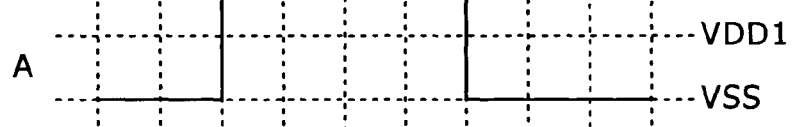
FIG.44G C 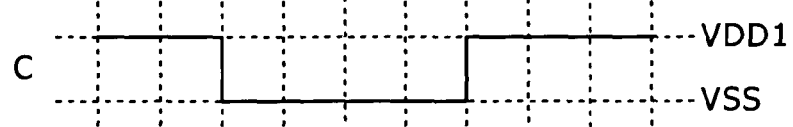
FIG.44H OUT 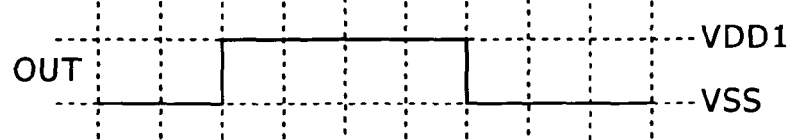

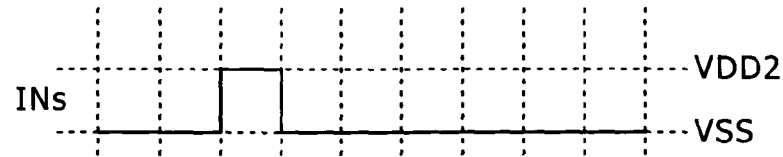
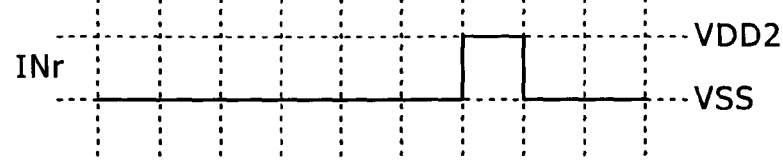
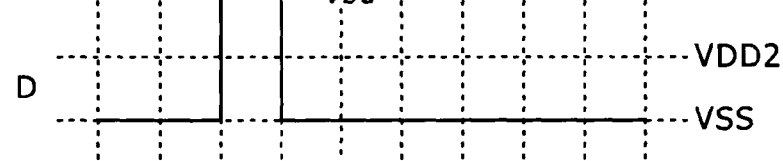
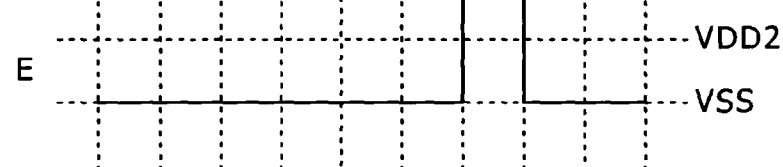
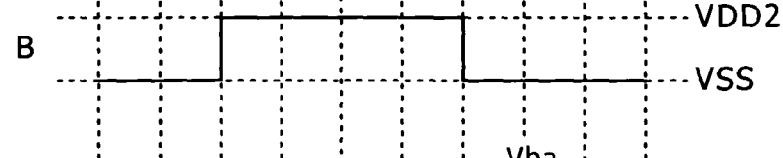
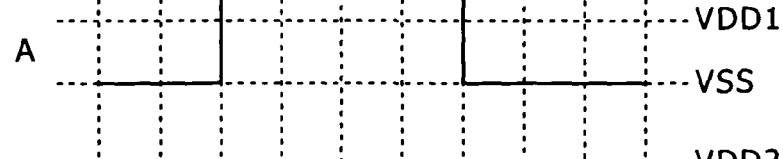
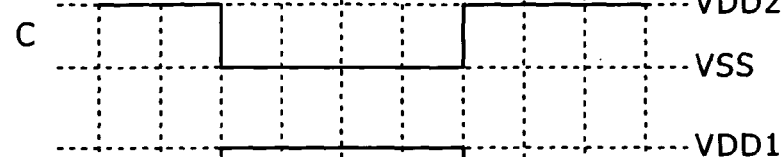

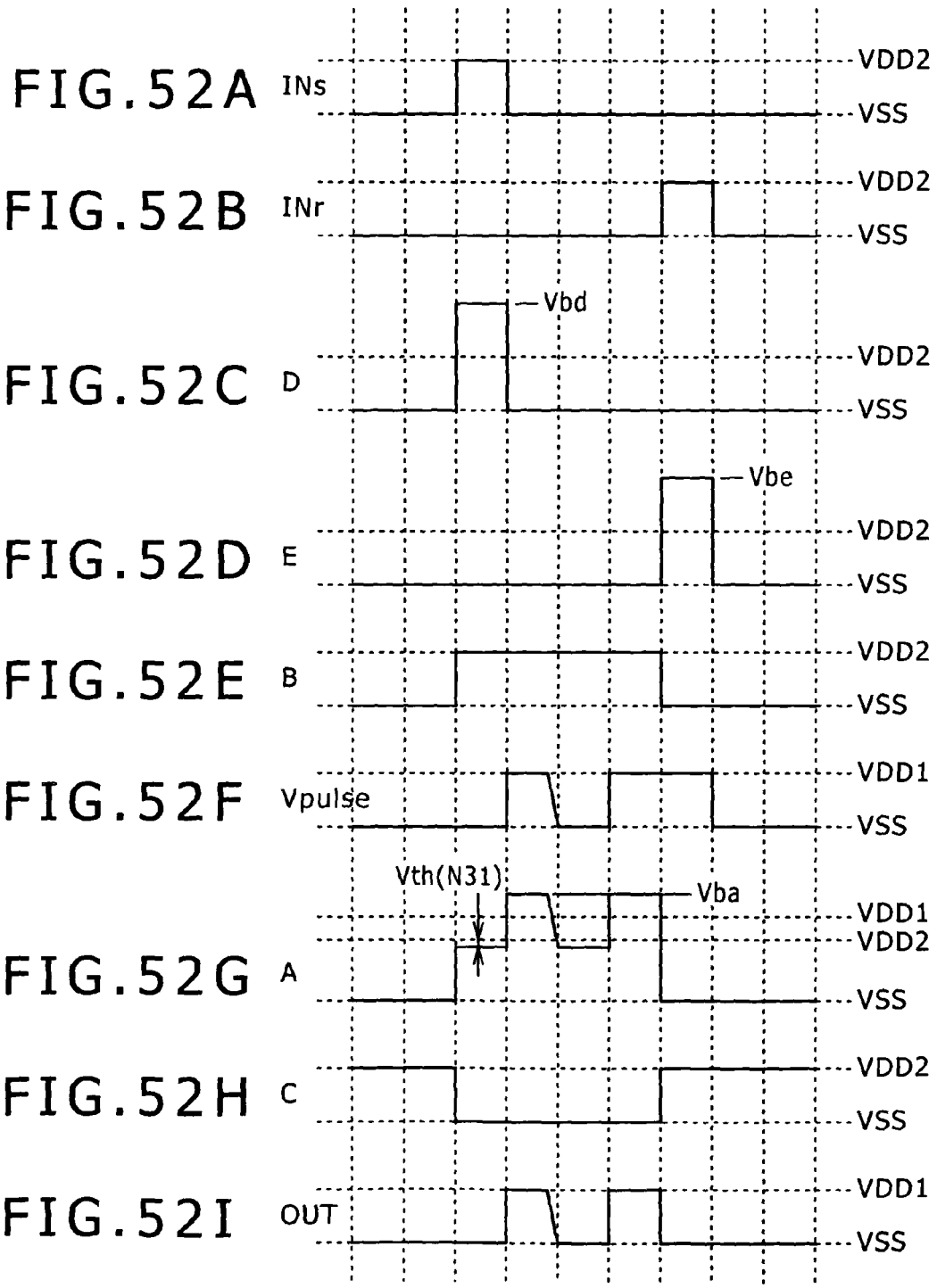

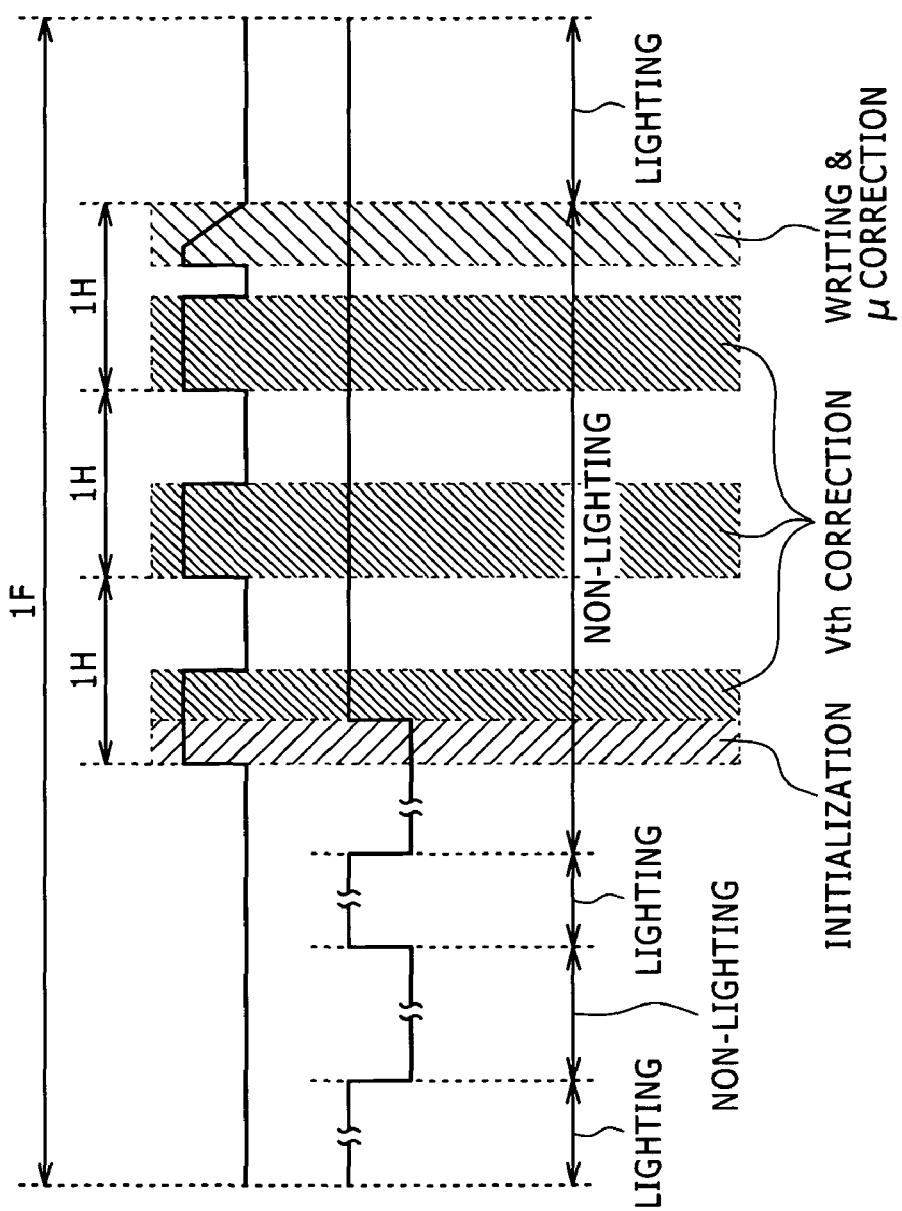

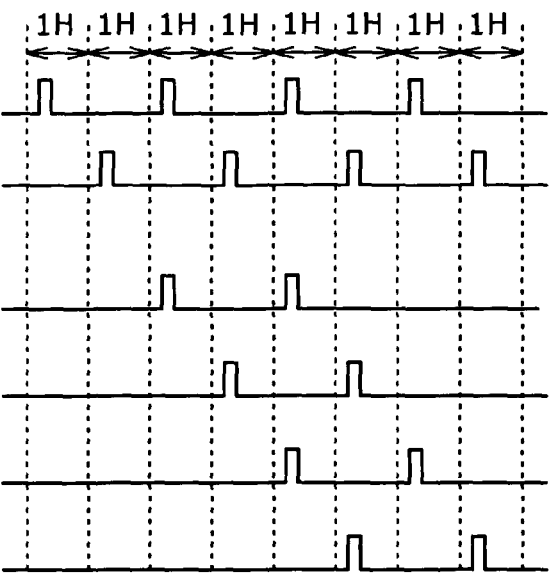
FIG.55A1 CK1a
FIG.55A2 CK2a
FIG.55A3 out(n-1)
FIG.55A4 out(n)
FIG.55A5 out(n+1)
FIG.55A6 out(n+2)
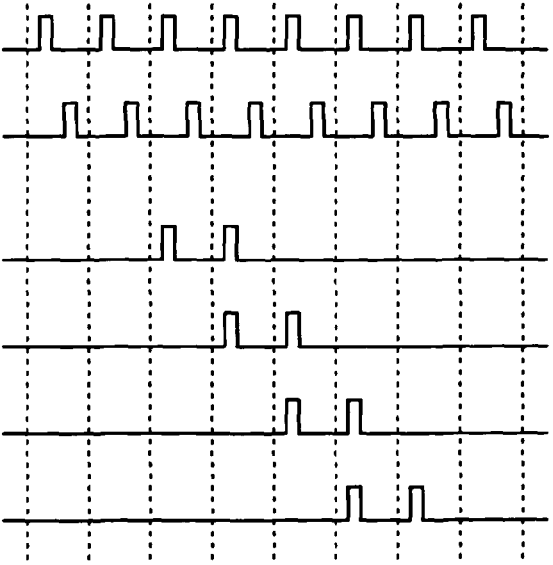
FIG.55B1 CK1b
FIG.55B2 CK2b
FIG.55B3 out(n-1)
FIG.55B4 out(n)
FIG.55B5 out(n+1)
FIG.55B6 out(n+2)

SEMICONDUCTOR DEVICE, DISPLAY PANEL AND ELECTRONIC EQUIPMENT

CROSS REFERENCES TO RELATED APPLICATIONS

The present invention contains subject matter related to Japanese Patent Application JP 2008-068900, filed in the Japan Patent Office on Mar. 18, 2008, the entire contents of which being incorporated herein by reference

BACKGROUND OF THE INVENTION

1. Field of the Invention

The invention described in the present specification relates to a general-purpose buffer circuit formed on an insulating substrate using single-channel type thin film transistors. It should be noted that the buffer circuit according to the present invention is not limited to any specific application, but is applicable to a variety of applications, devices and products. Incidentally, the invention described in the present specification has aspects of a semiconductor device, display panel and electronic equipment.

2. Description of the Related Art

The low-temperature poly-silicon (LTPS) process can form circuits using both n-channel metal oxide semiconductor (NMOS) and p-channel metal oxide semiconductor (PMOS) thin film transistors (TFTs). In the LTPS process, therefore, it is common to manufacture circuits so-called CMOS (complementary metal oxide semiconductor) circuits, using these two types of thin film transistors.

On the other hand, CMOS circuits inevitably lead to an increase in the number of process steps because of the two types of thin film transistors used. This increase in the number of process steps results in reduced production efficiency, thus contributing to increased manufacturing cost.

Therefore, even if the poly-silicon process is used, circuits identical in function to CMOS circuits should preferably be achieved using only single-channel type (NMOS or PMOS) thin film transistors.

Moreover, single channel type circuits of this sort are applicable when circuits are formed with amorphous silicon or organic semiconductors.

In the case of amorphous silicon, for example, NMOS thin film transistors are the only choice to manufacture circuits. In the case of organic TFTs, PMOS thin film transistors are the only choice to manufacture circuits.

Against this backdrop, circuits identical in function to CMOS circuits should preferably be achieved using only single-channel type (NMOS or PMOS) thin film transistors.

The present specification focuses its attention on a buffer circuit. A buffer circuit is, needless to say, a general-purpose circuit incorporated in a variety of circuits. Therefore, a buffer circuit is basically not limited to any specific application. It should be noted, however, that, in the description given below, we assume for the sake of convenience that a buffer circuit is used in a drive circuit adapted to drive a display panel.

In the following description, an existing example of a buffer circuit will be described in relation to an active-matrix-driven organic EL (electroluminescence) panel.

FIG. 1 illustrates a system configuration example of an organic EL panel. An organic EL panel 1 illustrated in FIG. 1 includes a pixel array section 3, signal line drive section 5, first control line drive section 7 and second control line drive section 9. These components are arranged on a panel substrate.

The pixel array section 3 has subpixels 11 arranged in a matrix form according to the display resolution. FIGS. 2 and 3 illustrate equivalent circuit examples of the subpixel 11. It should be noted that the subpixels 11 shown in FIGS. 2 and 3 both include only NMOS thin film transistors.

In the two figures, reference numeral N1 denotes a sampling transistor, N2 a drive transistor, N3 a lighting control transistor, and Cs a holding capacitor. Further, reference numeral WSL corresponds to a write control line, and LSL a lighting control line.

Incidentally, FIG. 2 corresponds to a circuit configuration when an organic EL element OLED is lit up or extinguished by turning the lighting control transistor T3 on or off as a driving method.

On the other hand, FIG. 3 corresponds to a circuit configuration when the organic EL element OLED is lit or extinguished by changing the potential of the lighting control line LSL as a driving method. It should be noted that, in the case of FIG. 3, the lighting control line LSL serves also as a current supply line.

FIGS. 4A to 4C illustrate a timing diagram when a signal potential Vsig (Data) is written to the subpixel 11 shown in FIGS. 2 and 3. Incidentally, FIG. 4A illustrates the driving waveform of a signal line DTL. The signal line DTL is supplied with the signal potential Vsig associated with the pixel gray level Data. The magnitude of the drive current supplied by the drive transistor N2 is determined by the magnitude of the signal potential Vsig here. The organic EL element OLED is a current-driven element. The larger the drive current here, the higher the luminance.

FIG. 4B illustrates the driving waveform of the write control line WSL. While the same line WSL is at high level, the sampling transistor N1 turns on, causing the potential of the signal line DTL to be written to the gate electrode of the drive transistor N2.

FIG. 4C illustrates the driving waveform of the lighting control line LSL. The lighting control line LSL is driven by two values or high and low levels. This switching of the potential permits the organic EL element OLED to be lit or extinguished.

It should be noted that the subpixel 11 shown in FIG. 2 and that in FIG. 3 differ from each other in control amplitude of the lighting control line LSL. In the case of FIG. 2, the lighting control line LSL need only drive the drive transistor N2. In contrast, in the case of FIG. 3, the lighting control line LSL must supply an operating voltage to the drive transistor N2 and organic EL element OLED.

As illustrated in FIGS. 4A to 4C, after the writing of the signal potential Vsig, the organic EL element OLED is lit when the lighting control line LSL is at high level, and unlit when the same line LSL is at low level.

It should be noted that the peak luminance level can be controlled by variably controlling the ratio of the lighting period length (Duty) to one field period.

In addition to the above, the lighting control line LSL shown in FIG. 4C is also used to adjust the motion image characteristics. To adjust the motion image characteristics, the number of times of lighting and lighting period timings per field period must be adjusted.

Therefore, a plurality of different types of pulses must be output to the second control line drive section 9.

Moreover, in the case of the line sequential writing scheme common to active matrix driving, it must be possible to shift these pulse waveforms sequentially on a line-by-line basis.

That is, this type of control line drive section must be able to serve two purposes, i.e., setting the lengths of the control pulses as desired and sequentially shifting the pulses to the next stage on a line-by-line basis.

In the case of the subpixel 11 shown in FIGS. 2 and 3, the threshold and mobility corrections of the drive transistor N2 may be necessary during the writing of the signal potential Vsig. FIGS. 5A to 5F illustrate a timing diagram of the subpixel 11 associated with FIG. 2. Incidentally, if the subpixel 11 shown in FIG. 2 has the correction capabilities, a current supply line PSL is driven as illustrated in FIG. 5C. Further, FIGS. 6A to 6E illustrate a timing diagram of the subpixel 11 associated with FIG. 3. It should be noted that the subpixels 11 shown in FIGS. 2 and 3 differ from each other in that the initialization and lighting period control are performed separately in one of the subpixels 11 and not in another.

The lighting period control must vary the ratio between lighting and non-lighting periods (Duty) to adjust the peak luminance. Further, the lighting period control must change the number of times lighting and non-lighting periods are switched per field period to adjust the motion image characteristics. It is for these purposes that the circuit configuration of the second control line drive section 9 is generally complicated.

Therefore, the circuit configuration shown in FIG. 2 is advantageous in providing a simple control interface because separate supply lines are provided for the initialization pulse adapted to control the timings at which to shift the output pulses and the lighting period control pulse. It should be noted, however, that this circuit configuration requires three control lines, i.e., the write control line WSL, lighting control line LSL and current supply line PSL, as illustrated in FIG. 2.

A description will be given below of not only the threshold and mobility correction operations but also the control operations of the subpixel 11 including the lighting period control for the pixel circuit shown in FIG. 3. Therefore, FIGS. 6A to 6E will be referred to for the description.

It should be noted that the control operations of the pixel circuit shown in FIG. 2 are the same as those of the pixel circuit shown in FIG. 3 except that the initialization and lighting period control are performed separately. Therefore, the description thereof will be omitted.

FIG. 6A illustrates the driving waveform of the write control line WSL. For example, while the same line WSL is at high level, the sampling transistor N1 turns on, causing the potential of the signal line DTL to be written to the gate electrode of the drive transistor N2.

It should be noted that the first high level period in the FIG. 6A is used to correct the variation of a threshold potential Vth of the drive transistor N2.

On the other hand, the second high level period in FIG. 6A is used not only to write the signal potential Vsig commensurate with the pixel gray level but also to correct the variation of a mobility u of the drive transistor N2. Incidentally, the trailing edge of the second high level period falls diagonally so as to set the optimal mobility correction period for all gray levels from high luminance level (high signal potential) to low luminance level (low signal potential).

The term "mobility correction" refers to the operation adapted to correct the difference in mobility between the different drive transistors N2, some with the high mobility u and others with the low mobility μ. In principle, the lower the luminance (the signal potential), the longer the correction period.

FIG. 6B illustrates the driving waveform of the signal line DTL. Two different potentials are applied to the same line DTL. An offset voltage Vofs is adapted to correct the threshold of the drive transistor N2. The signal potential Vsig supplies a pixel gray level. The magnitude of the drive current supplied by the drive transistor N2 is determined by the magnitude of the signal potential Vsig here. The organic EL element OLED is a current-driven element. The larger the drive current here, the higher the luminance.

FIG. 6C is the driving waveform of the lighting control line LSL. The lighting control line LSL is driven by two values or high and low levels. The first low level period shown in FIG. 6C is used to provide an initialization period. The second low level period shown in FIG. 6C is used to provide a non-lighting period after the start of light emission.

The initialization here is adapted to spread a gate-to-source voltage Vgs of the drive transistor N2 wider than the threshold voltage Vth. This operation is absolutely essential before the threshold correction and will be hereinafter referred to as the correction preparation operation.

After this correction preparation operation, the offset voltage Vofs is applied to the gate electrode of the drive transistor N2. At the same time, the lighting control line LSL changes to high level. This potential-related operation is the threshold correction operation. After the start of the threshold correction operation, a source potential Vs of the drive transistor N2 increases gradually. The same potential Vs stops increasing when the gate-to-source voltage Vgs of the drive transistor N2 reaches the threshold voltage Vth.

It should be noted that the end of the writing of the signal potential Vsig is followed by the start of a lighting period which lasts until the next writing period. During the lighting period, the organic EL element OLED is lit when the lighting control line LSL is at high level. The same element OLED is unlit when the lighting control line LSL is at low level. The peak luminance level can be controlled by variably controlling the ratio of the lighting period length to one field period.

FIG. 6D illustrates a potential Vg appearing at the gate electrode of the drive transistor N2. FIG. 6E illustrates the potential Vs appearing at the source electrode of the drive transistor N2 (anode of the organic EL element OLED).

As described earlier, the pulses of the write control signal (FIG. 6A) and lighting control signal (FIG. 6C) must vary in length depending on the purpose of driving operation.

In the case of the former, for example, the pulse must vary in length between the threshold correction operation and the signal writing and mobility correction operation. On the other hand, in the case of the latter, the pulse must vary in length between the correction preparation operation and the lighting/extinguishing control of the organic EL element OLED during a lighting period.

Therefore, the first and second control line drive sections 7 and 9 must be able to each produce pulse outputs in a plurality of different lengths. Moreover, in the case of the line sequential writing scheme common to active matrix driving, it must be possible to shift these pulse waveforms sequentially on a line-by-line basis. That is, this type of control line drive section must be able to serve two purposes, i.e., setting the lengths of the control pulses as desired and sequentially shifting the pulses to the next stage on a line-by-line basis.

FIGS. 7 to 14F illustrate examples of a control line drive circuit satisfying the above-described driving conditions together with driving examples. It should be noted that the control line drive circuit includes a shift register.

The shift register shown in FIG. 7 includes 2N register stages SR(1) to SR(2N) which are cascaded. The shift register operates in such a manner that each of the stages uses the output pulses of the previous and subsequent stages as drive pulses so as to output, as an output pulse, the clock signal which is fed to the stage.

FIGS. 8A to 8I illustrate drive pulse waveforms of the shift register. It should be noted that FIGS. 8A to 8I illustrate the pulse waveforms when the shift register includes only NMOS thin film transistors.

FIG. 8A illustrates a start pulse 'st' adapted to drive the first register stage. FIG. 8B illustrates an end pulse 'end' adapted to drive the 2N register stage. FIG. 8C illustrates a clock signal 'ck1' for the even-numbered register stages.

FIG. 8D illustrates a clock signal 'ck2' for the odd-numbered register stages. FIG. 8E illustrates an output pulse 'o1' of the first register stage SR(1). FIG. 8F illustrates an output pulse 'o(k−1)' of the k−1th register stage SR(k−1). FIGS. 8G to 8I illustrate output pulses 'o' of the respective register stages shown in the figures.

FIG. 9 illustrates an example of the internal circuit of the kth register stage SR. As illustrated in FIG. 9, the thin film transistors making up the register SR are all NMOS transistors. The output stage of this register stage SR includes NMOS thin film transistors N11 and N12 connected in series between a source potential VSS and clock input terminal. It should be noted that the connection midpoint of the thin film transistors N11 and N12 is connected to the output node. Further, a supplementary capacitor Cb1 is connected between the gate electrode of the thin film transistor N11 and the source potential VSS. On the other hand, a supplementary capacitor Cb2 is connected between the gate electrode of the thin film transistor N12 and the clock input terminal. This supplementary capacitor Cb2 supplements the bootstrapping action.

FIGS. 10A to 10F illustrate the relationship in potential between the input and output pulses and nodes A and B which are related to the register stage SR. FIG. 10A illustrates the waveform of a clock signal 'ck.' FIG. 10B illustrates the waveform of a first drive pulse 'in1(k)' (output pulse 'out(k−1)' of the previous register stage). FIG. 10C illustrates the waveform of a second drive pulse 'in2(k)' (output pulse 'out(k+1)' of the subsequent register stage). FIG. 10D illustrates the waveform of the node B potential (gate potential of the thin film transistor N11). FIG. 10E illustrates the waveform of the node A potential (gate potential of the thin film transistor N12). FIG. 10F illustrates the waveform of an output pulse 'out' appearing at the output node.

As illustrated in FIGS. 10A to 10F, the potentials of the nodes A and B change in a complementary manner at the leading edges of the first and second drive pulses 'in1(k)' and 'in2(k).'

This complementary operation is made possible by thin film transistors N13 to N16.

For example, when the first drive pulse 'in1(k)' is at high level and the second drive pulse 'in2(k)' at low level, the thin film transistors N13 and N14 turn on, and the thin film transistors N15 and N16 turn off. On the other hand, for example, when the first drive pulse 'in1(k)' is at low level and the second drive pulse 'in2(k)' at high level, the thin film transistors N15 and N16 turn on, and the thin film transistors N13 and N14 turn off.

By the way, while the node A is at high level, the supplementary capacitor Cb2 is charged. Therefore, if the clock signal 'ck' changes to high level while the node A is at high level, high level appears in the output pulse 'out(k).' As a result, the node A potential increases by the voltage charged in the supplementary capacitor Cb2. At this time, the gate-to-source voltage Vgs of the thin film transistor N12 is equal to the threshold voltage Vth or greater thanks to the bootstrapping action. As a result, the potential of the output pulse 'out(k)' presents exactly the same waveform as that of the clock signal 'ck.'

That is, the shift register shown in FIG. 7 operates in such a manner that the clock signal 'ck', extracted in sequential order starting with the first register stage, is output to the output node. In the case of this shift register, therefore, the variable range of the width of the output pulse 'out' is limited to one H period (horizontal scan period) during which the clock signal 'ck' can vary in width.

It should be noted that this shift register is capable of shifting a plurality of pulse signals within one horizontal period.

FIGS. 11A to 11I illustrate an example of pulse shifting when the clock signal 'ck' includes two pulse signals. It should be noted that the waveforms shown in FIGS. 11A to 11I are all associated with those shown in FIGS. 8A to 8I.

Further, FIGS. 12A to 12F illustrate the operation waveforms of the register stage SR associated with the above case. The waveforms shown in FIGS. 12A to 12F are all associated with those shown in FIGS. 10A to 10F. As illustrated in FIG. 12E, both of the two pulse signals are bootstrapped.

Still further, the shift register shown in FIG. 7 can reproduce the same changes in the waveform of the output pulse 'out' by adjusting the rise and fall rates of the leading and trailing edges of the clock signal 'ck.'

FIGS. 13A to 13I illustrate an example of pulse shifting when the trapezoidal clock signal 'ck' is fed as the clock signal 'ck.' It should be noted that the waveforms shown in FIGS. 13A to 13I are all associated with those shown in FIGS. 8A to 8I.

Still further, FIGS. 14A to 14F illustrate the operation waveforms of the register stage SR associated with the above case. The waveforms shown in FIGS. 14A to 14F are all associated with those shown in FIGS. 10A to 10F. As illustrated in FIG. 14E, the bootstrapping action provides exactly the same trapezoidal waveform as the pulse signal 'ck.' This trapezoidal waveform is extracted as the output pulse 'out.'

The above case is disclosed in Japanese Patent Laid-Open No. 2005-149624

SUMMARY OF THE INVENTION

By the way, the thin film transistors N11 and N12 making up the output stage of the shift register described with reference to FIG. 7 (FIG. 9) operate in a complementary manner. This prevents any through current from flowing into the output stage, thus contributing to reduced power consumption.

However, the shift register described with reference to FIG. 7 (FIG. 9) outputs the externally fed clock signal 'ck' in an 'as-is' form as the output clock (shift clock). As illustrated in FIG. 15, therefore, a buffer circuit 21 adapted to supply the clock signal to the shift register 7 must be able to drive all the pixels to which the output pulse is supplied.

A buffer circuit 23 adapted to supply the start and end pulses 'st' and 'end' to the shift register 7, on the other hand, need only drive the register stage SR of the shift register 7.

Therefore, the buffer circuit 21 is inevitably sized larger than the buffer circuit 23.

This contributes to reduced power consumption of the shift register 7 shown in FIG. 7 (FIG. 9). However, the buffer circuit 21 provided at the previous stage consumes large power.

Further, the clock signal 'ck' must drive all the pixels arranged along the horizontal line as described earlier. Therefore, the more there are pixels arranged along the horizontal line or the larger the load of each pixel, the larger the buffer circuit 21 and the larger the power consumption.

For this reason, the inventor proposes a buffer circuit (semiconductor device) formed on an insulating substrate using single-channel type thin film transistors. The buffer circuit has an output stage which includes first and second thin film transistors connected in series between first and second power sources. The output terminal potential of the output stage is switched to the potential of the first or second power source in a complementary manner by the input timings of two signals, i.e., a set signal adapted to control the first thin film transistor and a reset signal adapted to control the second thin film transistor.

In the case of this circuit configuration, the first and second thin film transistors operate in a complementary manner. This prevents any through current from flowing into the output stage, thus contributing to reduced power consumption.

Further, the set and reset signals control the first and second thin film transistors, respectively. That is, these signals are fed to the control terminals of the respective transistors. This ensures separation between the circuit control and output.

Therefore, even if a large load is connected to the buffer circuit, this load can be driven simply by increasing the driving capabilities of the first and second thin film transistors. As a result, the output source of the control signals (set and reset signals) will not be adversely affected. Naturally, the first and second thin film transistors operate in a complementary manner. This prevents increased power consumption even if the thin film transistors used each have a high driving capability.

It should be noted that the ON potential of the first or second thin film transistor should preferably be supplied by the bootstrapping of the gate potential as a result of the change of the output terminal potential. Reduced voltage of the set and reset signals can be achieved by taking advantage of the bootstrapping action.

For example, the significant reduction in amplitude of the set and reset signals provides further reduced power consumption of the output source of these signals. Further, for example, the number of power sources required for the system as a whole can be reduced by using the potential of the first or second power source as a drive potential of the set and reset signals.

On the other hand, the buffer circuit should preferably include first and second input stages described below and use the potentials at the respective output terminals as the set and reset signals of the output stage.

(a) First input stage whose output terminal potential is switched in a complementary manner by the input timings of the set and reset signals (b) Second input stage whose output terminal potential is switched in a complementary manner by the input timings of the set and reset signals and whose output terminal potential changes in opposite phase with the output terminal potential of the first input stage.

This circuit configuration allows for the control terminals of the first and second transistors to remain powered even during a period of time in which no set or reset signal of significant level is supplied to the first or second input stage. The first and second transistors make up the output stage.

This permits connection of the buffer circuit to a current consuming load. The reason for this is that the potential of the control terminal can be continuously retained even if a leak current develops in the first or second thin film transistor as a result of a current output.

It should be noted that each of the first and second input stages here should preferably include third and fourth thin film transistors. The third thin film transistor is connected to the first or second power source. The fourth thin film transistor is connected in series to the third thin film transistor. The other end of the fourth thin film transistor is connected to a third power source. This configuration provides reduced power consumption of the input stages depending on the setting of the third power source.

Further, each of the first and second input stages here should preferably include third and fourth thin film transistors. The third thin film transistor is a diode-connected transistor. The fourth thin film transistor is connected in series to the third thin film transistor. The other end of the fourth thin film transistor is connected to the first or second power source. This configuration provides reduced layout area of the buffer circuit thanks to a small number of power wirings.

It should be noted that the set and reset signals should preferably be supplied from their associated shift registers. That is, reduced power consumption of the clock supply source to the shift registers can be achieved by providing the buffer circuit on the output stage side of the shift registers.

However, one of the set and reset signals may be supplied from a shift register, and the other from a pulse source.

It should be noted that the output terminal potential of the buffer circuit should preferably be used to control the lighting of a self-luminous display panel so that the input time difference between the set and reset signals matches the lighting time length of the display panel.

In this case, the output terminal potential of the buffer circuit should preferably be used to control the sampling timing of the display panel.

Further, the output terminal potential of the buffer circuit should preferably be used to control the current supply line of the display panel.

Still further, the buffer circuit (semiconductor device) should preferably be incorporated in at least some of the drive circuits making up the display panel.

Still further, the display panel should preferably be incorporated in electronic equipment. The electronic equipment includes a display panel module, system control section adapted to control the operation of the system as a whole, and operation input section adapted to accept operation inputs to the system control section.

Using the above-described buffer circuit (semiconductor device) provides a single-channel type semiconductor device which can be used in applications involving a large output or current load.

BRIEF DESCRIPTION OF THE DRAWINGS

FIGS. 6A to 6E are a diagram illustrating the driving waveforms associated with FIG. 3;

FIGS. 42A to 42H are a diagram illustrating the driving waveforms of the buffer circuit shown in FIG. 41;

FIGS. 44A to 44H are a diagram illustrating the driving waveforms of the buffer circuit shown in FIG. 43;

FIGS. 46A to 46H are a diagram illustrating the driving waveforms of the buffer circuit shown in FIG. 45;

FIGS. 52A to 52I are a diagram illustrating the driving waveforms of the buffer circuit shown in FIG. 51;

FIGS. 53A and 53B are a diagram illustrating examples of driving the organic EL panel;

FIGS. 55A1 to 55B6 are diagrams illustrating the driving waveforms for each of the scanners shown in FIGS. 54A and 54B;

DETAILED DESCRIPTION OF THE PREFERRED EMBODIMENTS

Figure 1:
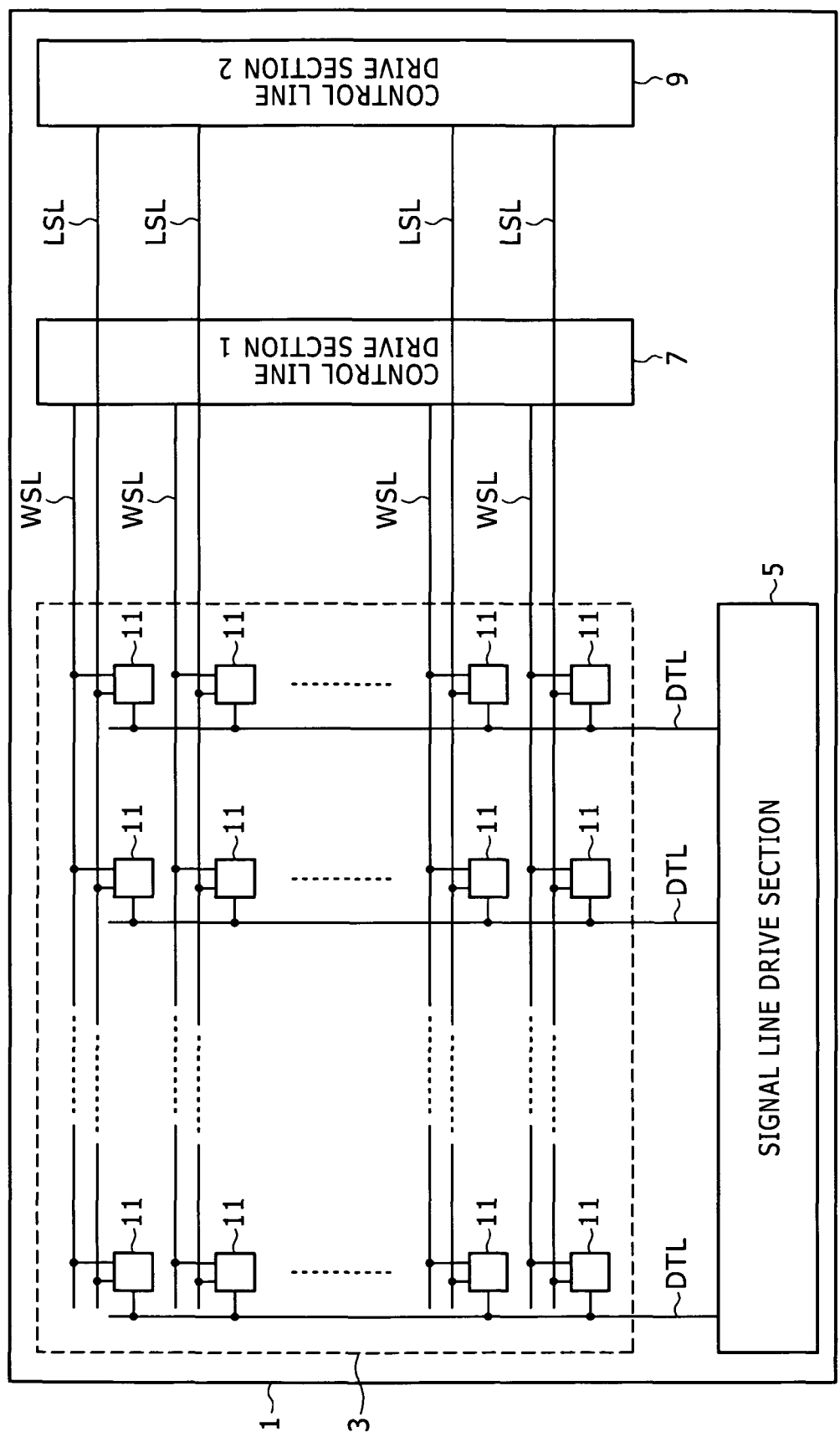
FIG. 1 is a diagram illustrating an example of system configuration of an organic EL panel.

A description will be given below of a case in which the invention proposed by the specification is applied to the drive circuits of an active-matrix-driven display panel.

It should be noted that well-known or publicly known techniques of the pertaining technical field are used for the details not illustrated in the drawings or described in the present specification.

It should also be noted that the embodiments described below are merely preferred embodiments of the present invention and that the invention is not limited thereto.

(A) System Configuration of the Display Panel

Figure 16:
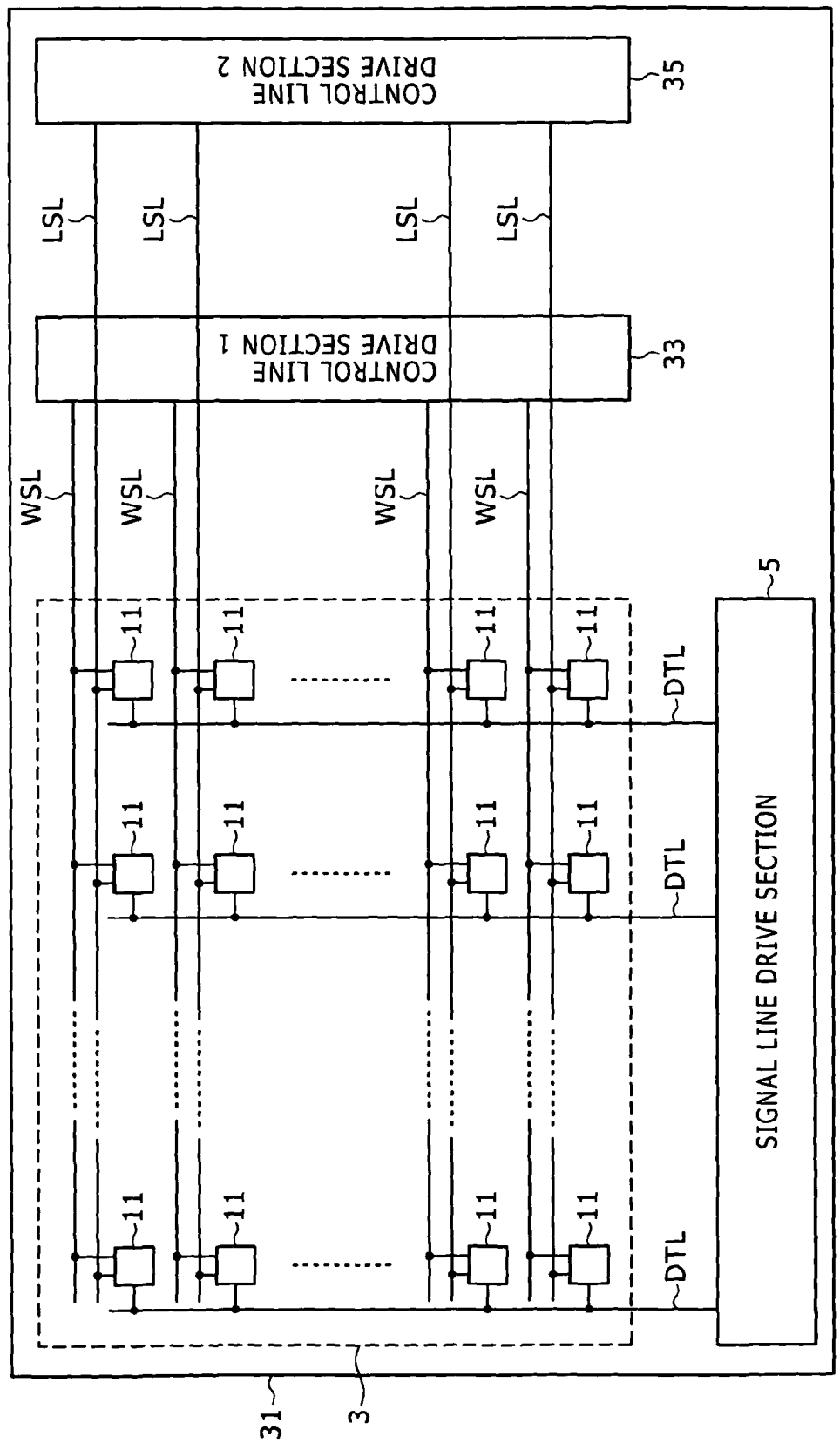
FIG. 16 is a diagram illustrating a system configuration example of an organic EL panel according to an embodiment.

An organic EL panel will be described with reference to the embodiments given below. FIG. 16 illustrates a system configuration example of an organic EL panel according to an embodiment. It should be noted that, in FIG. 16, like components as those in FIG. 1 are designated by the same reference numerals.

An organic EL panel 31 according to the embodiment includes, on a panel substrate, the pixel array section 3 and signal line drive section 5 and a first control line drive section 33 and second control line drive section 35.

That is, the buffer circuit according to the embodiment is incorporated in the first and second control line drive sections 33 and 35. The same sections 33 and 35 vertically shift drive pulses.

Figure 17:
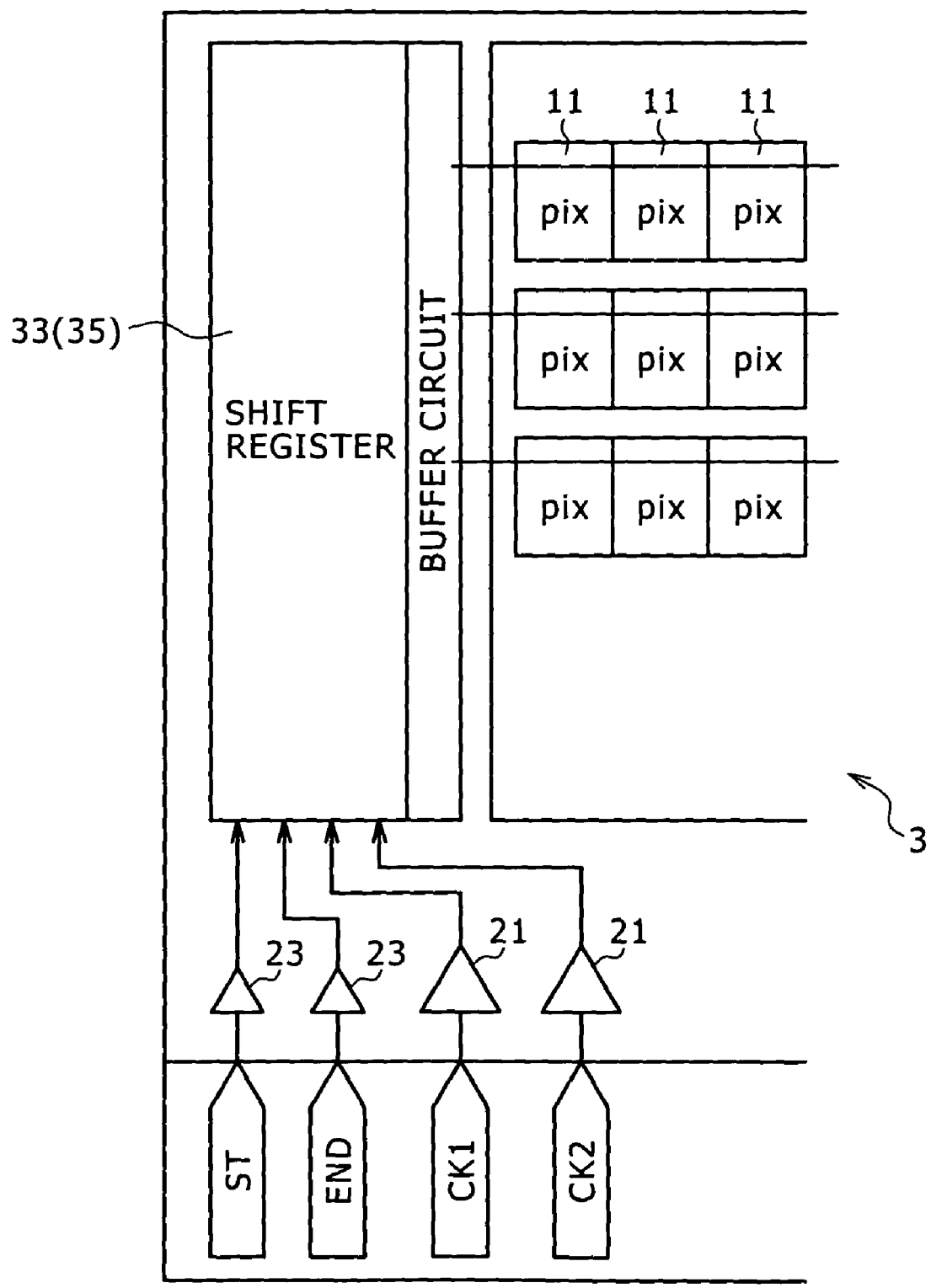
FIG. 17 is a diagram for describing the structure of a panel when a buffer circuit proposed in the specification is used as a drive circuit.

Here, each of the control line drive sections includes a shift register and buffer circuits, as illustrated in FIG. 17. The shift register shifts the pulse signals based on a clock signal. The buffer circuits drive the control lines based on the clock signal.

As described later, the buffer circuits according to the embodiment use the shift register outputs as their set and reset signals. That is, the output pulses of the shift register need only be capable of driving the buffer circuits.

Therefore, the buffer circuits 21 adapted to supply the clock signal provided at the previous stage of the shift register need only have a driving capability similar to that of the buffer circuits 23 adapted to supply the start pulse 'st' and end pulse 'end.'

It should be noted that, in the present embodiment, the term "set signal" refers to a signal adapted to supply the timing for the output pulse of the buffer circuit to change to the set potential.

On the other hand, the term "reset signal" refers to a signal adapted to supply the timing for the output pulse of the buffer circuit to change to the reset potential.

(B) Configuration of the Control Line Drive Section (NMOS)

Figure 18:
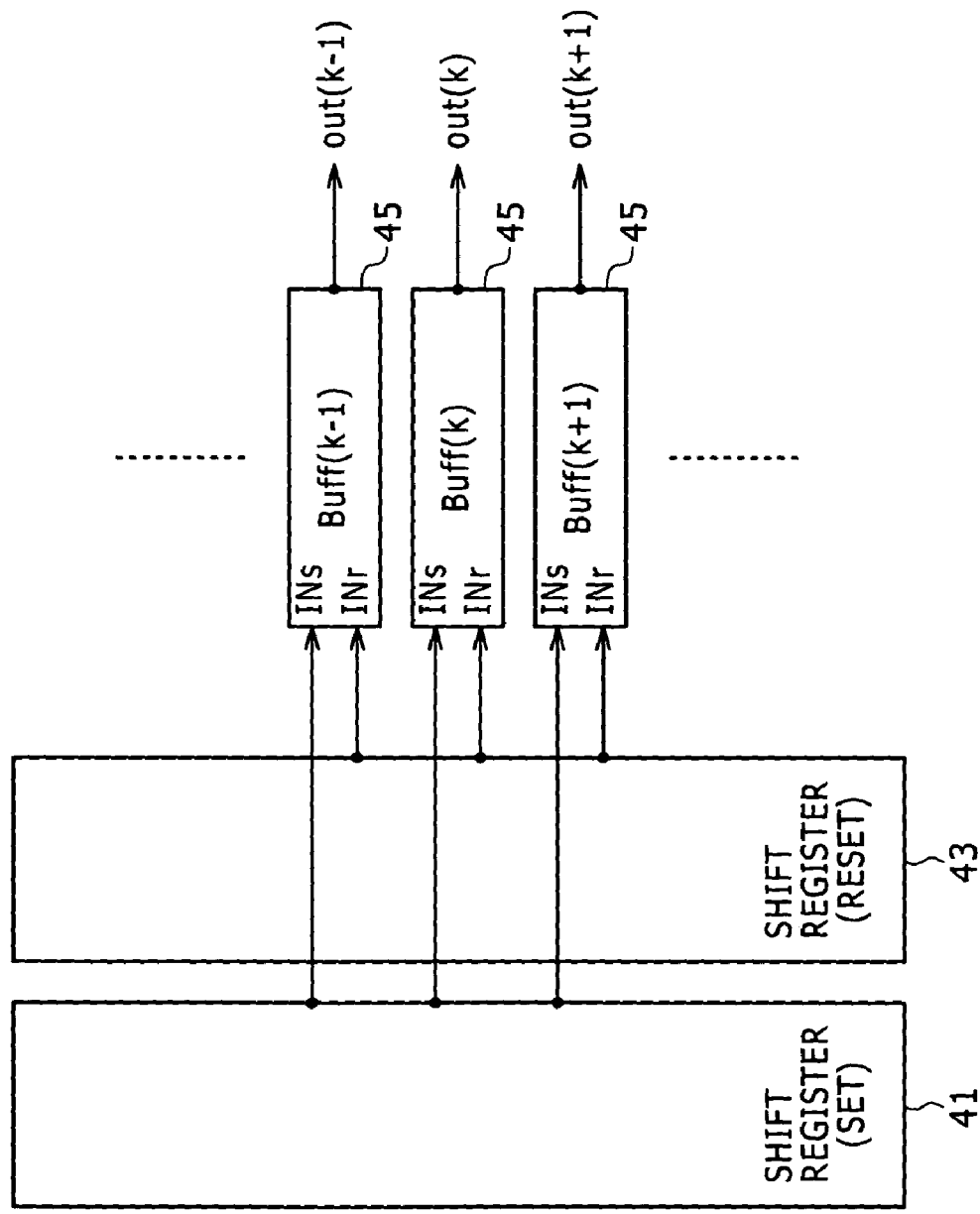
FIG. 18 is a diagram illustrating the circuit configuration of a control line drive section.

FIG. 18 illustrates a configuration example of the control line drive section which includes only NMOS thin film transistors.

The control line drive section illustrated in FIG. 18 includes a shift register 41, shift register 43 and buffer circuits 45. The shift register 41 shifts the set signal. The shift register 43 shifts the reset signal. The buffer circuits 45 each operate in a complementary manner based on the set and reset signals from the register stages.

It should be noted that each of the buffer circuits 45 outputs high level (set potential) when the set signal is fed, and low level (reset potential) when the reset signal is fed.

Figure 19:
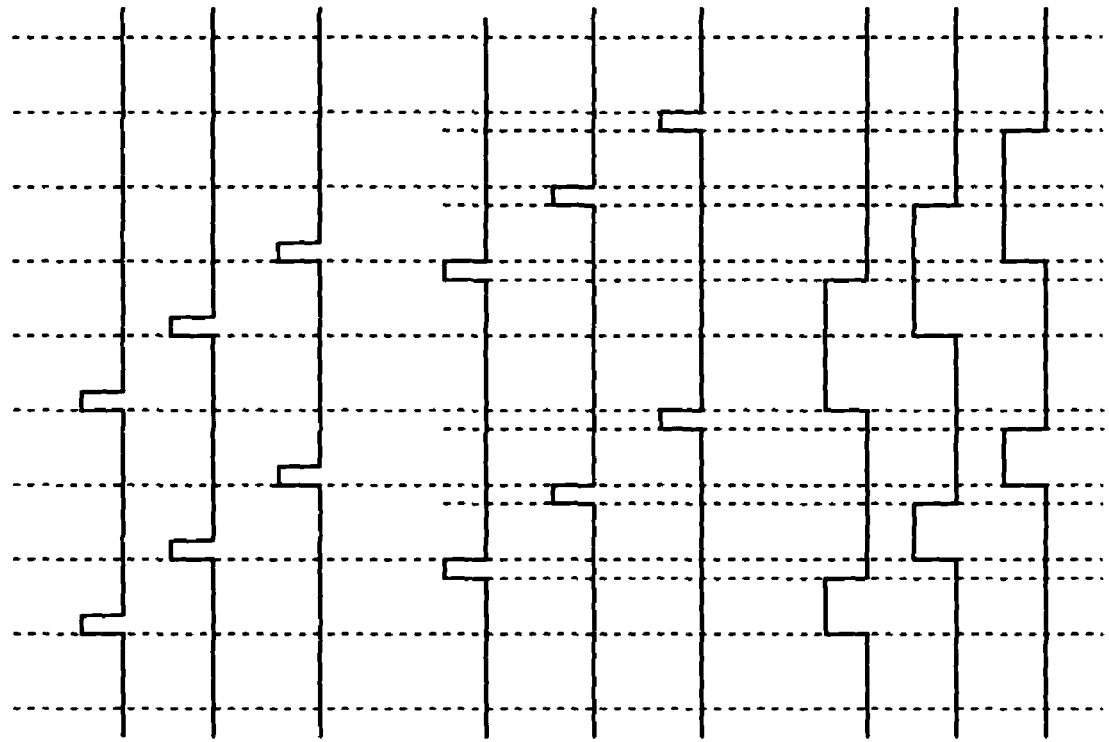
FIGS. 19A to 19I are a diagram illustrating the driving waveforms of the control line drive section according to the embodiment (NMOS)

FIGS. 19A to 19I illustrate the driving waveforms of the control line drive section. It should be noted that FIGS. 19A to 19C illustrate output pulses 'scan1' of the shift register 41 adapted to shift the set signal. FIGS. 19D to 19F illustrate output pulses 'scan2' of the shift register 43 adapted to shift the reset signal. FIGS. 19G to 19I illustrate output pulses 'out' of the buffer circuits 45.

As illustrated in FIGS. 19G to 19I, the widths of the output pulses 'out' of the buffer circuits 45 match the input time difference between the set and reset signals fed to the buffer circuit 45. Therefore, the widths of the output pulses 'out' of the buffer circuits 45 can be set as desired by controlling the intervals at which the set and reset signals are shifted. Preferred embodiments of the buffer circuit 45 will be described below.

(B-1) Embodiment 1

Figure 20:
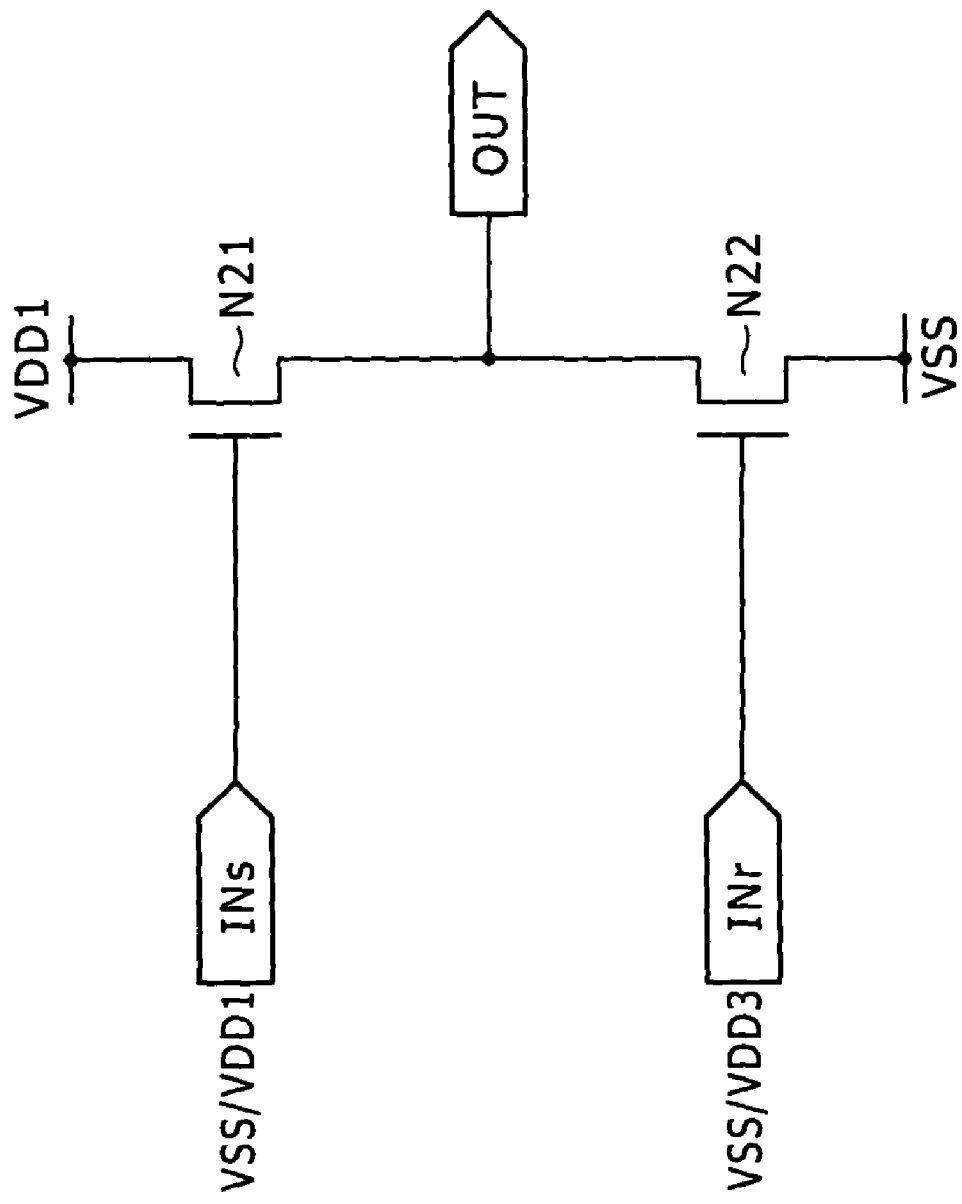
FIG. 20 is a diagram illustrating an embodiment of the buffer circuit.
Figure 21:
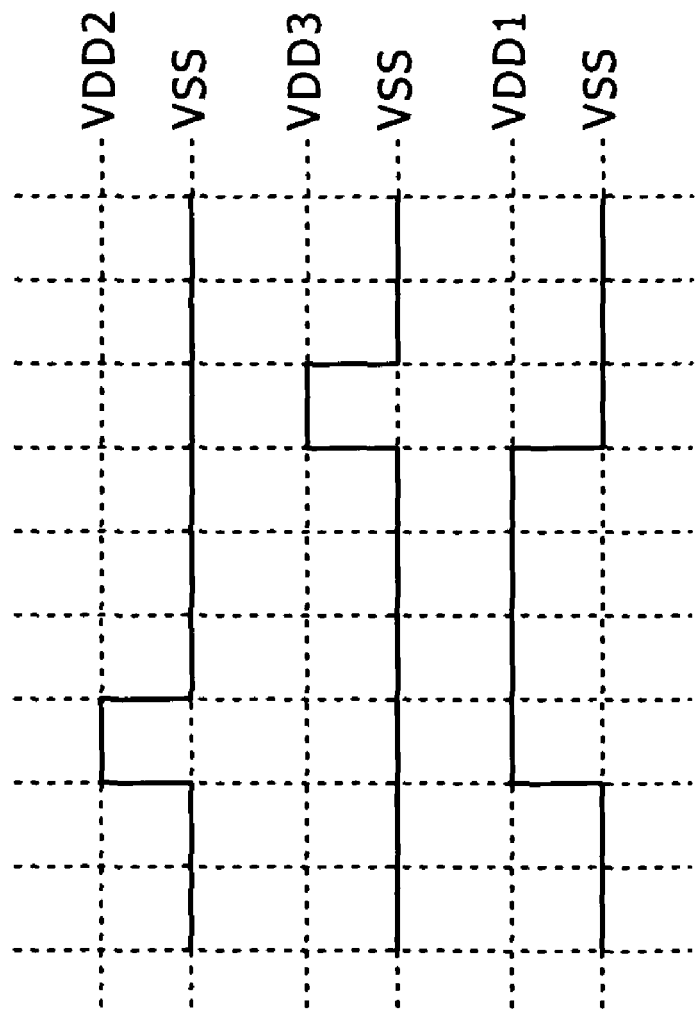
FIGS. 21A to 21C are a diagram illustrating the driving waveforms of the buffer circuit shown in FIG. 20.

FIG. 20 illustrates a first embodiment of the buffer circuit 45. FIGS. 21A to 21C illustrate the associated driving waveforms.

The buffer circuit 45 shown in FIG. 20 includes NMOS thin film transistors N21 and N22 connected in series between a first power source VDD1 and the second power source VSS. It should be noted that the connection midpoint of the thin film transistors N21 and N22 serve as an output node OUT.

Incidentally, the amplitude of the set signal (INs) is given by two values, i.e., VSS and VDD2. On the other hand, the amplitude of the reset signal (INr) is given by two values, i.e., VSS and VDD3.

Here, if two conditions VDD2−VDD1>Vth(N21) and VDD3−VSS>Vth(N22) are satisfied, the buffer circuit 45 functions as a complementary output buffer. That is, as illustrated in FIG. 21C, the first power source VDD1 or second power source VSS appears at the output node OUT of the buffer circuit 45.

It should be noted that, as illustrated in FIGS. 21A and 21B, the two thin film transistors N21 and N22 are never on at the same time. Therefore, no through current will flow. That is, this configuration provides a low-power single-channel type buffer circuit capable of operating in the same manner as a CMOS buffer circuit.

Incidentally, at least four power sources, i.e., VDD1, VDD2, VDD3 and VSS, are required to operate the buffer circuit 45 shown in FIG. 20.

It should be noted, however, that the number of power sources required to operate the buffer circuit 45 can be reduced to three by setting the high potential VDD3 of the reset signal to the high potential VDD2 of the set signal or to the first potential VDD1. This brings down the number of power sources incorporated in the organic EL panel from four to three, thus providing reduced layout area.

(B-2) Embodiment 2

Figure 22:
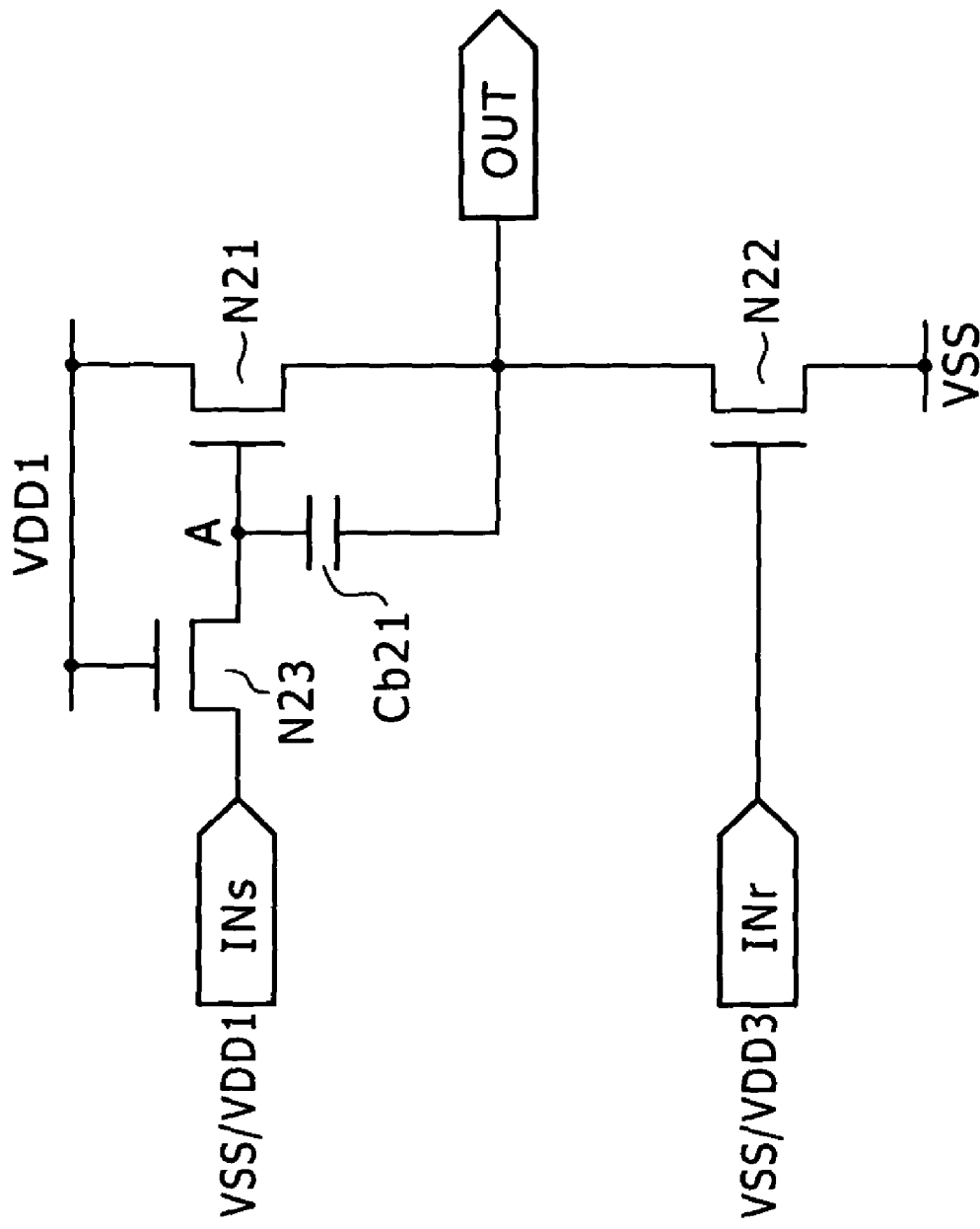
FIG. 22 is a diagram illustrating another embodiment of the buffer circuit.

FIG. 22 illustrates a second embodiment of the buffer circuit 45. FIGS. 23A to 23D illustrate the associated driving waveforms.

The buffer circuit 45 shown in FIG. 22 has an output stage which is configured identically to that of the buffer circuit according to the first embodiment (FIG. 20), except that the circuit 45 shown in FIG. 22 provides a reduced number of power sources thanks to the bootstrapping action.

It should be noted that the gate capacitor of the thin film transistor N21 is used as a bootstrapping capacitor. A capacitor Cb21 shown in FIG. 22 is a supplementary capacitor for the bootstrapping action. That is, the capacitor Cb21 need only be provided as necessary and is not absolutely essential.

Further, in the case of FIG. 22, a thin film transistor N23 is provided between the input terminal of the set signal INs and thin film transistor N21. The thin film transistor N23 has its gate electrode connected to the first power source VDD1. The same transistor N23 has one of the main electrodes connected to the input terminal of the set signal INs and the other main electrode connected to the gate electrode of the thin film transistor N21.

Here, the thin film transistor N23 is provided to disconnect the node A from the set signal INs through its cut-off action. The same transistor N23 is used to absorb the potential difference between the node A and set signal INs during the bootstrapping action which shown in FIG. 23C.

When the set signal INs rises to high level, the gate capacitor of the thin film transistor N21 and the capacitor Cb21 are charged. At the same time, the thin film transistor N21 turns on. As a result, the potential of the output node OUT begins to rise. At this time, the potential of the node A rises as a result of the bootstrapping action. As a result, the first power VDD1 appears at the output node OUT.

It should be noted that, in the case of FIG. 22, the amplitude of the set signal (INs) is given by two values, i.e., VSS and VDD1. On the other hand, the amplitude of the reset signal (INr) is given by two values, i.e., VSS and VDD3.

Here, if two conditions Vb−VDD1>Vth(N21) and VDD3−VSS>Vth(N22) are satisfied, the buffer circuit 45 functions as a complementary output buffer. Incidentally, Vb is the potential of the node A during the bootstrapping.

Figure 23:
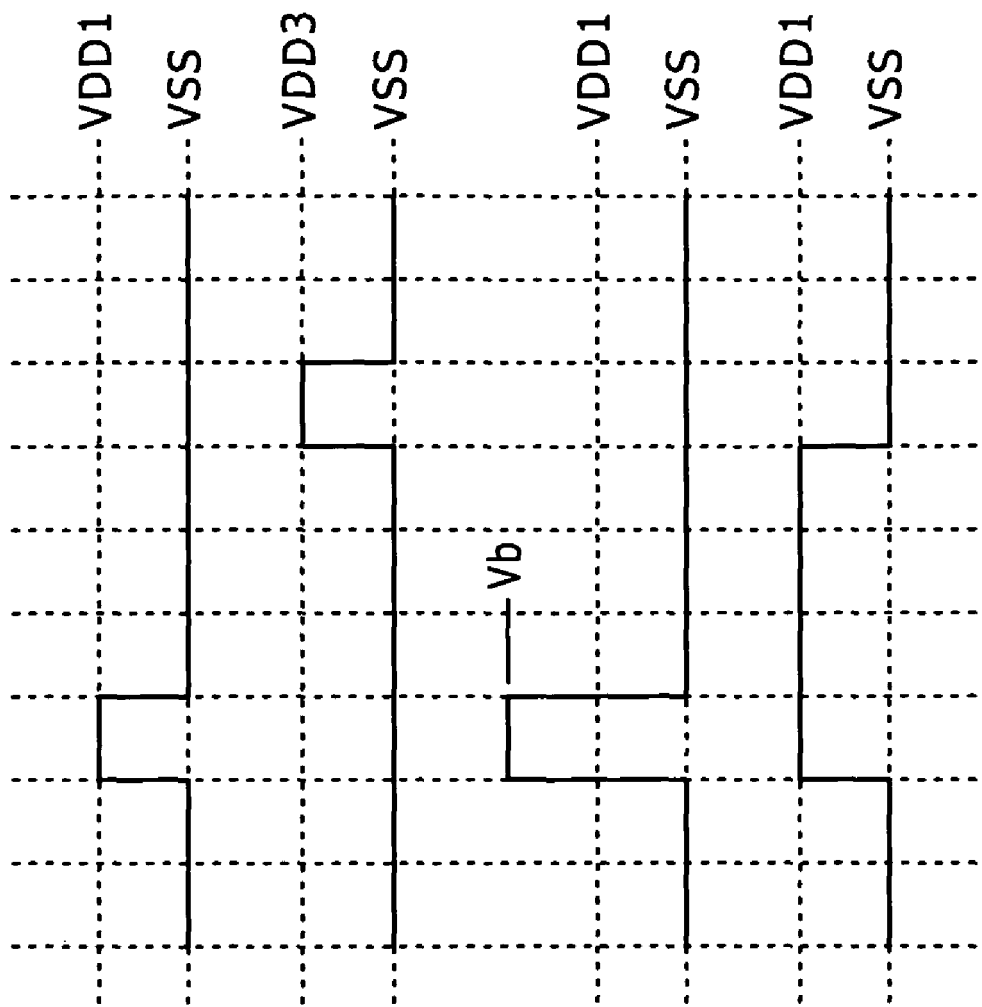
FIGS. 23A to 23D are a diagram illustrating the driving waveforms of the buffer circuit shown in FIG. 22.

If these relationships in potential are satisfied, the first potential VDD1 or second potential VSS appears at the output node OUT of the buffer circuit 45 as shown in FIG. 23D.

It should be noted that, as illustrated in FIGS. 23A and 23B, the two thin film transistors N21 and N22 are never on at the same time. Therefore, no through current will flow. That is, this configuration provides a low-power single-channel type output buffer capable of operating in the same manner as a CMOS buffer circuit.

Incidentally, at least three power sources, i.e., VDD1, VDD3 and VSS, are required to operate the buffer circuit 45 shown in FIG. 22. In this case, Embodiment 2 requires fewer power sources than Embodiment 1.

It should be noted, however, that the number of power sources required to operate the buffer circuit 45 can be reduced to two by setting the high potential VDD3 of the reset signal to the first potential VDD1. This brings down the number of power sources incorporated in the organic EL panel from three to two.

(B-3) Embodiment 3

Figure 24:
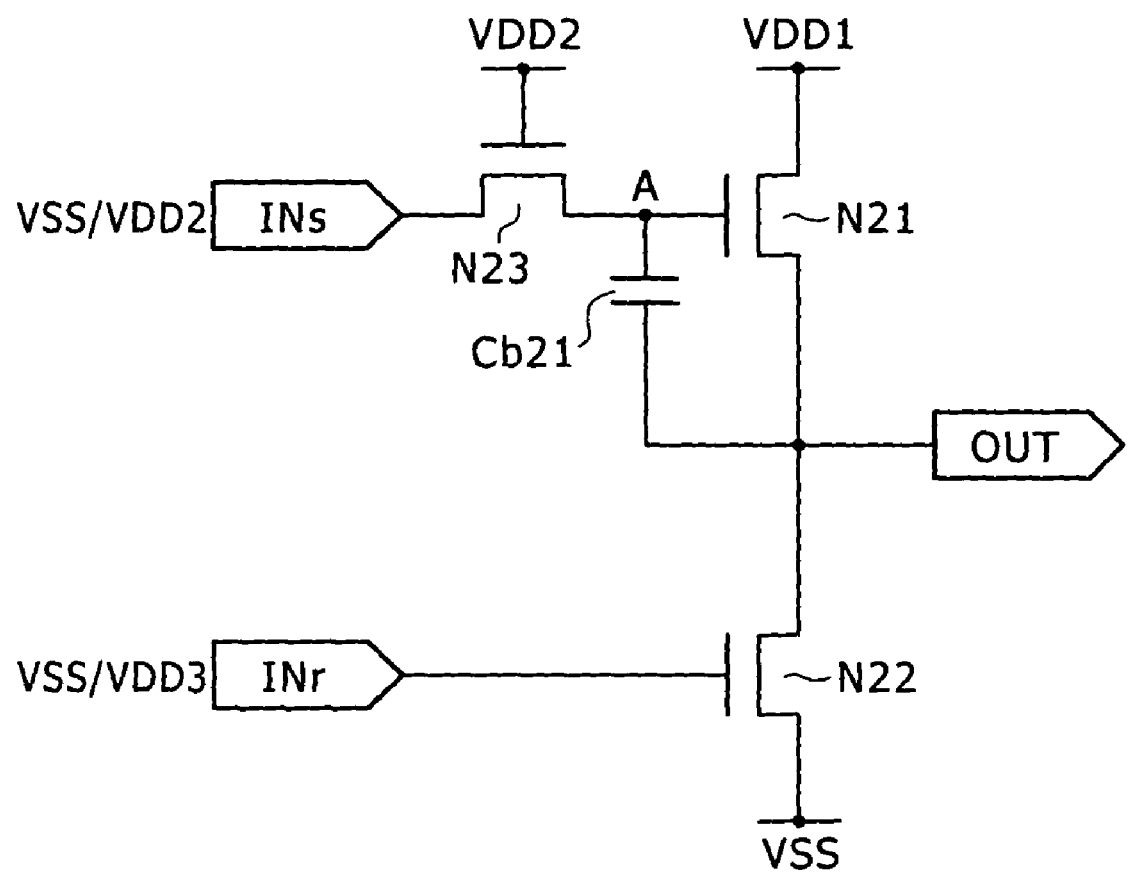
FIG. 24 is a diagram illustrating still another embodiment of the buffer circuit.
Figure 25:
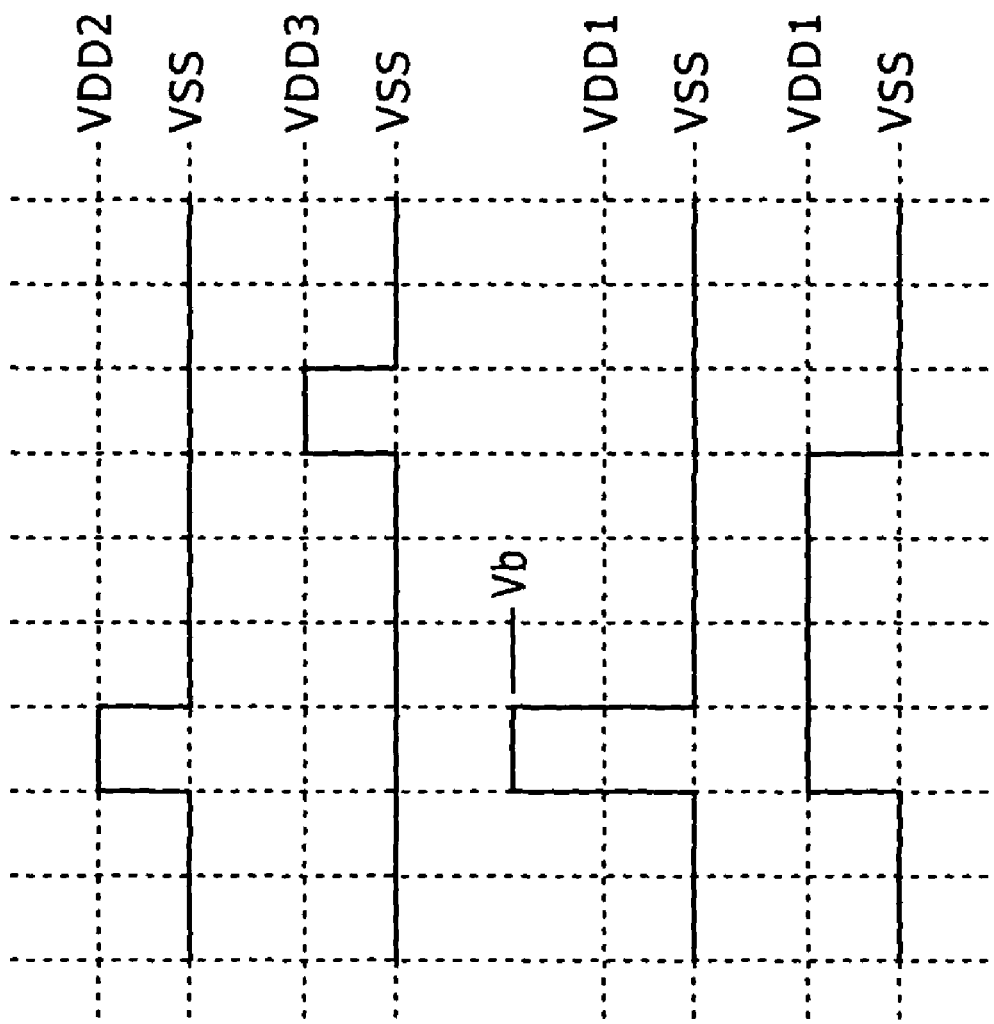
FIGS. 25A to 25D are a diagram illustrating the driving waveforms of the buffer circuit shown in FIG. 24.

FIG. 24 illustrates a third embodiment of the buffer circuit 45. FIGS. 25A to 25D illustrate the associated driving waveforms.

The buffer circuit 45 shown in FIG. 24 is configured identically to the buffer circuit according to the second embodiment (FIG. 22), except that the gate electrode of the thin film transistor N23 is connected to the power source VDD2 (where VDD2<VDD1). Further, the two buffer circuits are identical in that the output stage operates in a complementary manner thanks to the bootstrapping action. Still further, the conditions required for the bootstrapping action are also the same.

The maximum potential of the set signal INs can be brought down from VDD1 to VDD2 by connecting the power source VDD2, lower than the first power source VDD1, to the gate electrode of the thin film transistor N23. For example, even if VDD1 is 10V because of its relationship with the load, VDD2 is only 3V.

This means that a level shift takes place in the output stage. Therefore, a shift register adapted to shift signals at a low amplitude may be used as the shift register 41 adapted to shift the set signal or shift register 43 adapted to shift the reset signal. This provides further reduced power consumption for the system as a whole.

Incidentally, at least four power sources, i.e., VDD1, VDD2, VDD3 and VSS, are required to operate the buffer circuit 45 shown in FIG. 24.

Therefore, the number of power sources required to operate the buffer circuit 45 can be reduced to three by setting the high potential VDD2 of the set signal and the high power source VDD3 of the reset signal equal to each other or setting the high power source VDD3 of the reset signal and the first power source VDD1 equal to each other. This brings down the number of power sources incorporated in the organic EL panel from four to three.

(B-4) Embodiment 4

Combining the above three embodiments in a complex manner provides a buffer circuit capable of timing control in various ways.

(a) Parallel Arrangement (Not Bootstrapped)

Figure 26:
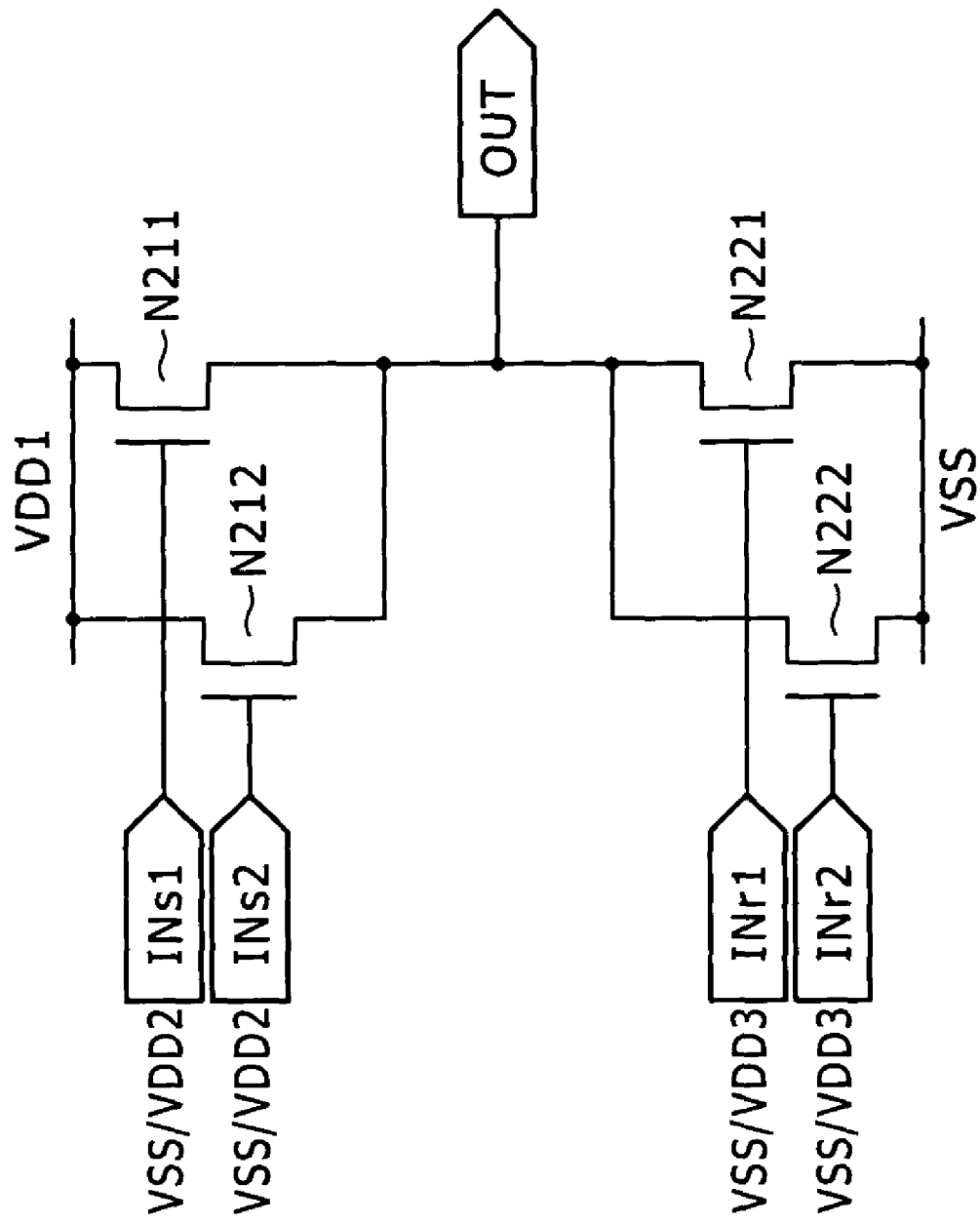
FIG. 26 is a diagram illustrating still another embodiment of the buffer circuit (parallel arrangement)

FIG. 26 illustrates a circuit example in which two buffer circuits according to Embodiment 1 are connected in parallel. In the case of FIG. 26, thin film transistors N211 and N212 adapted to receive the set signal are connected in parallel, and thin film transistors N221 and N222 adapted to receive the reset signal connected in parallel. This circuit configuration provides a buffer circuit in which the output pulse rises to high level when either of the set signals rises to high level, and in which the output pulse falls to low level when either of the reset signals rises to high level.

(b) Serial Arrangement (Not Bootstrapped)

Figure 27:
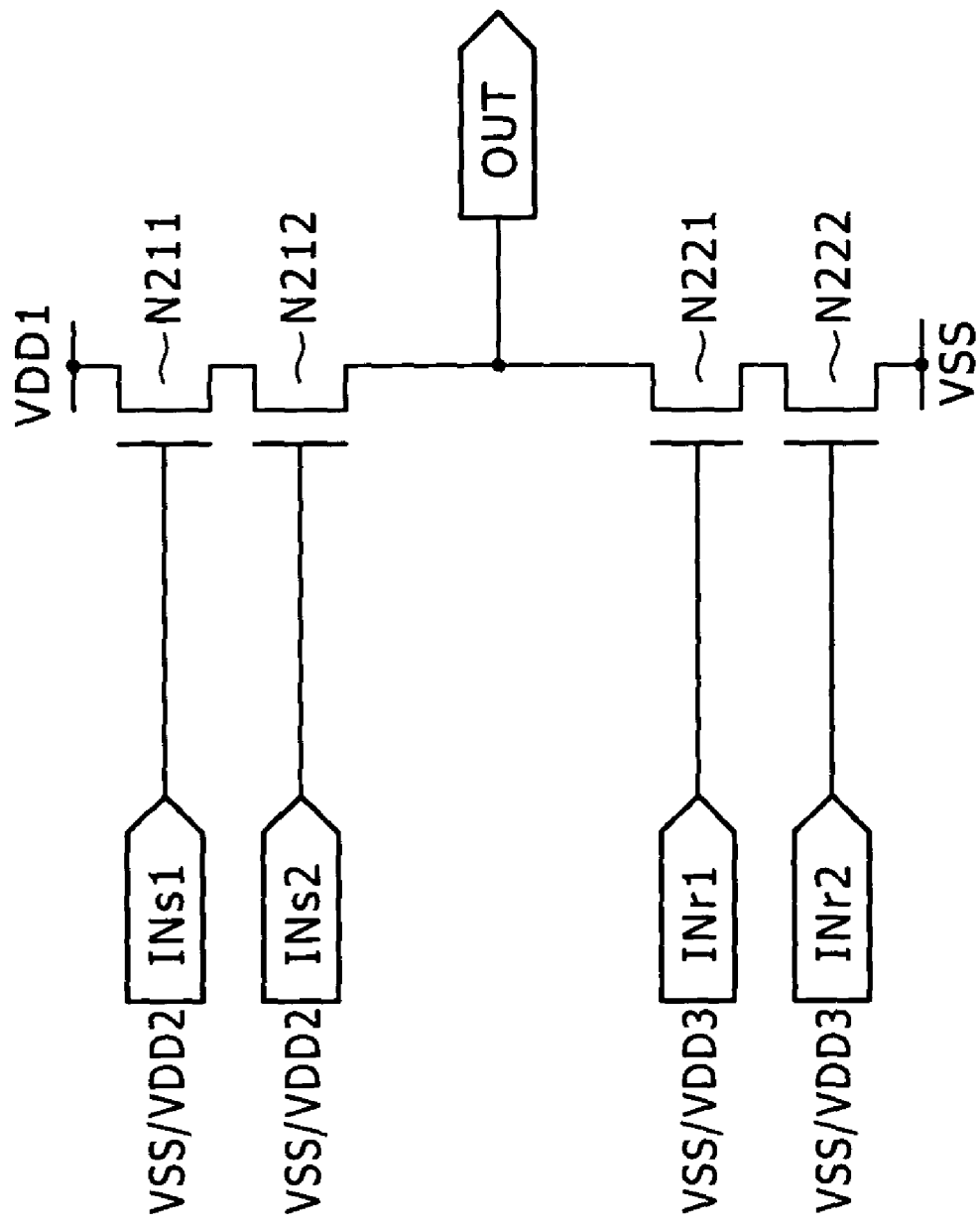
FIG. 27 is a diagram illustrating still another embodiment of the buffer circuit (serial arrangement)

FIG. 27 illustrates a circuit example in which two buffer circuits according to Embodiment 1 are connected in series. In the case of FIG. 27, the thin film transistors N211 and N212 adapted to receive the set signal are connected in series, and the thin film transistors N221 and N222 adapted to receive the reset signal connected in series. This circuit configuration provides a buffer circuit in which the output pulse rises to high level only when both of the set signals rise to high level at the same time, and in which the output pulse falls to low level only when both of the reset signals rise to high level at the same time.

(c) Mixed Arrangement (Not Bootstrapped)

Figure 28:
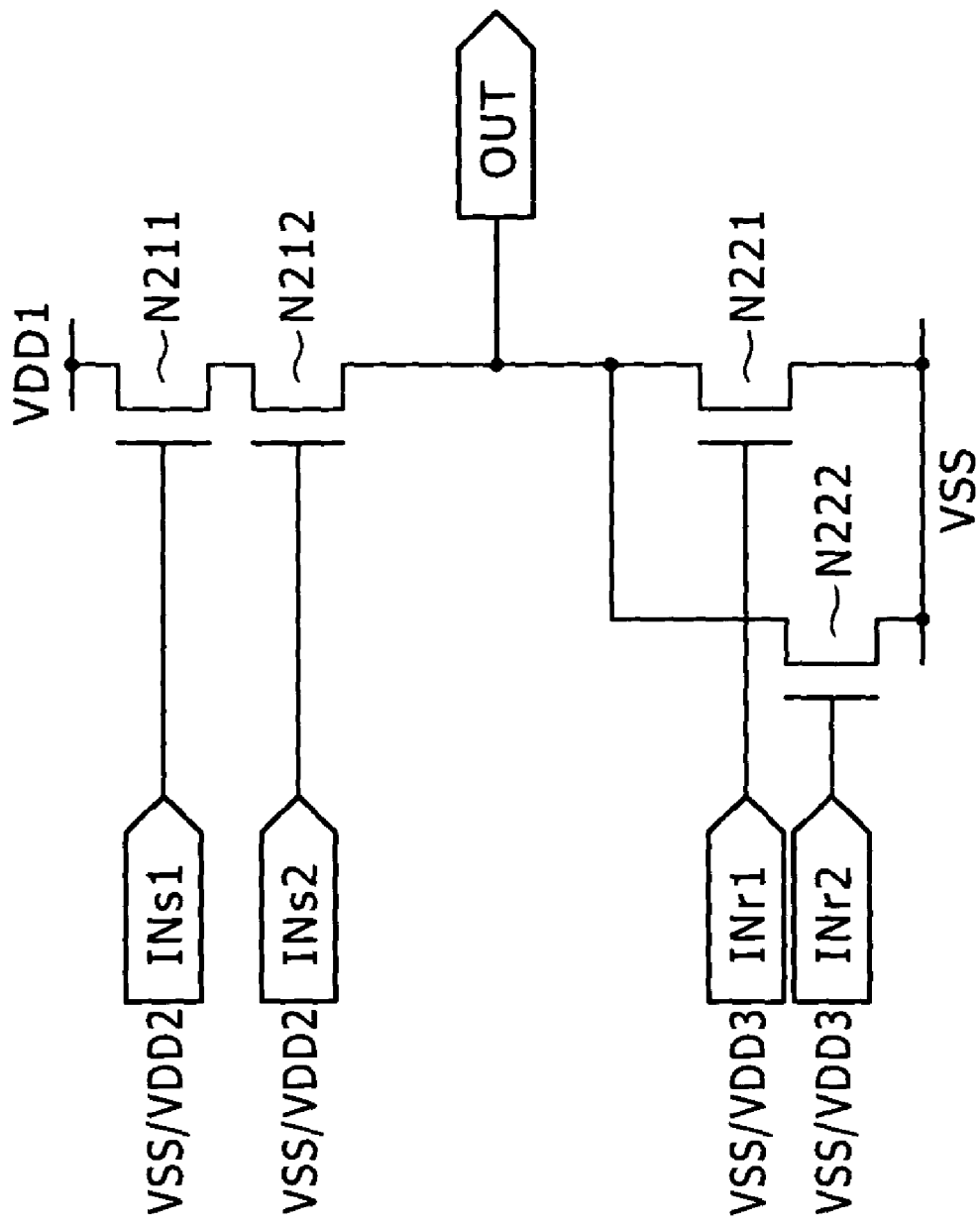
FIG. 28 is a diagram illustrating still another embodiment of the buffer circuit (mixed arrangement)
Figure 29:
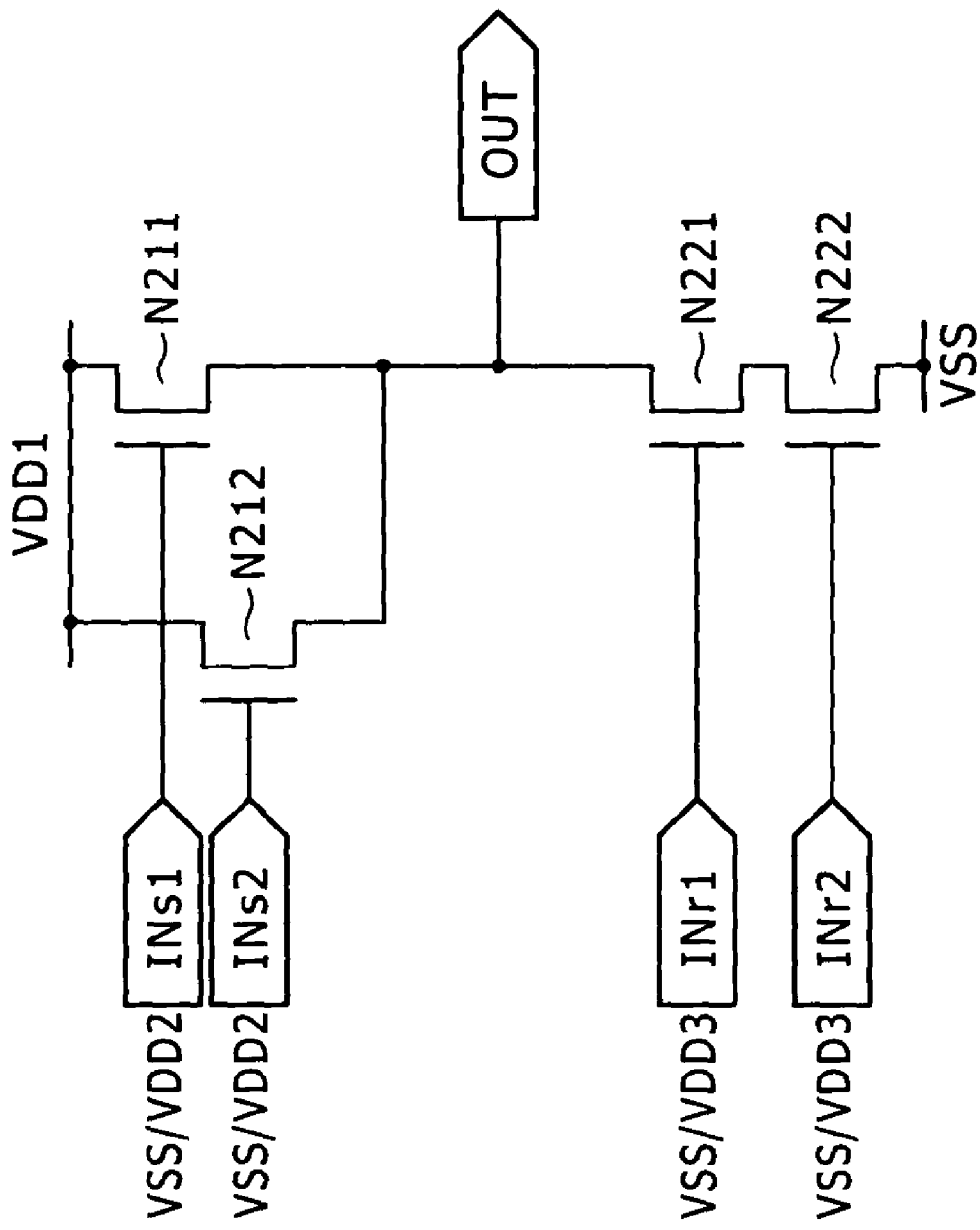
FIG. 29 is a diagram illustrating still another embodiment of the buffer circuit (mixed arrangement)

FIGS. 28 and 29 illustrate circuit examples of mixed arrangement in which the serial arrangement described in Section (a) and the parallel arrangement described in Section (b) are combined.

In the case of FIG. 28, the thin film transistors N211 and N212 adapted to receive the set signal are connected in series, and the thin film transistors N221 and N222 adapted to receive the reset signal connected in parallel. This circuit configuration provides a buffer circuit in which the output pulse rises to high level only when both of the set signals rise to high level at the same time, and in which the output pulse falls to low level when either of the reset signals rises to high level.

In the case of FIG. 29, on the other hand, the thin film transistors N211 and N212 adapted to receive the set signal are connected in parallel, and the thin film transistors N221 and N222 adapted to receive the reset signal connected in series. This circuit configuration provides a buffer circuit in which the output pulse rises to high level when either of the set signals rises to high level, and in which the output pulse falls to low level only when both of the reset signals rise to high level at the same time.

(d) Parallel Arrangement (Bootstrapped)

Figure 30:
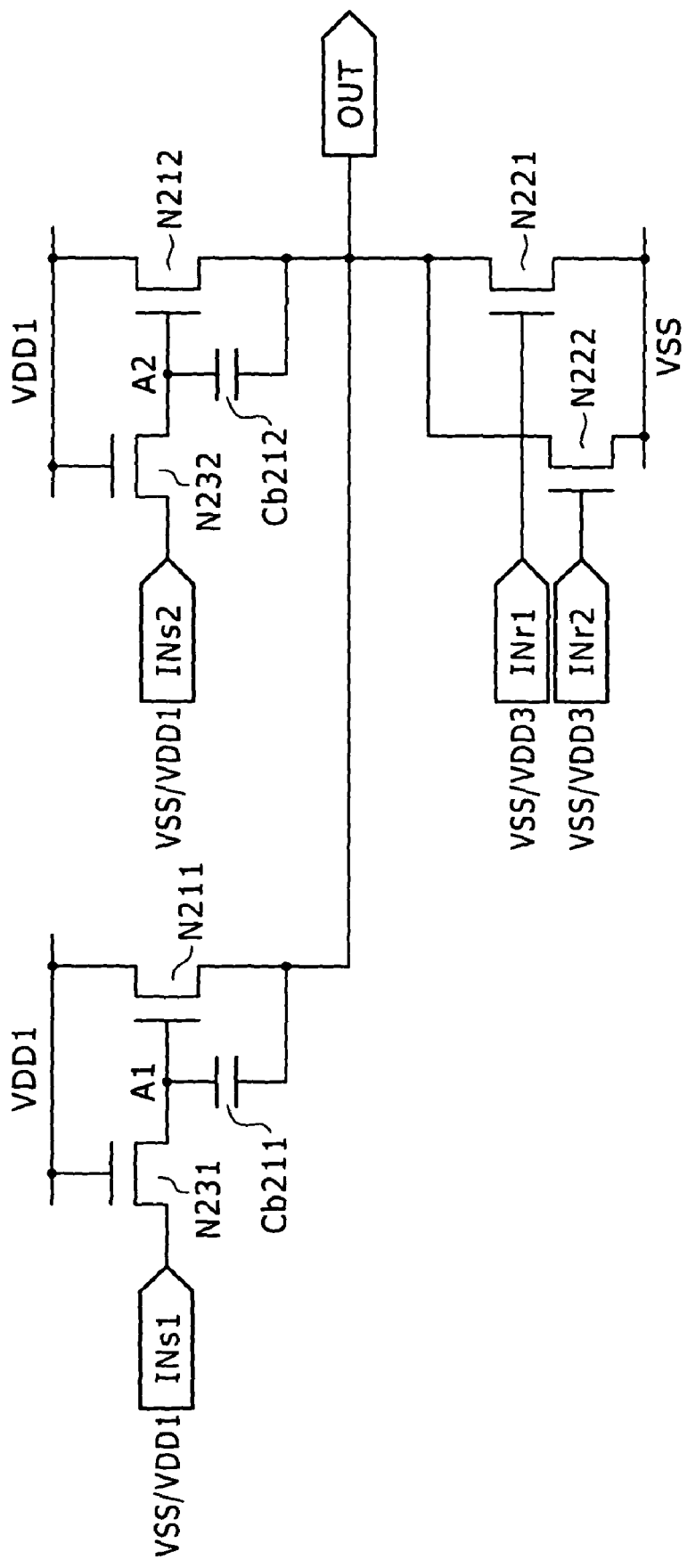
FIG. 30 is a diagram illustrating still another embodiment of the buffer circuit (mixed arrangement)

FIG. 30 illustrates a circuit example in which two buffer circuits according to Embodiment 2 are connected in parallel. In the case of FIG. 30, the thin film transistors N211 and N212 adapted to receive the set signal are connected in parallel, and the thin film transistors N221 and N222 adapted to receive the reset signal connected in parallel. This circuit configuration provides a buffer circuit in which the output pulse rises to high level when either of the set signals rises to high level, and in which the output pulse falls to low level when either of the reset signals rises to high level.

(e) Serial Arrangement (Bootstrapped)

Figure 31:
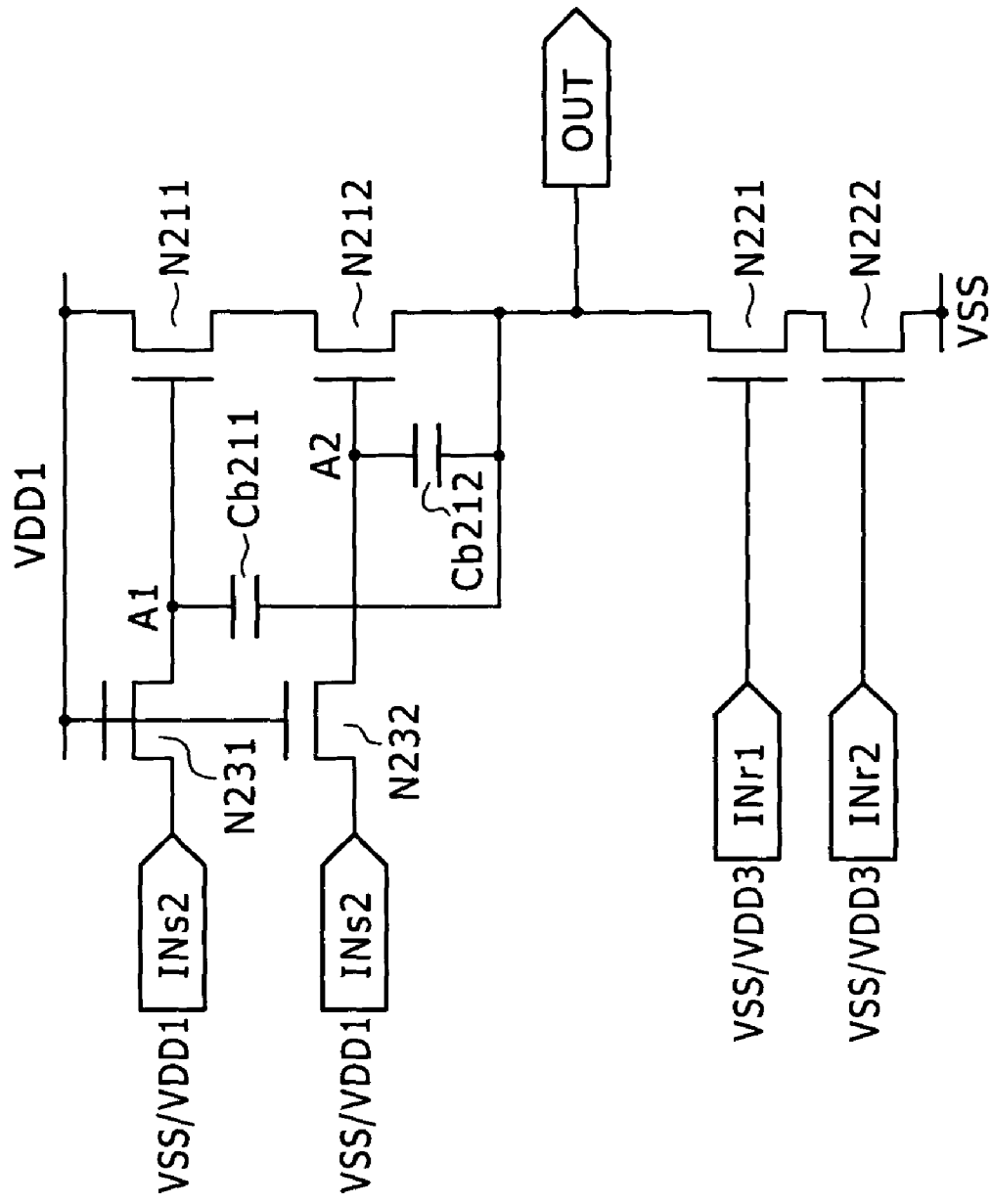
FIG. 31 is a diagram illustrating still another embodiment of the buffer circuit (mixed arrangement)

FIG. 31 illustrates a circuit example in which two buffer circuits according to Embodiment 2 are connected in series. In the case of FIG. 31, the thin film transistors N211 and N212 adapted to receive the set signal are connected in series, and the thin film transistors N221 and N222 adapted to receive the reset signal connected in series. This circuit configuration provides a buffer circuit in which the output pulse rises to high level only when both of the set signals rise to high level at the same time, and in which the output pulse falls to low level only when both of the reset signals rise to high level at the same time.

(f) Mixed Arrangement (Bootstrapped)

Figure 32:
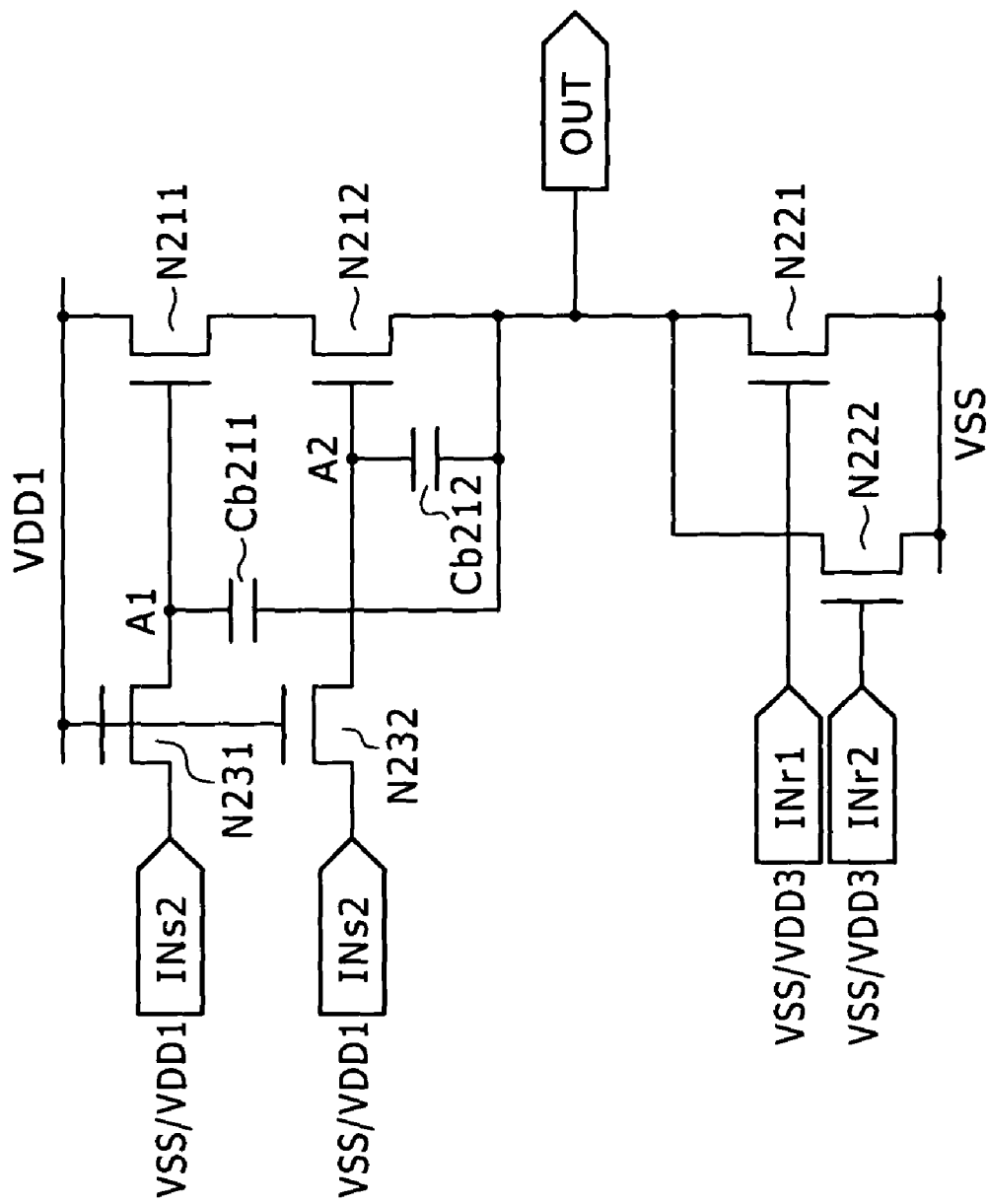
FIG. 32 is a diagram illustrating still another embodiment of the buffer circuit (mixed arrangement)
Figure 33:
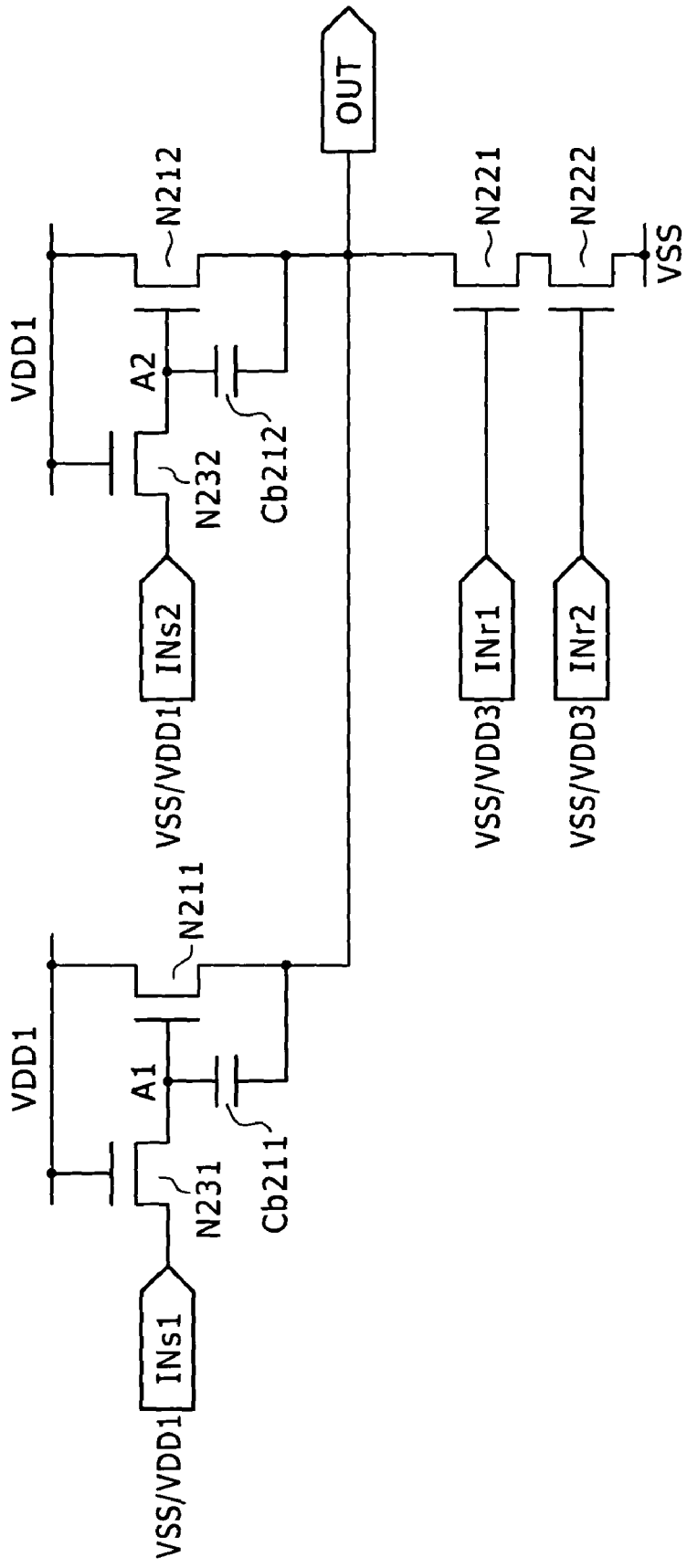
FIG. 33 is a diagram illustrating still another embodiment of the buffer circuit (mixed arrangement)

FIGS. 32 and 33 illustrate circuit examples of mixed arrangement in which the serial arrangement described in Section (d) and the parallel arrangement described in Section (e) are combined.

In the case of FIG. 32, the thin film transistors N211 and N212 adapted to receive the set signal are connected in series, and the thin film transistors N221 and N222 adapted to receive the reset signal connected in parallel. This circuit configuration provides a buffer circuit in which the output pulse rises to high level only when both of the set signals rise to high level at the same time, and in which the output pulse falls to low level when either of the reset signals rises to high level.

In the case of FIG. 33, on the other hand, the thin film transistors N211 and N212 adapted to receive the set signal are connected in parallel, and the thin film transistors N221 and N222 adapted to receive the reset signal connected in series.

This circuit configuration provides a buffer circuit in which the output pulse rises to high level when either of the set signals rises to high level, and in which the output pulse falls to low level only when both of the reset signals rise to high level at the same time.

(g) Parallel Arrangement (Bootstrapped)

Figure 34:
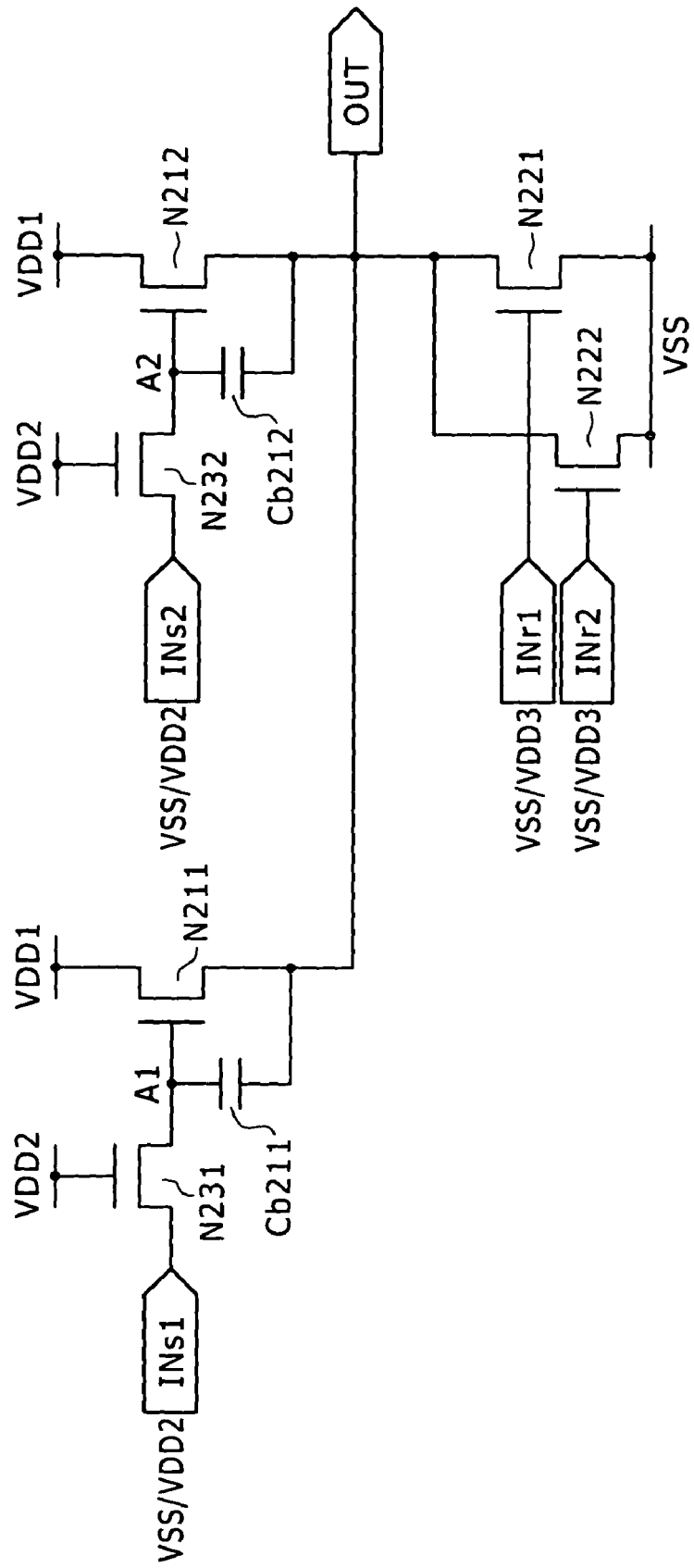
FIG. 34 is a diagram illustrating still another embodiment of the buffer circuit (mixed arrangement)

FIG. 34 illustrates a circuit example in which two buffer circuits according to Embodiment 3 are connected in parallel. In the case of FIG. 34, the thin film transistors N211 and N212 adapted to receive the set signal are connected in parallel, and the thin film transistors N221 and N222 adapted to receive the reset signal connected in parallel. This circuit configuration provides a buffer circuit with level shifting capability in which the output pulse rises to high level when either of the set signals rises to high level, and in which the output pulse falls to low level when either of the reset signals rises to high level.

(h) Serial Arrangement (Bootstrapped)

Figure 35:
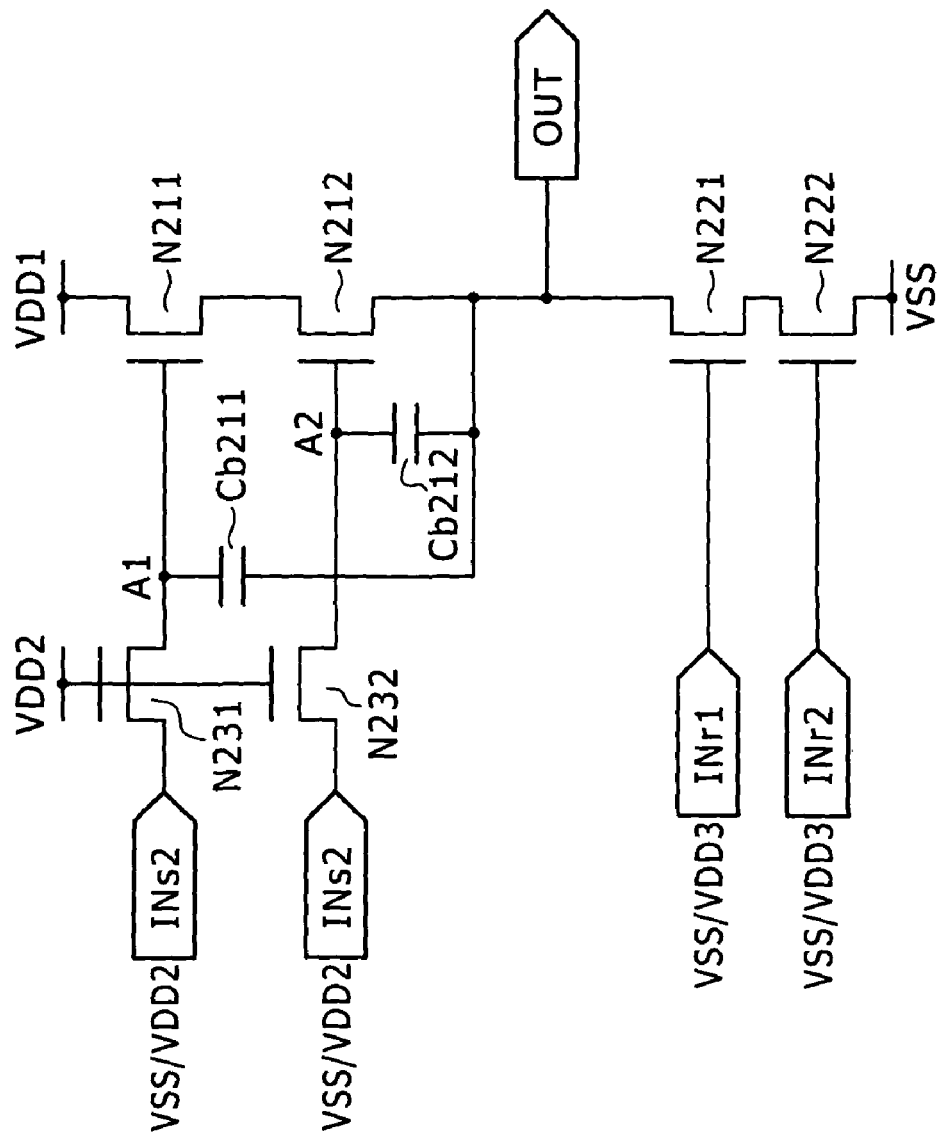
FIG. 35 is a diagram illustrating still another embodiment of the buffer circuit (mixed arrangement)

FIG. 35 illustrates a circuit example in which two buffer circuits according to Embodiment 3 are connected in series. In the case of FIG. 35, the thin film transistors N211 and N212 adapted to receive the set signal are connected in series, and the thin film transistors N221 and N222 adapted to receive the reset signal connected in series. This circuit configuration provides a buffer circuit with level shifting capability in which the output pulse rises to high level only when both of the set signals rise to high level at the same time, and in which the output pulse falls to low level only when both of the reset signals rise to high level at the same time.

(i) Mixed Arrangement (Bootstrapped)

Figure 36:
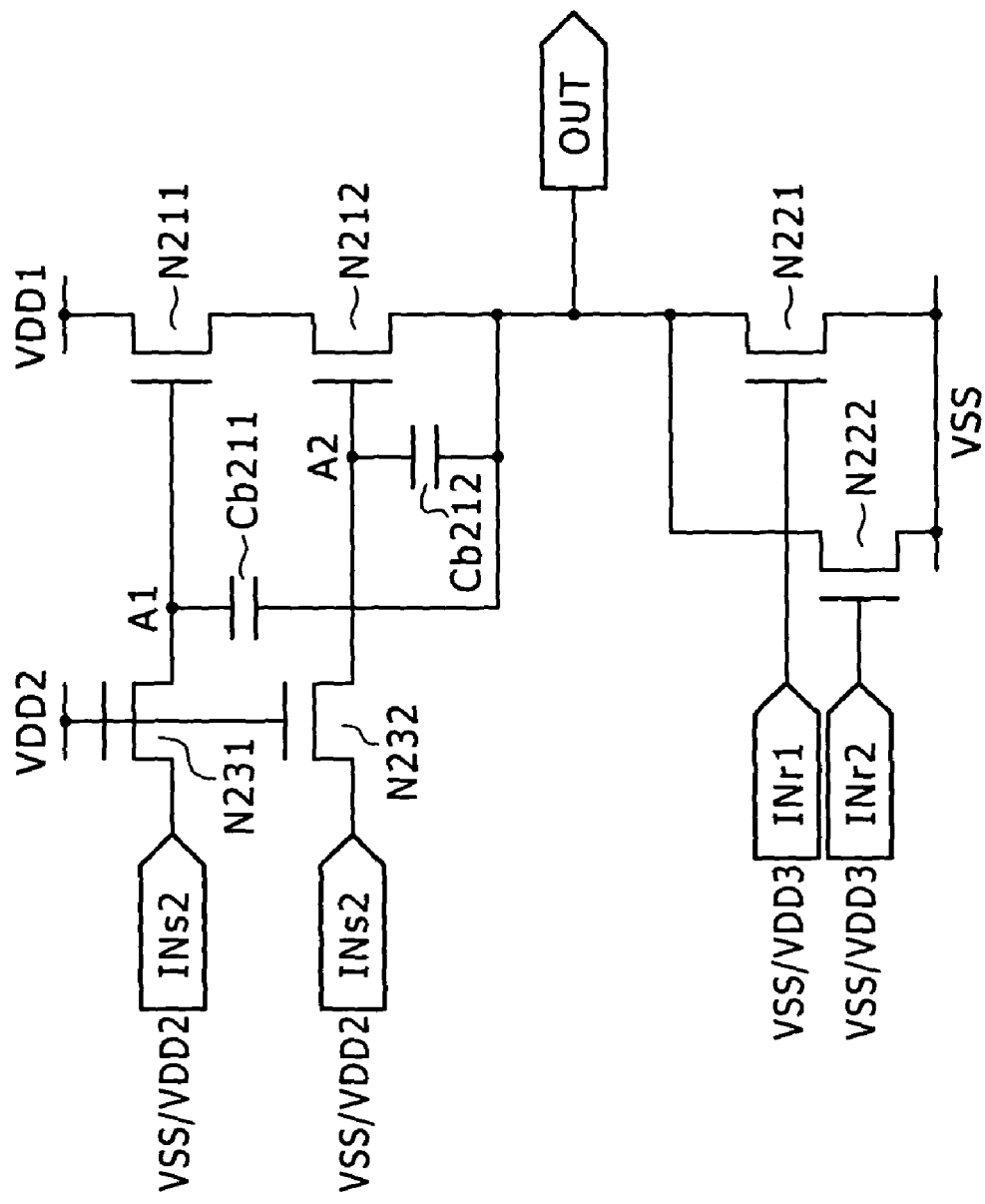
FIG. 36 is a diagram illustrating still another embodiment of the buffer circuit (mixed arrangement)
Figure 37:
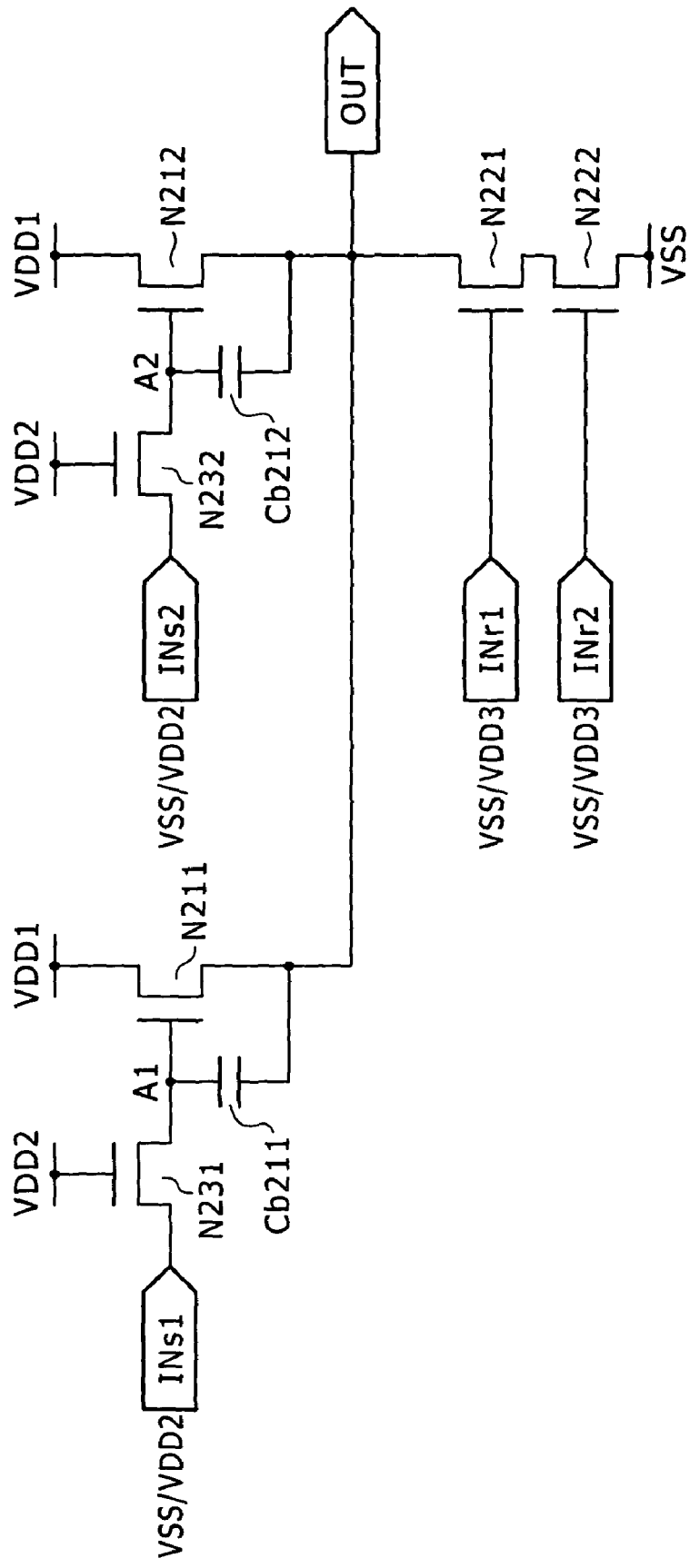
FIG. 37 is a diagram illustrating still another embodiment of the buffer circuit (mixed arrangement)

FIGS. 36 and 37 illustrate circuit examples of mixed arrangement in which the serial arrangement described in Section (g) and the parallel arrangement described in Section (h) are combined.

In the case of FIG. 36, the thin film transistors N211 and N212 adapted to receive the set signal are connected in series, and the thin film transistors N221 and N222 adapted to receive the reset signal connected in parallel. This circuit configuration provides a buffer circuit with level shifting capability in which the output pulse rises to high level only when both of the set signals rise to high level at the same time, and in which the output pulse falls to low level when either of the reset signals rises to high level.

In the case of FIG. 37, on the other hand, the thin film transistors N211 and N212 adapted to receive the set signal are connected in parallel, and the thin film transistors N221 and N222 adapted to receive the reset signal connected in series.

This circuit configuration provides a buffer circuit with level shifting capability in which the output pulse rises to high level when either of the set signals rises to high level, and in which the output pulse falls to low level only when both of the reset signals rise to high level at the same time.

(B-5) Embodiment 5

As described above, the buffer circuit described in Embodiment 1 (FIG. 20) can be modified in various manners and is applicable to a variety of applications.

It should be noted, however, that the buffer circuits described in Embodiments 1 to 4 are limited in their application. The following describes the reasons for their limitation and the embodiments of the buffer circuit free from such a limitation.

Figure 38:
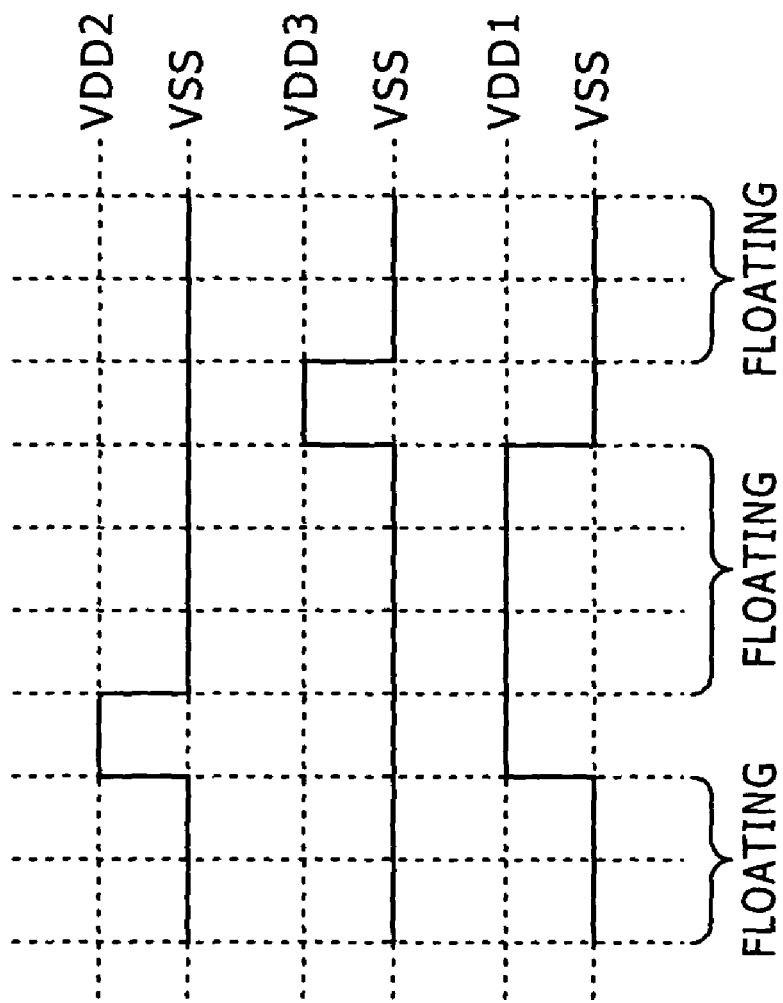
FIGS. 38A to 38C are a diagram for describing how power is supplied to the output stage.

As illustrated in FIG. 38, in the buffer circuits described in Embodiments 1 to 4, the output node is supplied with the power VDD1 or VSS only when the set or reset signal or signals are fed. During other time period, the output node is not supplied with any power. As a result, the output node is left floating.

Naturally, even if the output node is floating, the buffer circuit functions properly when a voltage-controlled load is connected to the output node.

Figure 2:
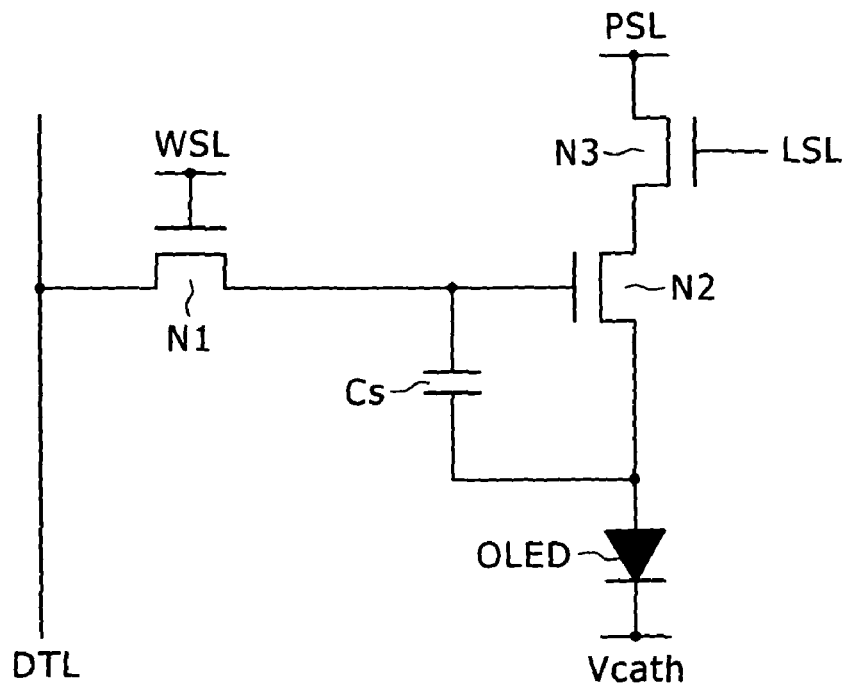
FIG. 2 is an equivalent circuit diagram of a subpixel (NMOS)

For example, when the write control line WSL or the lighting control line LSL for the subpixel 11 having the structure as shown in FIG. 2 is connected to the output node, the control line drive section with one of the buffer circuits shown in Embodiments 1 to 4 can be used.

However, when the output node is connected to a current-consuming load, the required voltage cannot be maintained if a current output continues while the output node is floating. This leads to a reduced potential.

On the other hand, if the thin film transistors N21 and N22 are increased in size to provide a greater driving capability to the buffer circuit, the capacitive load to be driven by the set and reset signals will increase. This imposes a greater burden on the circuit of the previous stage adapted to output the set and reset signals (shift register in this embodiment).

From these standpoints, the buffer circuits which will be illustrated in the following embodiments are capable of continuously supplying a current but impose only a small burden on the circuit of the previous stage.

Figure 39:
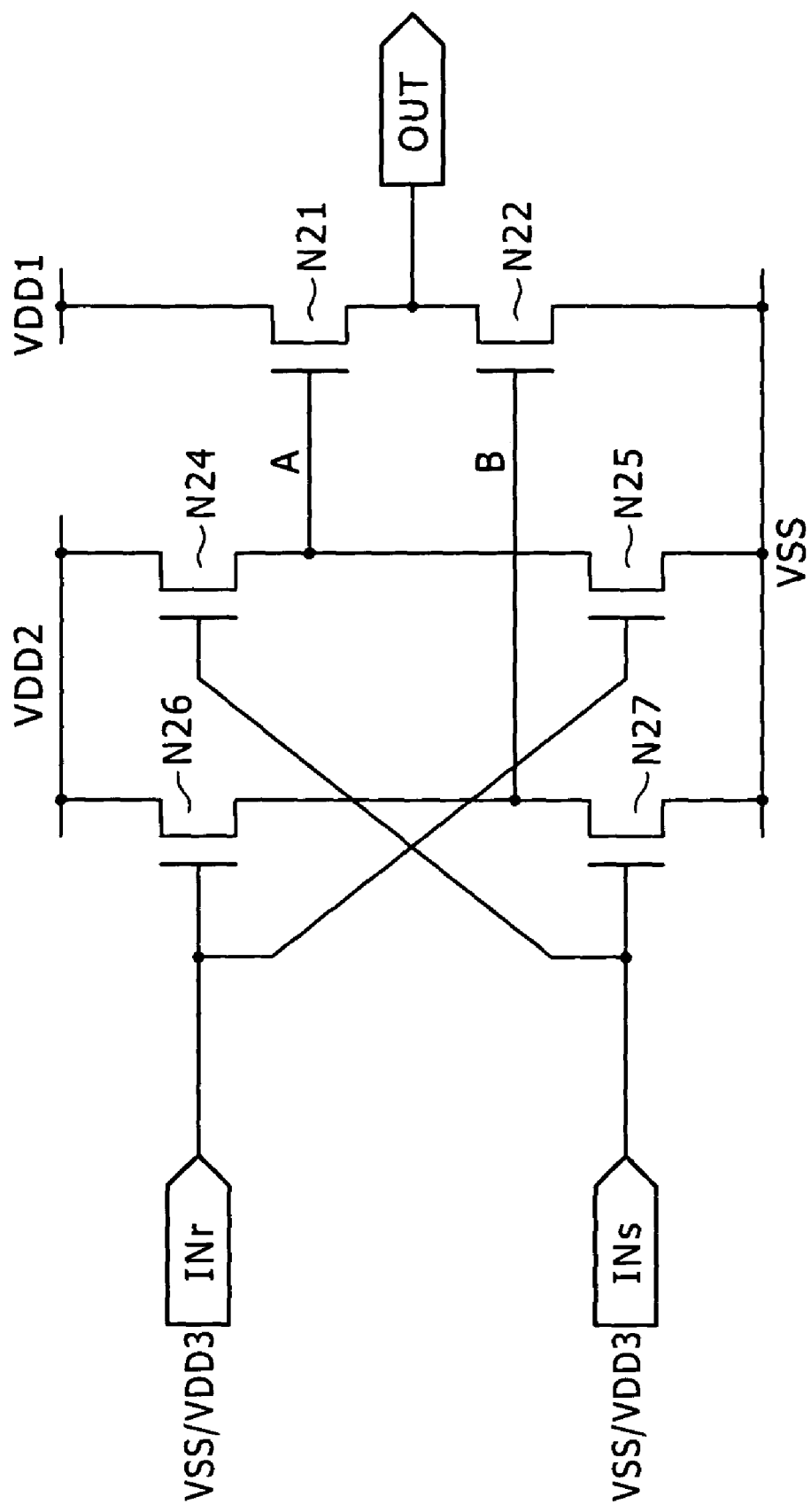
FIG. 39 is a diagram illustrating still another embodiment of the buffer circuit.

FIG. 39 illustrates a fifth embodiment of the buffer circuit 45. FIGS. 40A to 40E illustrate the associated driving waveforms.

The buffer circuit 45 illustrated in FIG. 39 includes two input stages, first and second input stages, at the previous stage of the buffer circuit (output stage) according to Embodiment 1. The first input stage controls the potential of the first node A. The second input stage controls the potential of a node B.

The first and second input stages are basically configured identically to the output stage (thin film transistors N21 and N22).

That is, the first input stage includes NMOS thin film transistors N24 and N25 connected in series between the third and second power sources VDD2 and VSS. It should be noted that the output node of the first input stage is connected to the gate electrode of the thin film transistor N21 making up the output stage.

Incidentally, the set signal is fed to the gate electrode of the thin film transistor N24, and the reset signal to the gate electrode of the thin film transistor N25.

As a result, the thin film transistors N24 and N25 making up the first input stage operate in a complementary manner by the set and reset signal inputs which satisfy the voltage relationships described later.

On the other hand, the second input stage includes NMOS thin film transistors N26 and N27 connected in series between the third and second power sources VDD2 and VSS. It should be noted that the output node of the second input stage is connected to the gate electrode of the thin film transistor N22 making up the output stage.

Incidentally, the reset signal is fed to the gate electrode of the thin film transistor N26, and the set signal to the gate electrode of the thin film transistor N27.

As a result, the thin film transistors N26 and N27 making up the second input stage operate in a complementary manner by the set and reset signal inputs which satisfy the voltage relationships described later.

Figure 40:
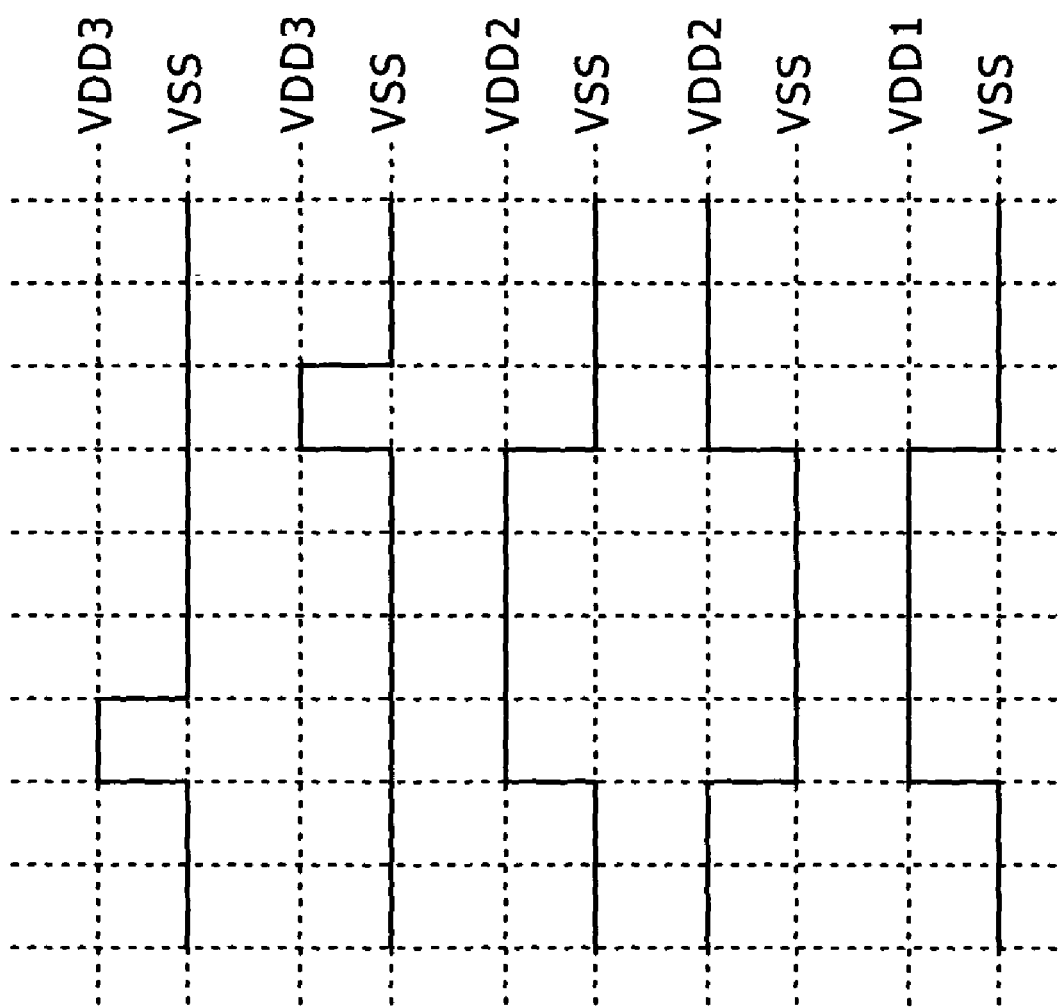
FIGS. 40A to 40E are a diagram illustrating the driving waveforms of the buffer circuit shown in FIG. 39.

By the way, the set and reset signal inputs are reversed between the first and second input stages. That is, the set and reset signal inputs are arranged in a criss-crossed fashion. Therefore, the output pulse of the first input stage is at high level only during a period of time from when the set signal rises to high level to when the reset signal rises to high level. This output pulse is at low level during other period (FIGS. 40A to 40C). On the other hand, the output pulse of the second input stage is at low level only during a period of time from when the set signal rises to high level to when the reset signal rises to high level. This output pulse is at high level during other period (FIGS. 40A, 40B and 40D).

It should be noted that each of the output nodes of the first and second input stages is floating during a period of time other than when the set or reset signal is at high level. However, the output nodes are each connected to the gate electrode of the thin film transistor making up the output stage. As a result, there is no likelihood of a current flowing out. Therefore, the nodes A and B can be maintained constant in potential, including when the nodes are floating (FIGS. 40C and 40D).

As a result, even if the output node OUT of the output stage is connected to a current-consuming load, the first power VDD1 can be continuously supplied to the output node OUT, thus preventing a reduction in potential.

It should be noted that this operation is possible only when the conditions given below are satisfied.

Incidentally, the width of the set signal (INs) is given by two values, i.e., VSS and VDD3, and that of the reset signal (INr) by two values, i.e., VSS and VDD3.

In this case, if three conditions VDD2−VDD1>Vth(N21), VDD3−VDD2>Vth(N24) and VDD3−VDD2>Vth(N26) are satisfied, the first or second power VDD1 or VSS is output in a complementary manner to the output node OUT of the buffer circuit 45 according to the present embodiment.

Naturally, the thin film transistors making up the buffer circuit are all NMOS transistors, thus providing a single-channel type output buffer.

Figure 3:
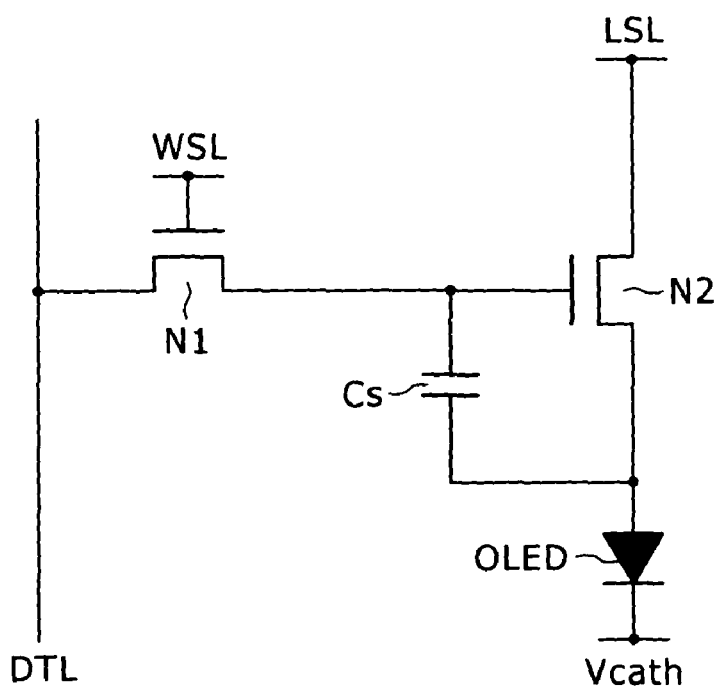
FIG. 3 is an equivalent circuit diagram of the subpixel (NMOS)
Figure 4:
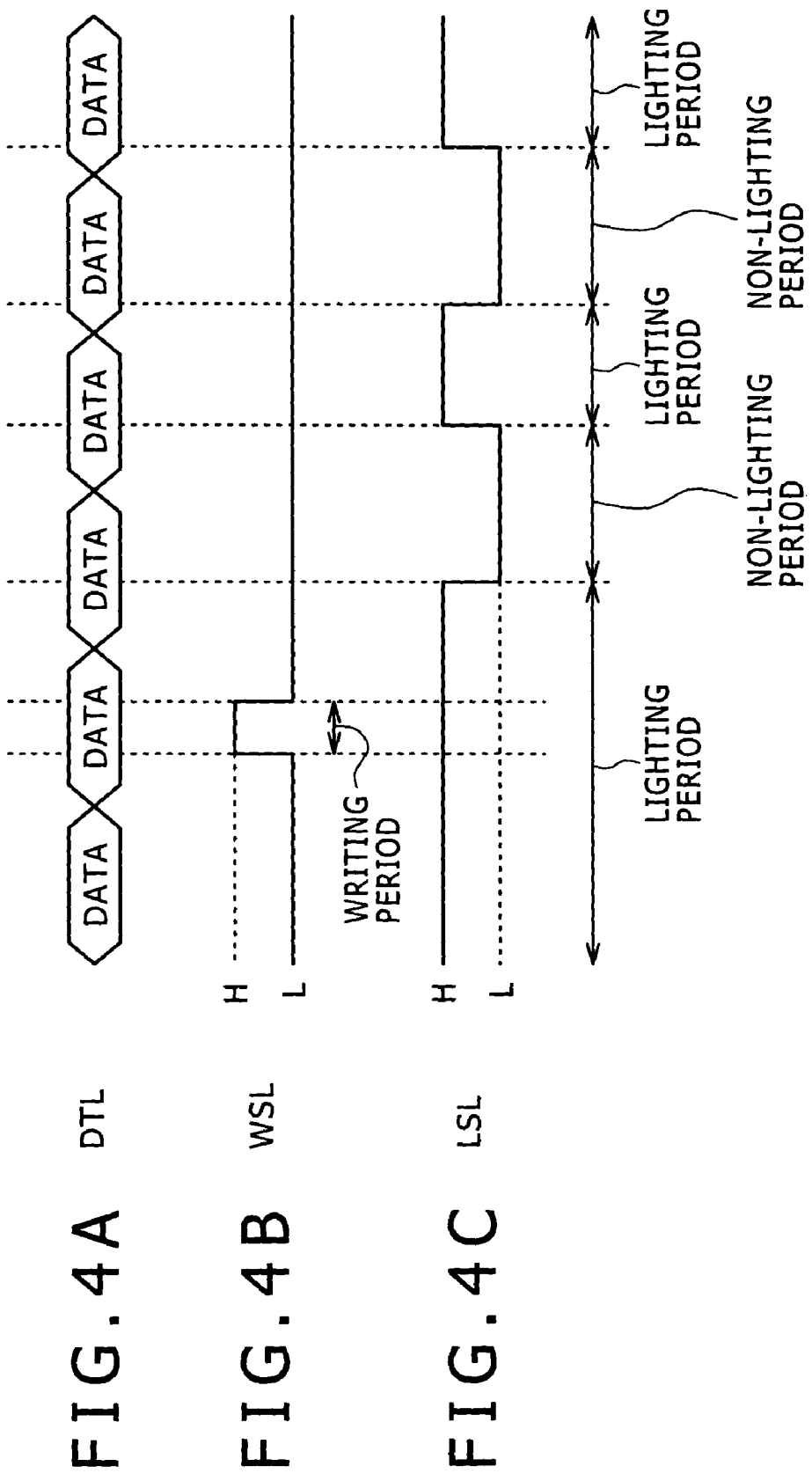
FIGS. 4A to 4C are a diagram for describing the subpixel drive timings.
Figure 5:
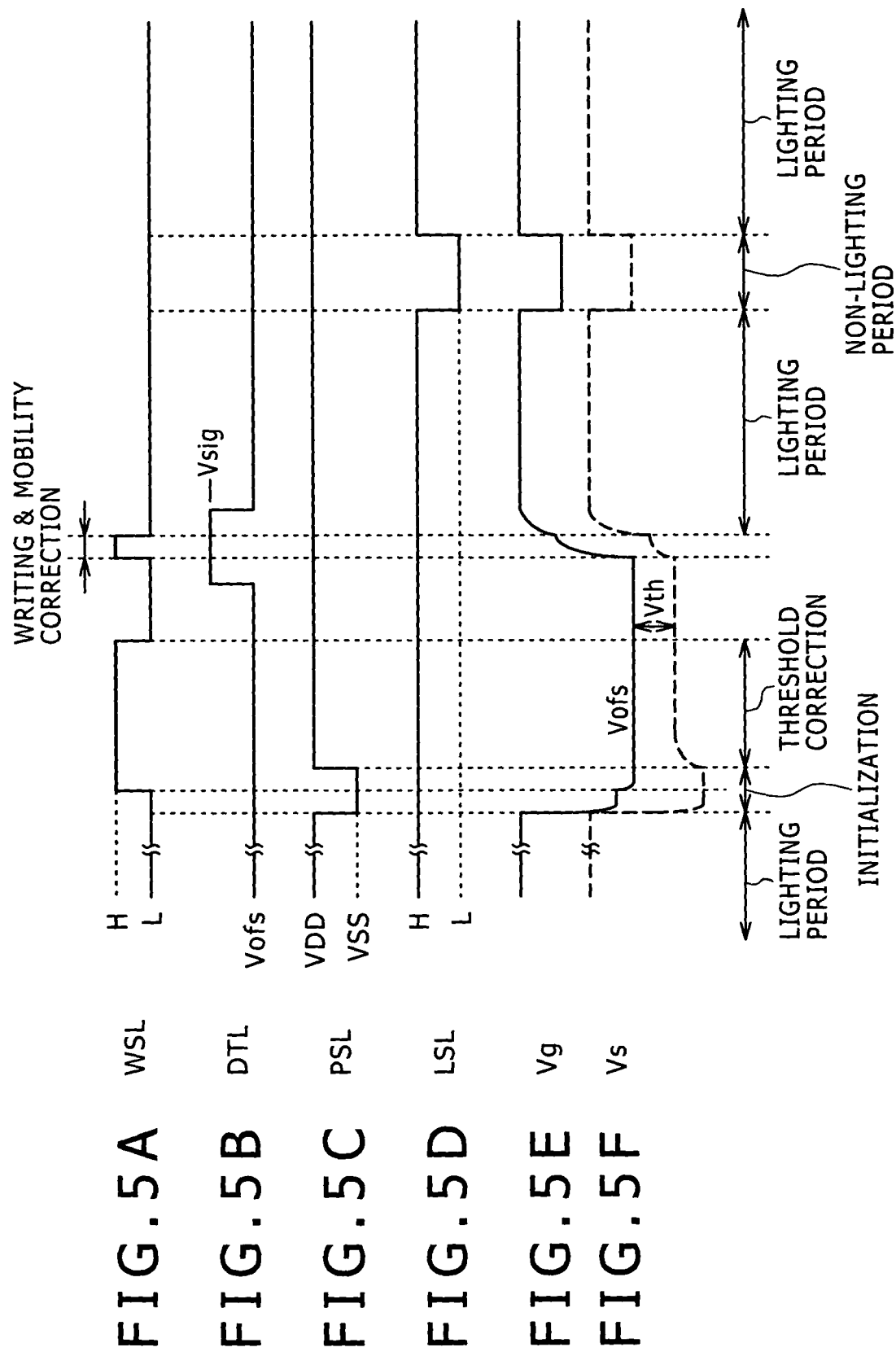
FIGS. 5A to 5F are a diagram illustrating the driving waveforms associated with FIG. 2.

In the buffer circuit 45 according to the present embodiment, on the other hand, the output stage remains powered even during a period of time in which the set and reset signals are at low level. Therefore, even if a current-consuming load (e.g., lighting control line LSL for the subpixel 11 having the structure as shown in FIG. 3) is connected to the output node, the control line drive section with the buffer circuit according to the present embodiment can be used.

It should be noted that if a large load must be driven as when a number of pixels are connected to the lighting control line LSL, the thin film transistors N21 and N22 making up the output stage must be increased in size to provide these transistors with a greater driving capability. Even in this case, however, the set and reset signals need only be capable of driving the two pairs of thin film transistors which make up the first and second input stages. Therefore, the set and reset signals need not increase their driving capability, irrespective of the increased size of the thin film transistors making up the output stage. This provides reduction in the size of the system as a whole including the circuit of the previous stage (e.g., shift register) and ensures lower power consumption.

(B-6) Embodiment 6

Figure 41:
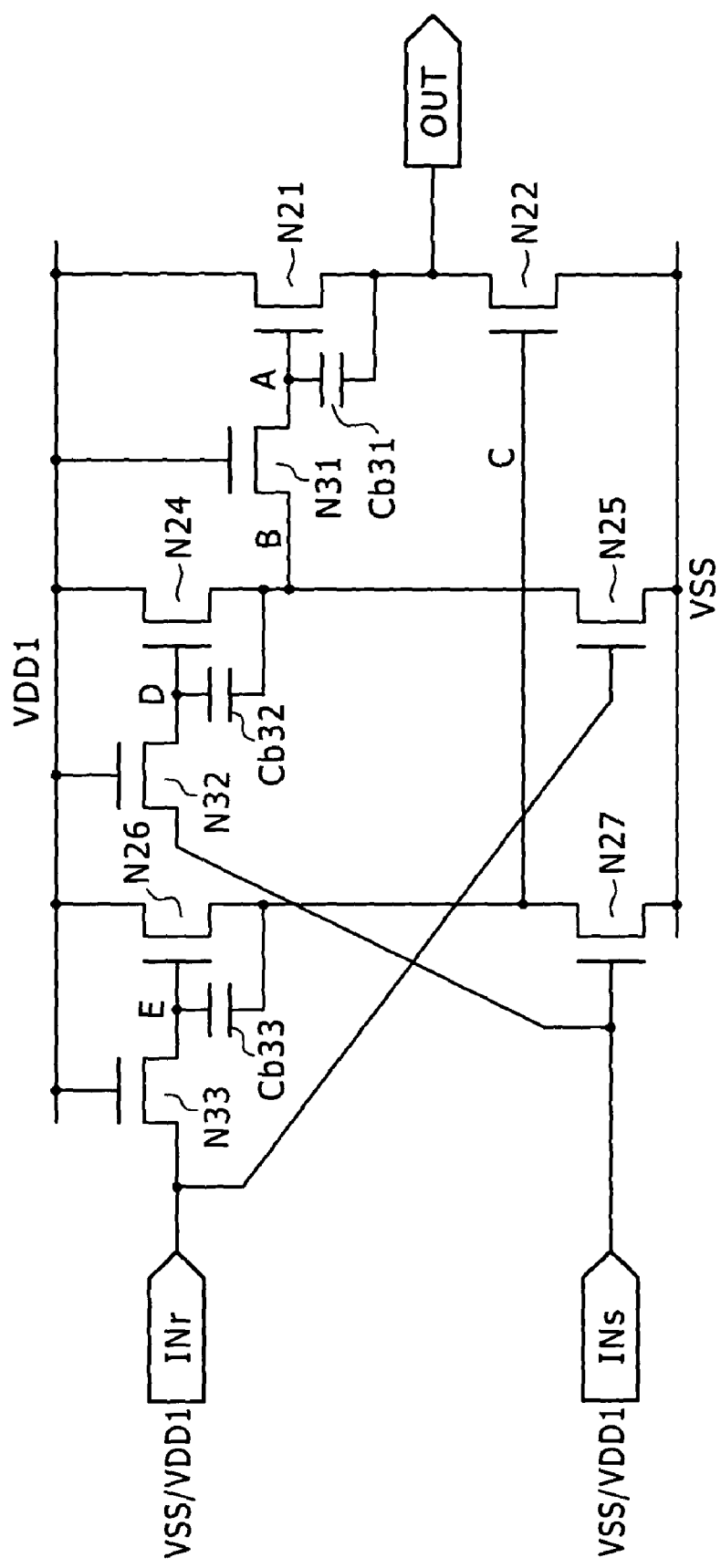
FIG. 41 is a diagram illustrating still another embodiment of the buffer circuit.

FIG. 41 illustrates a sixth embodiment of the buffer circuit 45. FIGS. 42A to 42H illustrate the associated driving waveforms.

In the buffer circuit shown in FIG. 41, the first and second input stages and output stage are bootstrapped. The circuit configuration of the bootstrapping action is the same as in Embodiment 2. Therefore, the detailed description thereof will be omitted.

It should be noted that, in the case of FIG. 41, capacitors of the thin film transistors N21, N24 and N26 are used as the bootstrapping capacitors. FIG. 41 illustrates a case in which capacitors Cb31, Cb32 and Cb33 are connected to supplement the gate capacitors. It should be noted that these capacitors need only be connected as necessary.

Embodiment 6 differs from Embodiment 5 in that the serial circuits making up the first and second input stages and output stage are formed between the first and second power sources VDD1 and VSS.

As a result, the widths of the set signal (INs) and reset signal (INr) are given by two values, i.e., VSS and VDD1.

In this case, if three conditions Vba−VDD1>Vth(N21), Vbd−VDD1>Vth(N24) and Vbe−VDD1>Vth(N26) are satisfied, the first or second power VDD1 or VSS is output in a complementary manner to the output node OUT of the buffer circuit 45 according to the present embodiment. It should be noted that reference numeral Vba denotes a bootstrapping potential at the node A (FIG. 42F), Vbd a bootstrapping potential at a node D (FIG. 42C), and Vbe a bootstrapping potential at a node E (FIG. 42D).

As long as the above three conditions are satisfied, the buffer circuit 45 operates properly only on two power sources. That is, the buffer circuit 45 can output the first and second powers VDD1 and VSS to the output node OUT in a complementary manner.

It should be noted that although not illustrated in FIG. 41, holding capacitors should preferably be provided as necessary for the node B and a node C.

(B-7) Embodiment 7

Figure 43:
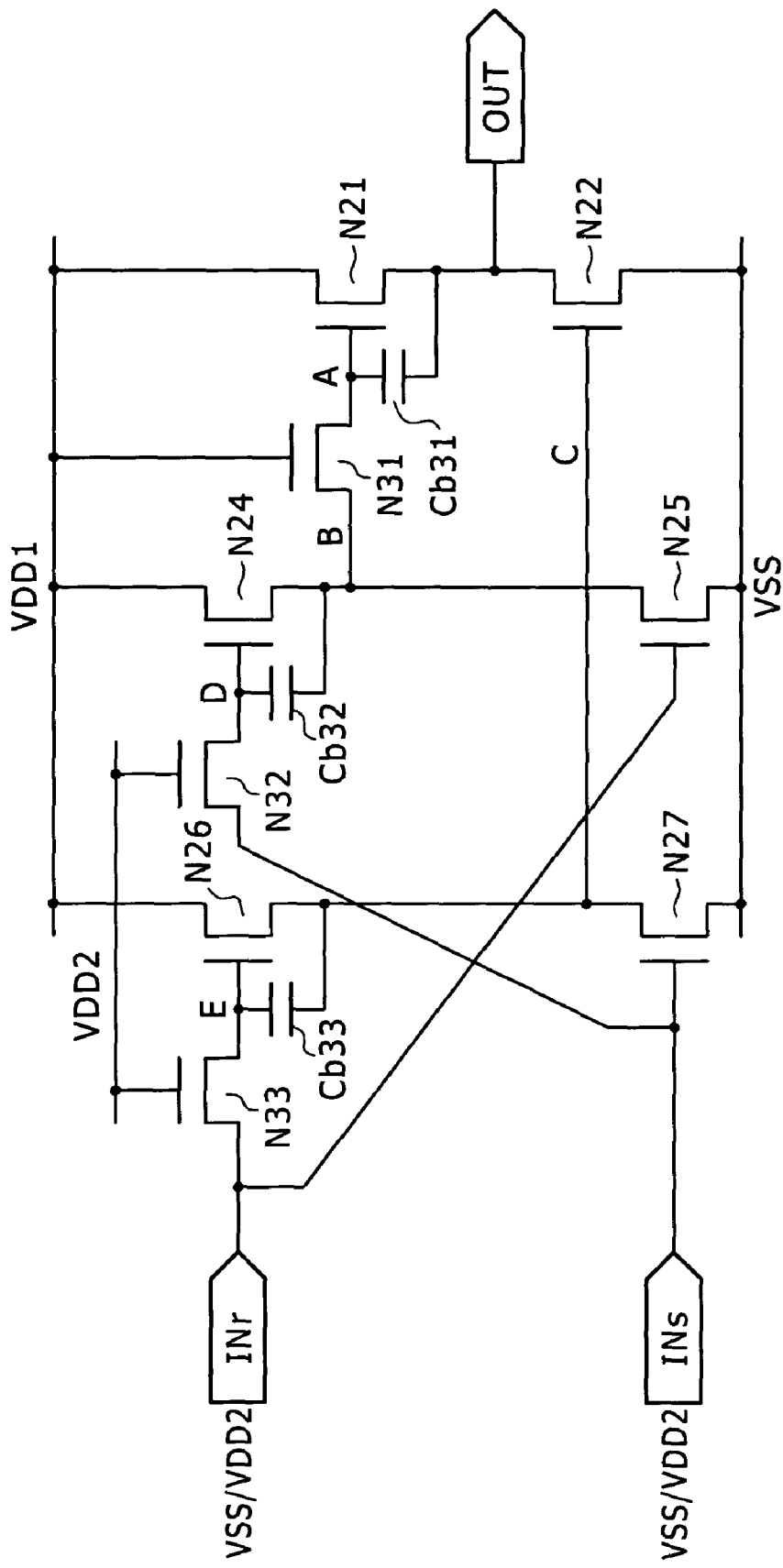
FIG. 43 is a diagram illustrating still another embodiment of the buffer circuit.

FIG. 43 illustrates a seventh embodiment of the buffer circuit 45. FIGS. 44A to 44H illustrate the associated driving waveforms.

The buffer circuit shown in FIG. 43 is similar to that according to Embodiment 6 in that the first and second input stages and output stage are bootstrapped in the circuit according to the present embodiment. The two embodiments differ in that the present embodiment has the level shifting capability as with Embodiment 3.

That is, in the buffer circuit according to the present embodiment, the power source VDD2, lower in voltage than the first power source VDD1, is connected to the gate electrodes of thin film transistors N32 and N33. For example, even if the first power source VDD1 is 10 V, 3 V is used as the VDD2.

This brings down the amplitude required of the set and reset signals from VDD1–VSS to VDD2–VSS.

This makes it possible to use a shift register capable of shifting a signal at low amplitude as the shift register 41 adapted to shift the set signal and the shift register 43 adapted to shift the reset signal. This provides further reduced power consumption for the system as a whole.

It should be noted that the bootstrapping potential required of the nodes B, D and E is the same as in Embodiment 6.

(B-8) Embodiment 8

Figure 45:
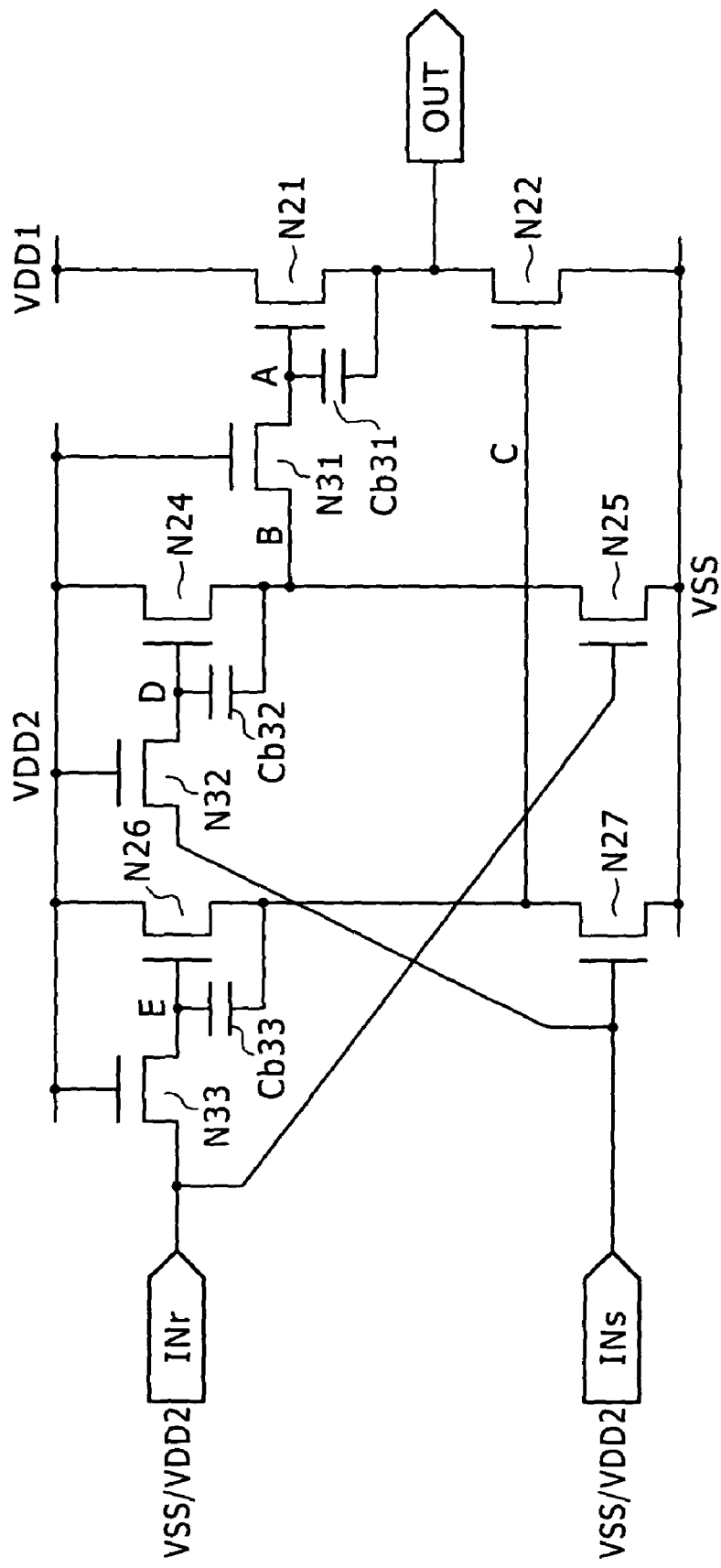
FIG. 45 is a diagram illustrating still another embodiment of the buffer circuit.

FIG. 45 illustrates an eighth embodiment of the buffer circuit 45. FIGS. 46A to 46H illustrate the associated driving waveforms.

The buffer circuit shown in FIG. 45 is similar to that according to Embodiment 7 in that the circuit according to the present embodiment has the bootstrapping and level shifting capabilities.

The two embodiments differ in that the present embodiment performs the level shifting only at the final output stage (thin film transistors N21 and N22) and in that power is supplied to the gate electrode of the thin film transistor N31 and to the first and second input stages from the third power source VDD2 (<VDD1).

This brings down the output amplitude of the first stage from VDD1–VSS to VDD2–VSS. For example, if the first power source VDD1 is 10 V, the second power source VSS 0 V, and the third power source VDD2 3 V, the amplitude of the stages other than the final stage can be reduced from 10 V down to 3 V.

This provides reduced power consumption of the buffer circuit as compared to Embodiment 7.

It should be noted that Embodiment 7 (FIG. 43) must satisfy the conditions shown below in order for this buffer circuit to operate properly.

Vba−VDD1>Vth(N21), Vbd−VDD1>Vth(N24), Vbe−VDD1>Vth(N26)

On the other hand, Embodiment 8 (FIG. 45) must satisfy the conditions shown below.

Vba−VDD1>Vth(N21), Vbd−VDD2>Vth(N24), Vbe−VDD2>Vth(N26)

VDD2−VSS>Vth(N22), VDD2−VSS>Vth(N25), VDD2−VSS>Vth(N27)

Incidentally, reference numeral Vba denotes the bootstrapping potential at the node A (FIG. 46F), Vbd the bootstrapping potential at the node D (FIG. 46C), and Vbe the bootstrapping potential at the node E (FIG. 46D).

(B-9) Embodiment 9

Figure 47:
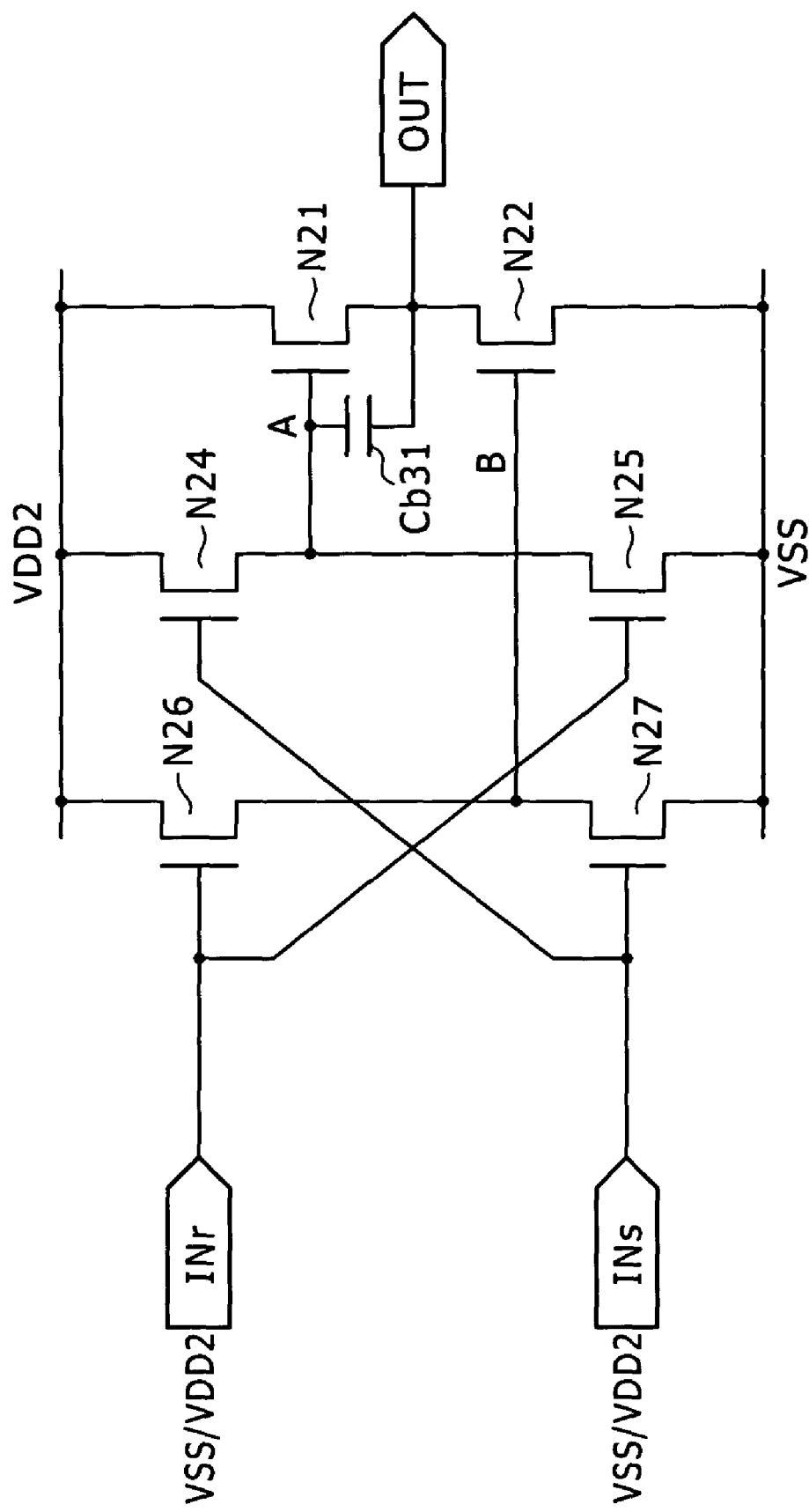
FIG. 47 is a diagram illustrating still another embodiment of the buffer circuit.

FIG. 47 illustrates a ninth embodiment of the buffer circuit 45. In Embodiments 6 to 8 described above, the first and second input stages and output stage are all bootstrapped to ensure high operating reliability.

Alternatively, however, only some of the stages may be bootstrapped.

Incidentally, FIG. 47 illustrates a case in which only the final output stage is bootstrapped. This provides a smaller number of elements and reduced layout area. During packaging, however, the optimal circuit configuration is selected in consideration of the operating margin and size of each of the thin film transistors.

In the case of this circuit example, the high level potential of the node A at times other than during the bootstrapping action is given by VDD2−Vth(N24). It should be noted, however, that if the node A potential Vba pushed up by the bootstrapping action is greater by the threshold voltage Vth(N21) or more than the second power source VDD2, the VDD2 output potential can be developed at the output node OUT.

(B-10) Embodiment 10

Figure 48:
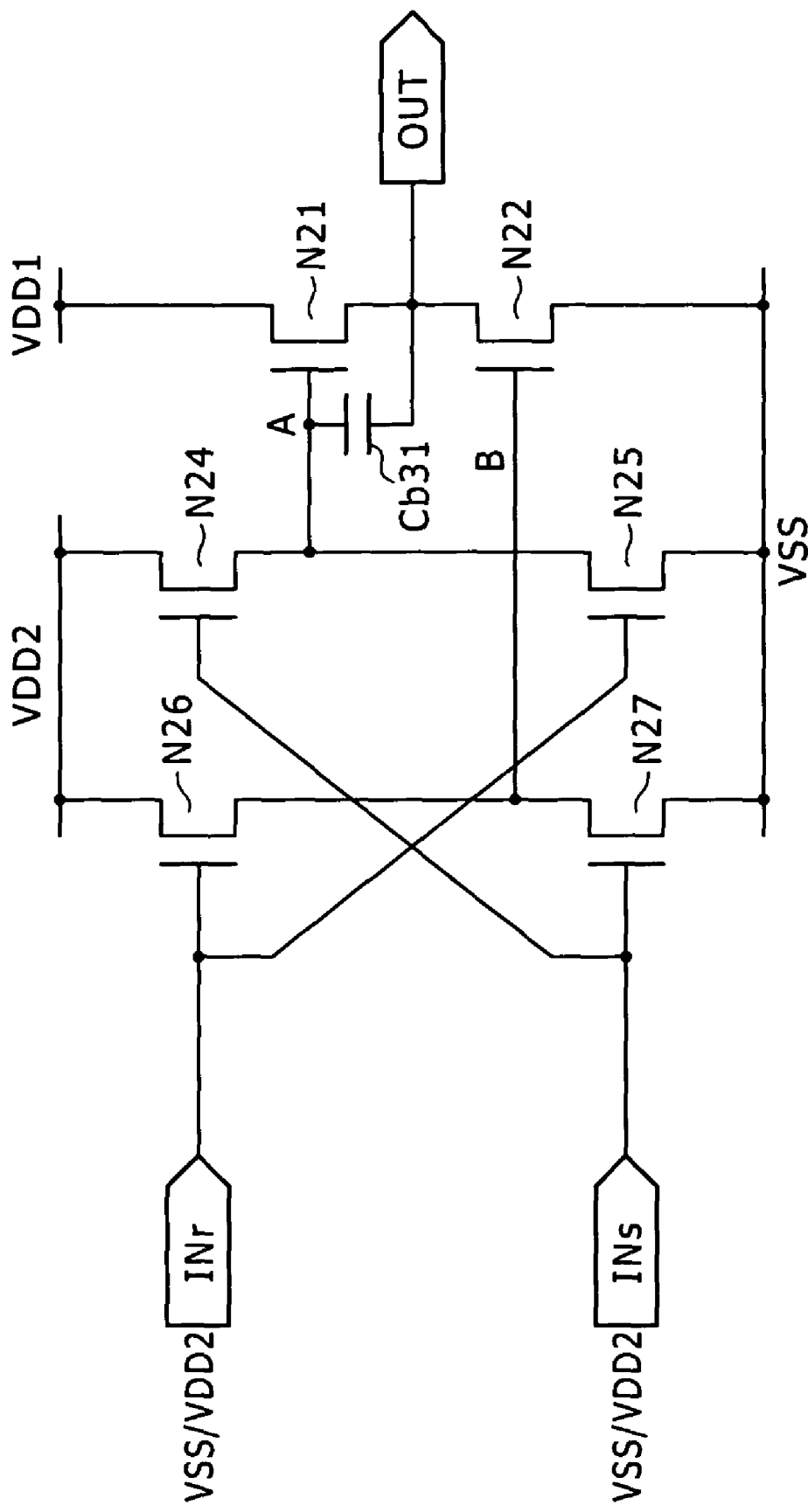
FIG. 48 is a diagram illustrating still another embodiment of the buffer circuit.

FIG. 48 illustrates a tenth embodiment of the buffer circuit. The buffer circuit 45 shown in FIG. 48 corresponds to a circuit example in which the level shifting capability is added to the buffer circuit 45 according to Embodiment 9.

Therefore, VDD2–VSS is supplied to the first and second input stages, and VDD1–VSS to the output stage.

Also in the case of this circuit example, the high level potential of the node A at times other than during the bootstrapping action is given by VDD2−Vth(N24). It should be noted, however, that if the node A potential Vba pushed up by the bootstrapping action is greater by the threshold voltage Vth(N21) or more than the first power source VDD1, the VDD1 output potential can be developed at the output node OUT.

(B-11) Embodiment 11

Figure 49:
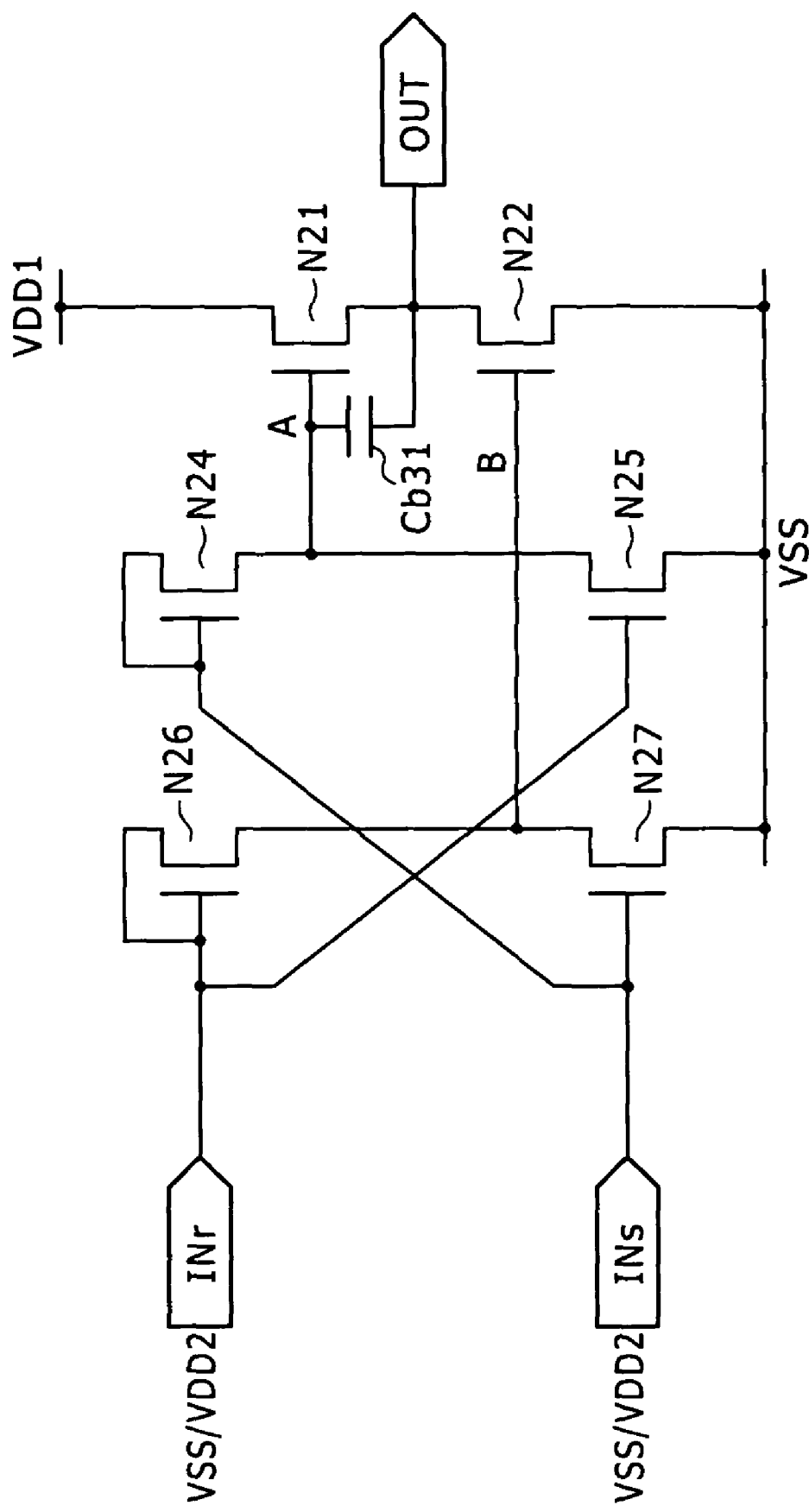
FIG. 49 is a diagram illustrating still another embodiment of the buffer circuit.

FIG. 49 illustrates an eleventh embodiment of the buffer circuit. The buffer circuit 45 shown in FIG. 49 is a preferred circuit example adapted to provide a reduced layout area as compared to the buffer circuit 45 according to Embodiment 10. More specifically, the thin film transistors N24 and N26, respectively at the high potential sides of the first and second input stages, are diode-connected. This configuration provides a reduced wiring layout for supplying the third power VDD2.

(B-12) Embodiment 12

Figure 50:
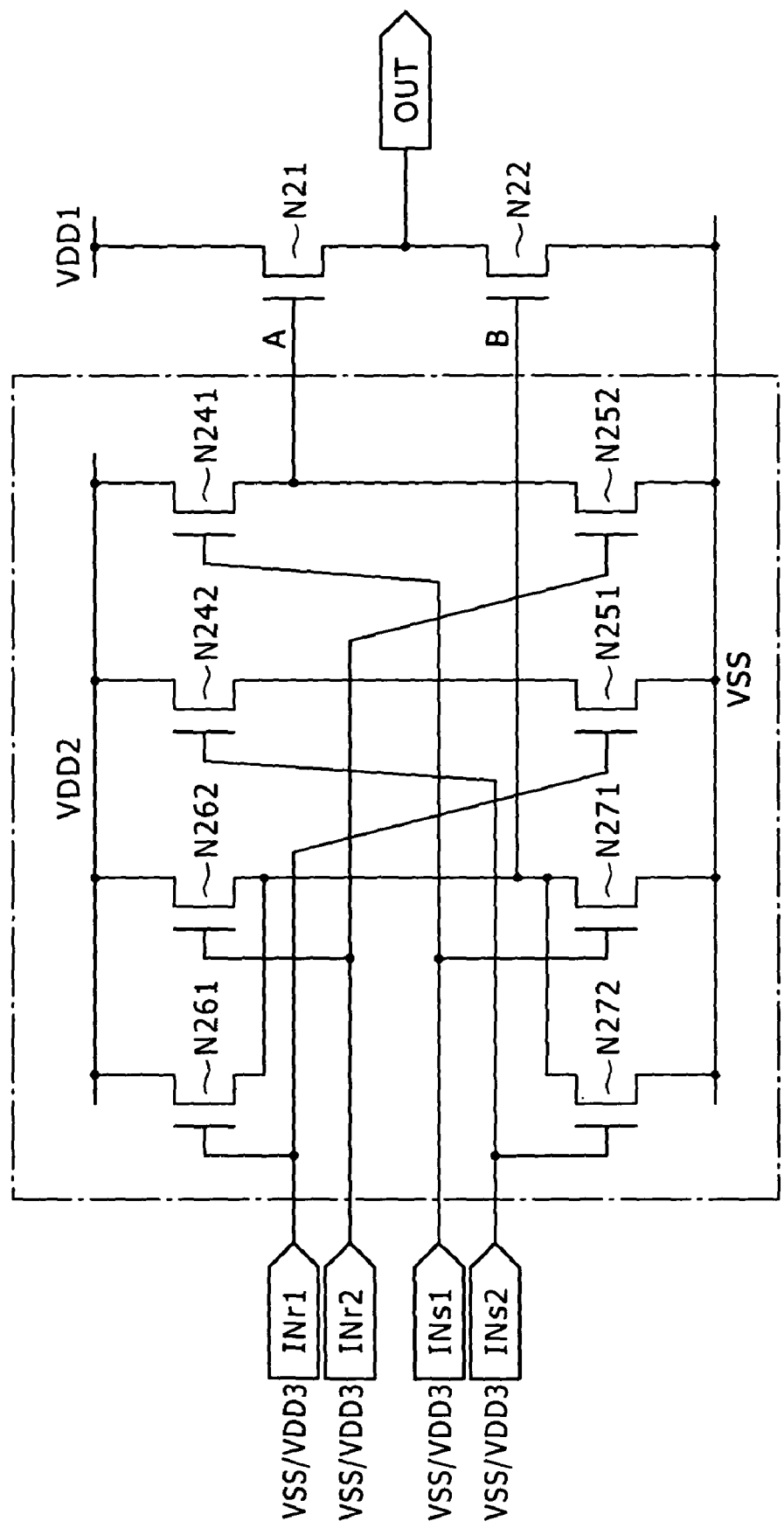
FIG. 50 is a diagram illustrating still another embodiment of the buffer circuit.

FIG. 50 illustrates a twelfth embodiment of the buffer circuit. The buffer circuit 45 shown in FIG. 50 corresponds to a configuration example in which the first and second input stages of the buffer circuit 45 according to Embodiment 5 are connected in parallel.

As described above, one of the parallel, serial and mixed arrangements can be used for the buffer circuit adapted to continuously supply power to the control node at the output stage, as for Embodiment 4 described above.

(B-13) Embodiment 13

Figure 51:
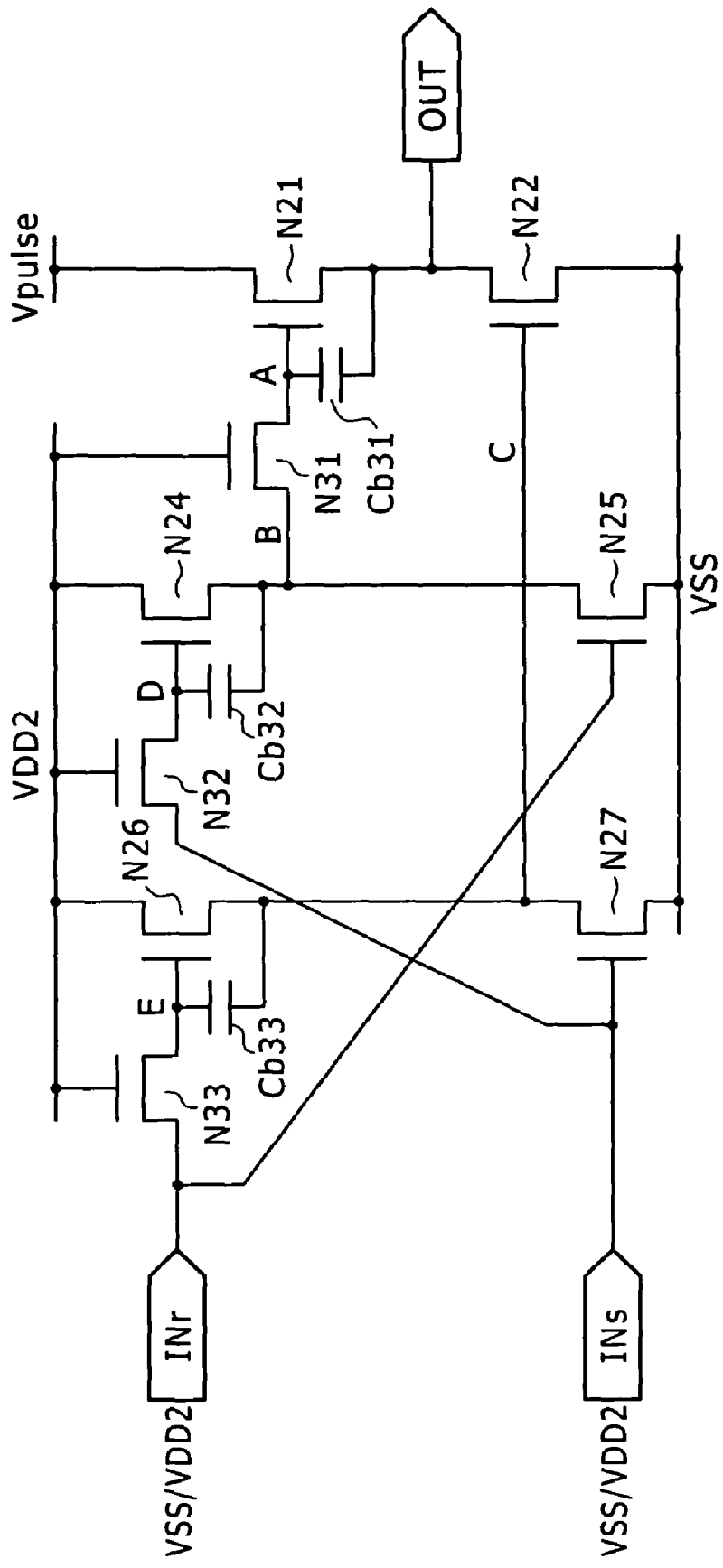
FIG. 51 is a diagram illustrating still another embodiment of the buffer circuit.

FIG. 51 illustrates a thirteenth embodiment of the buffer circuit. FIGS. 52A to 52I illustrate the associated driving waveforms. In Embodiments 5 to 12 described above, the waveforms appearing at the output node OUT are limited to rectangular waves. However, the output pulse waveform must be adjusted depending on applications.

For such applications, a pulsed power source Vpulse need only be replaced by the first power source VDD1 in a circuit configuration in which the output stage power source is separate from the input stage power source, as with Embodiments 5 (FIG. 39), 8 (FIG. 45), 10 (FIG. 48) and 12 (FIG. 50).

In the case of FIGS. 52A to 52I, the amplitude of the pulsed power source Vpulse is given by VDD1−VSS. Further, the rise and fall rates and pulse lengths of the leading and trailing edges (transients) of the pulsed power source Vpulse are adjusted to suit the waveform required of the output pulse.

In this case, the buffer circuit 45 is bootstrapped as illustrated in FIG. 52G in synchronism with the leading edge of the pulsed power source Vpulse (FIG. 52F).

As a result, as shown in FIG. 52I, the waveform extracted from the pulsed power source Vpulse appears at the output node OUT as the output pulse during a period of time between the trailing edges of the set and reset signals.

Although, in the above embodiments, a description has been given of the buffer circuits which include only NMOS thin film transistors, it goes without saying that these embodiments are also applicable to a buffer circuit which includes only PMOS thin film transistors.

(C) Specific Examples

As described above, the proposed buffer circuit is applicable to a variety of applications.

Here, specific driving techniques required for a display panel will be described below taking an organic EL panel as an example.

Today's display panels must provide higher resolution and be rotatable to portrait orientation. In response to these requirements, the processing time which can be assigned per horizontal scan period tends to become shorter, thus making it difficult to complete all necessary operations within one horizontal scan period.

FIGS. 53A and 53B illustrate a driving example in which the threshold correction operation is performed a plurality of times (three times in this case) per field period. It should be noted that FIGS. 53A and 53B illustrate examples of waveforms when the subpixel 11 includes only NMOS thin film transistors.

For example, a total of four control pulses must be supplied to the write control line WSL during three horizontal scan periods (FIG. 53A).

Further, control pulses must be supplied to the lighting control line LSL during one field period, except for the non-lighting periods, so that the subpixel 11 lights up and goes out a plurality of times per field period (FIG. 53B).

It should be noted that the peak luminance of the display screen can be controlled by adjusting the total lighting period length (sum of the lengths of the lighting periods) per field period.

Further, the motion image response and flicker characteristic can be adjusted by controlling the ratio between the lighting and non-lighting period lengths and the timings at which the two periods appear. These characteristics are also affected by the inherent characteristics of the display panel and the nature of the displayed content. For this reason, the output widths and timings of the control pulses must be individually adjustable.

In the description given below, specific configurations of the control line drive section which must meet these requirements will be described.

Figure 54B:
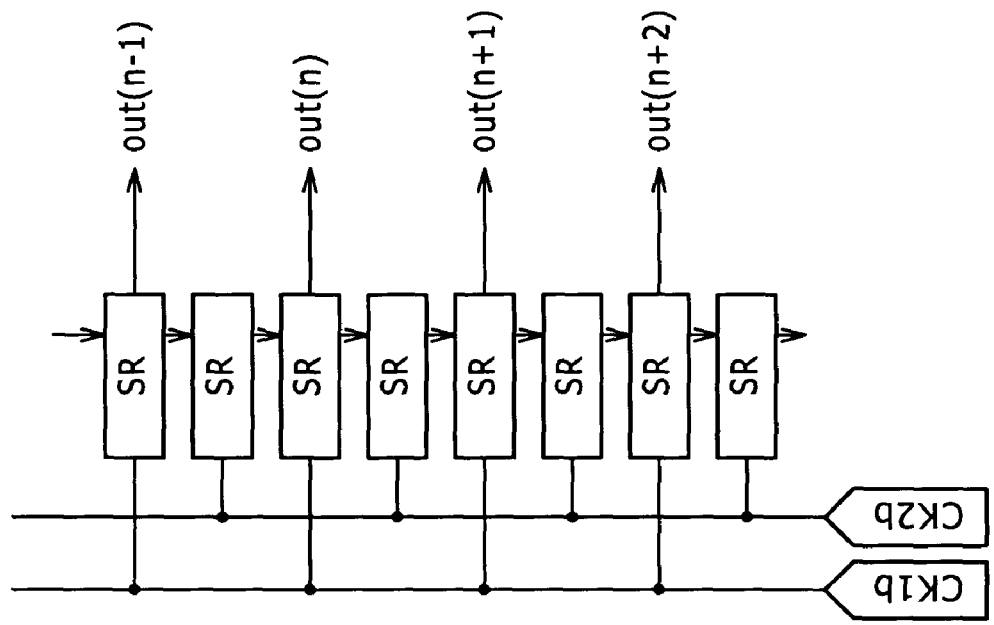
FIGS. 54A and 54B are diagrams illustrating examples of the scanner structure.
Figure 54A:
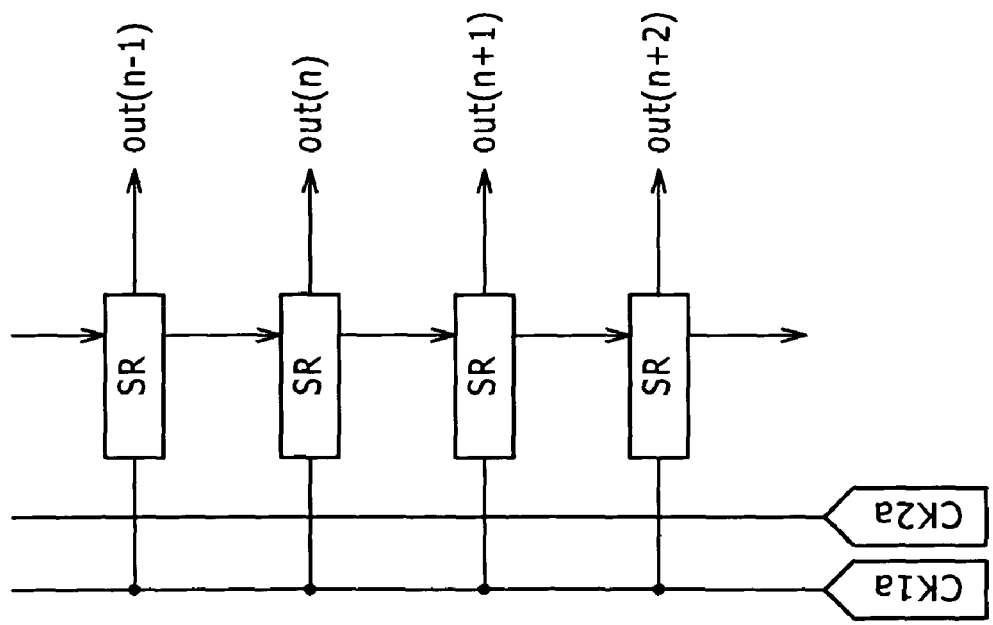

First, FIGS. 54A and 54B illustrate configuration examples of the scanner adapted to supply the set and reset signals. FIGS. 55A1 to 55B6 illustrate an associated driving example. It should be noted that FIGS. 55A1 to 55B6 assume that the destination circuit includes only NMOS thin film transistors. Therefore, if the destination circuit includes only PMOS thin film transistors, the polarity is opposite.

FIG. 54A illustrates a typical configuration example of the scanner. This scanner uses two shift clocks CK1*a* and CK2*a*.

The shift clock CK1*a* is a control pulse which rises to high level, for example, only in the odd-numbered horizontal scan periods, as illustrated in FIG. 55A1. In contrast, the shift clock CK2*a* is a control pulse which rises to high level, for example, only in the even-numbered horizontal scan periods, as illustrated in FIG. 55A2.

Figure 6:
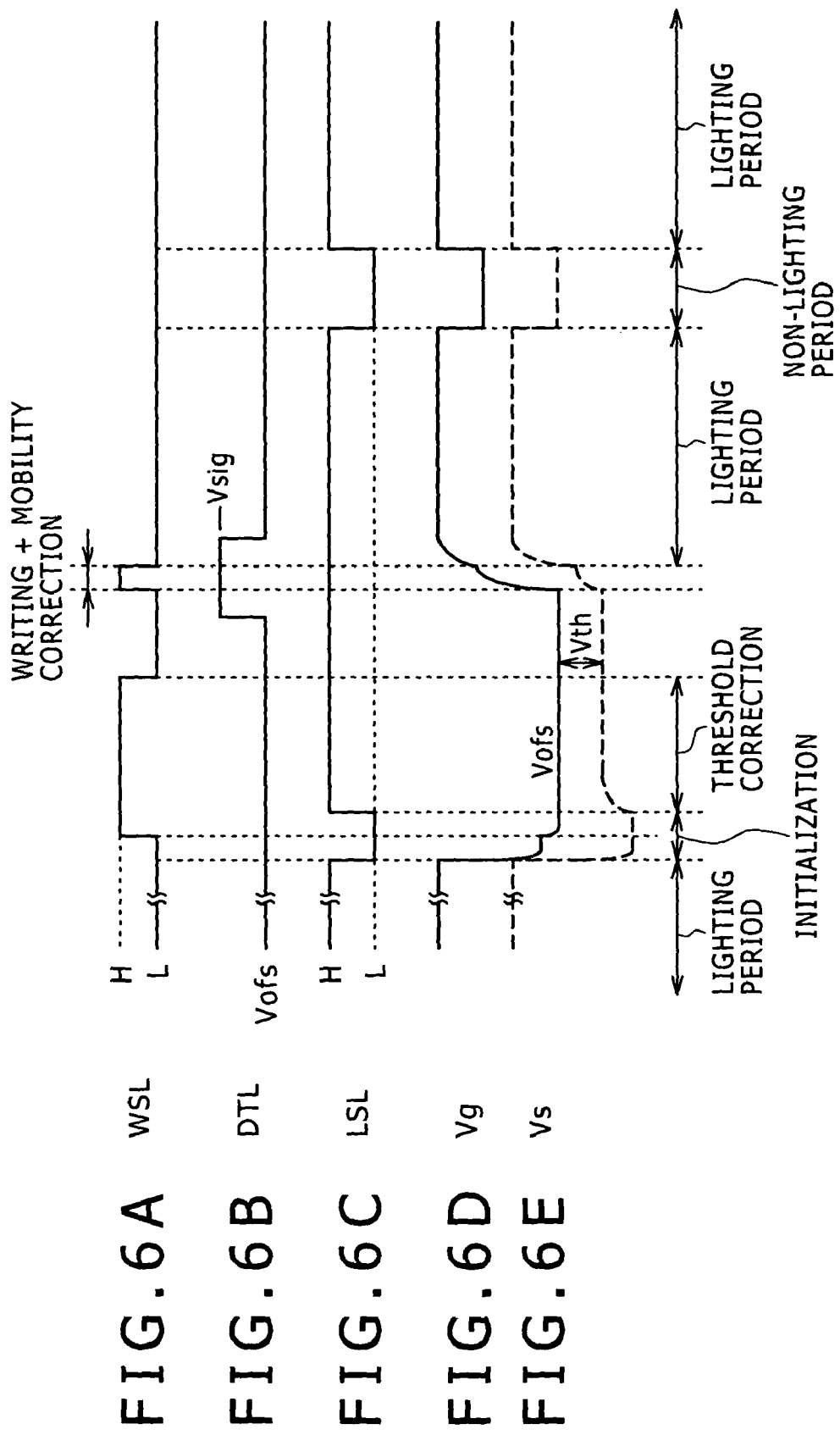
Figure 7:
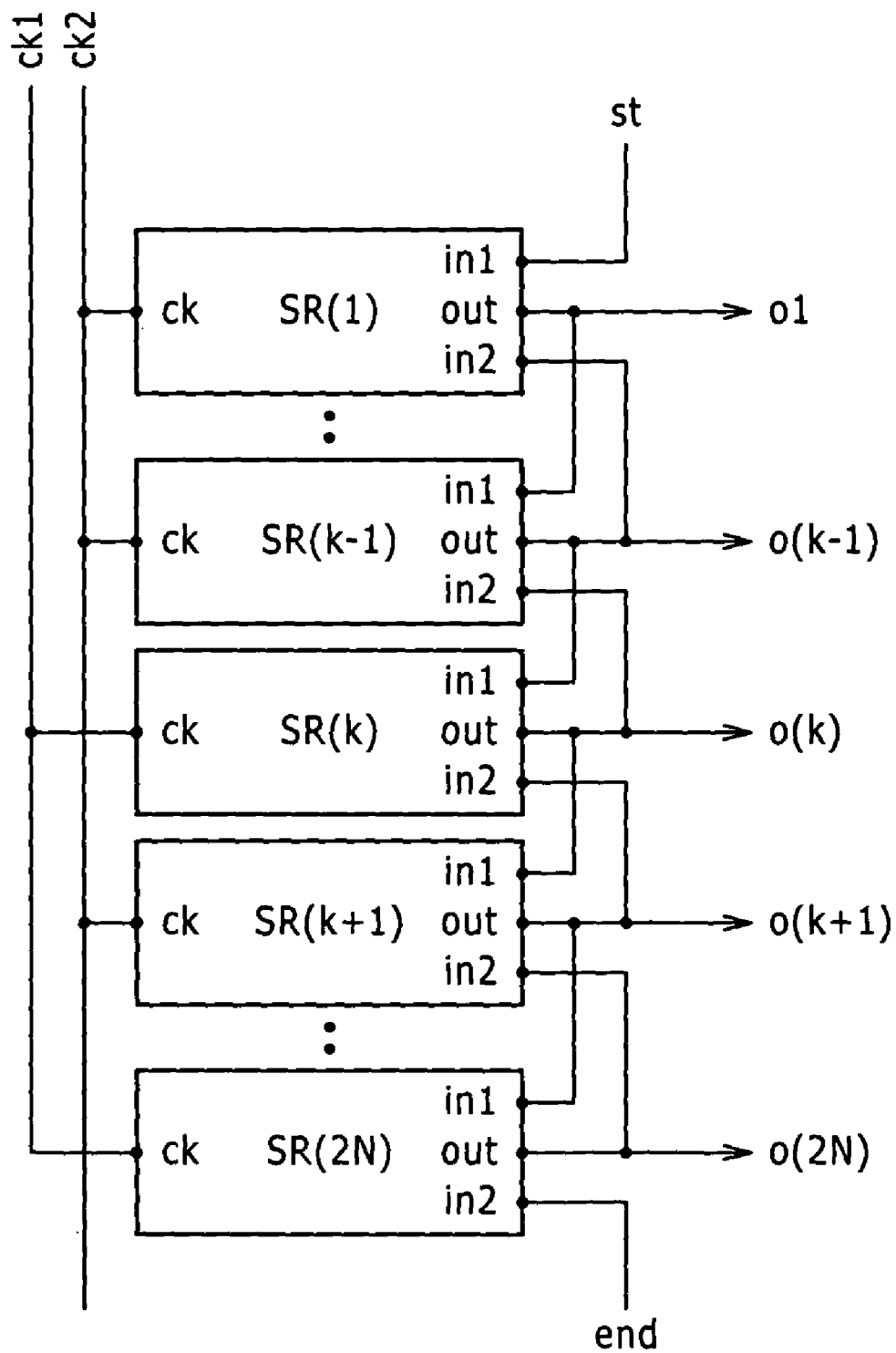
FIG. 7 is a diagram illustrating a circuit example of a shift register (scanner)
Figure 8:
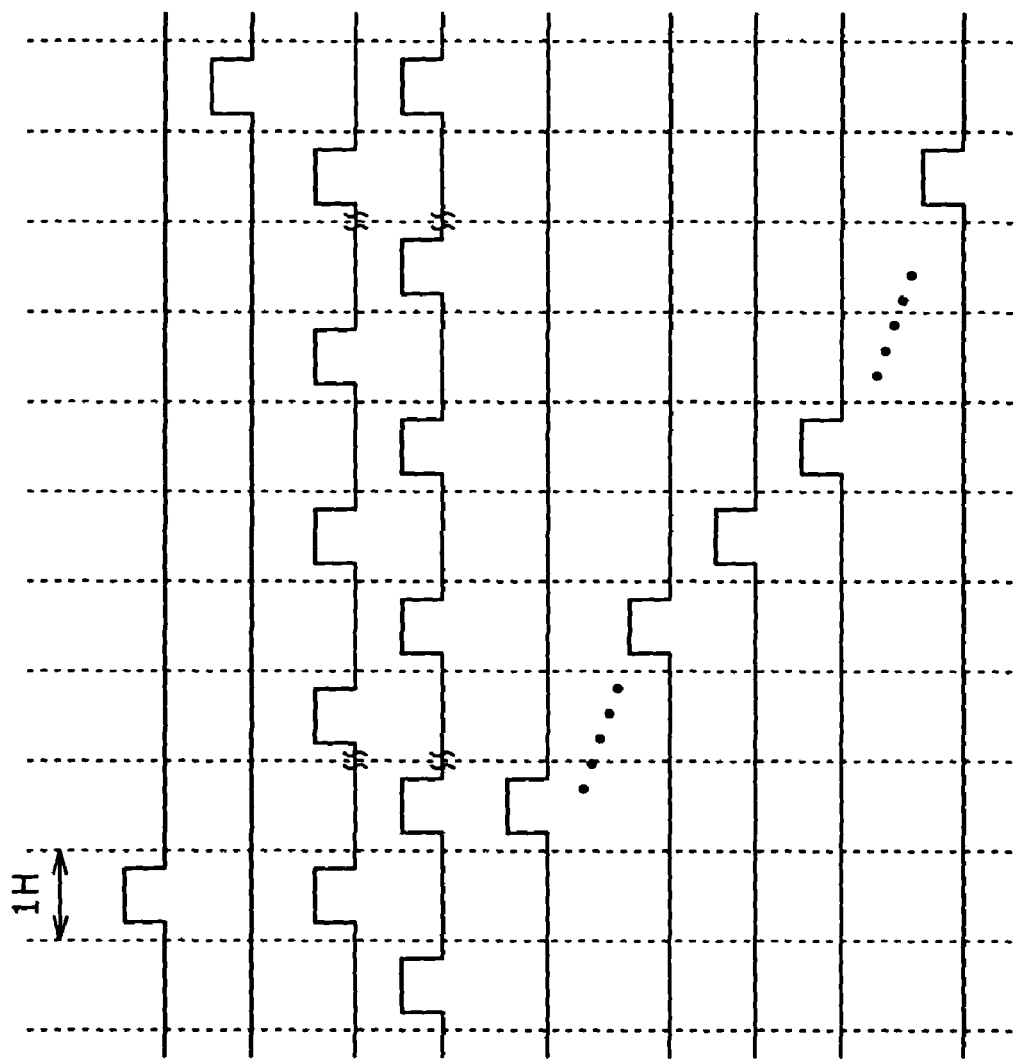
FIGS. 8A to 8I are a diagram illustrating the driving waveforms of the shift register (scanner) (NMOS)
Figure 9:
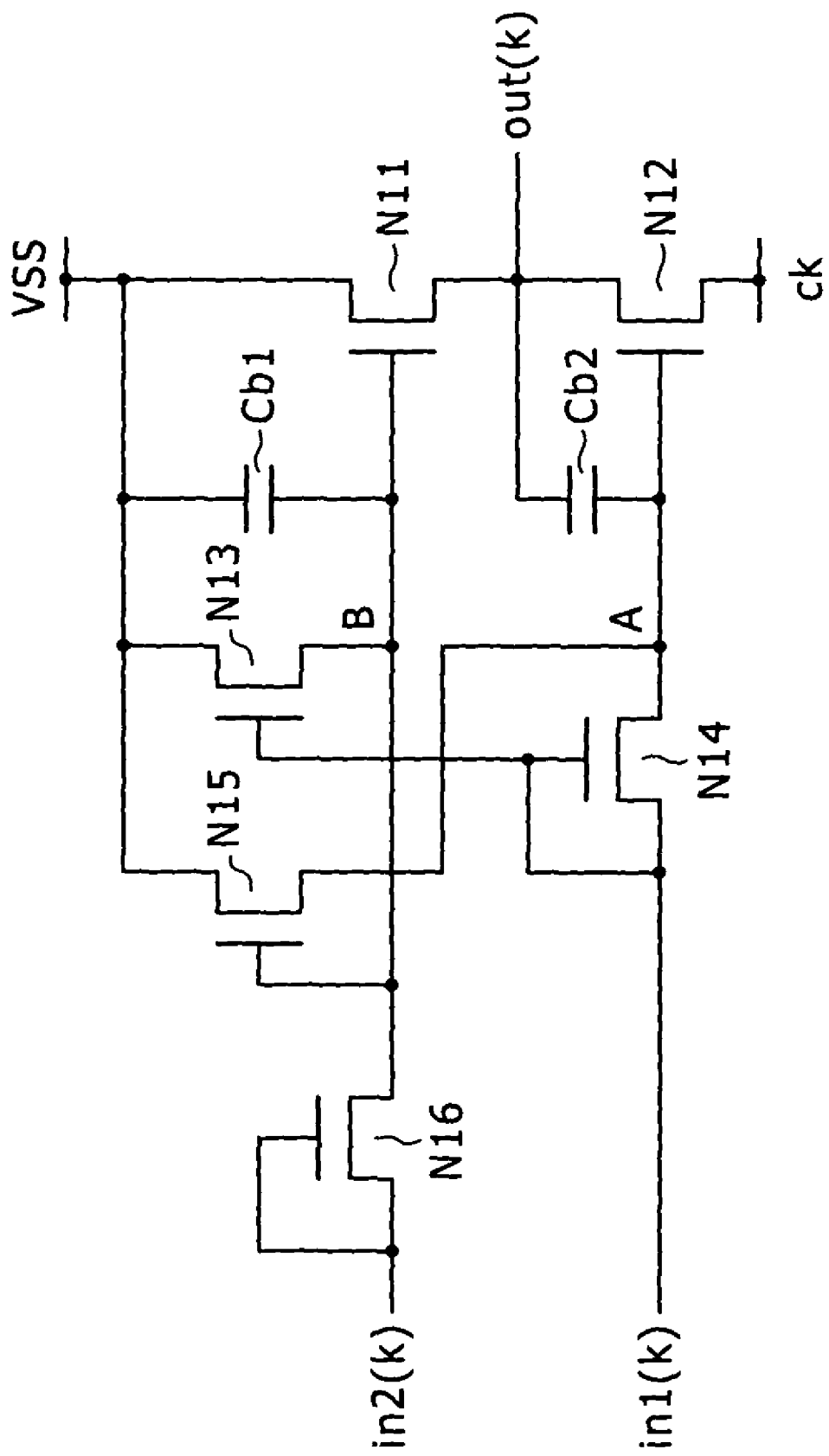
FIG. 9 is a diagram for describing an example of the internal circuit of a register stage having a bootstrapping capability.
Figure 10:
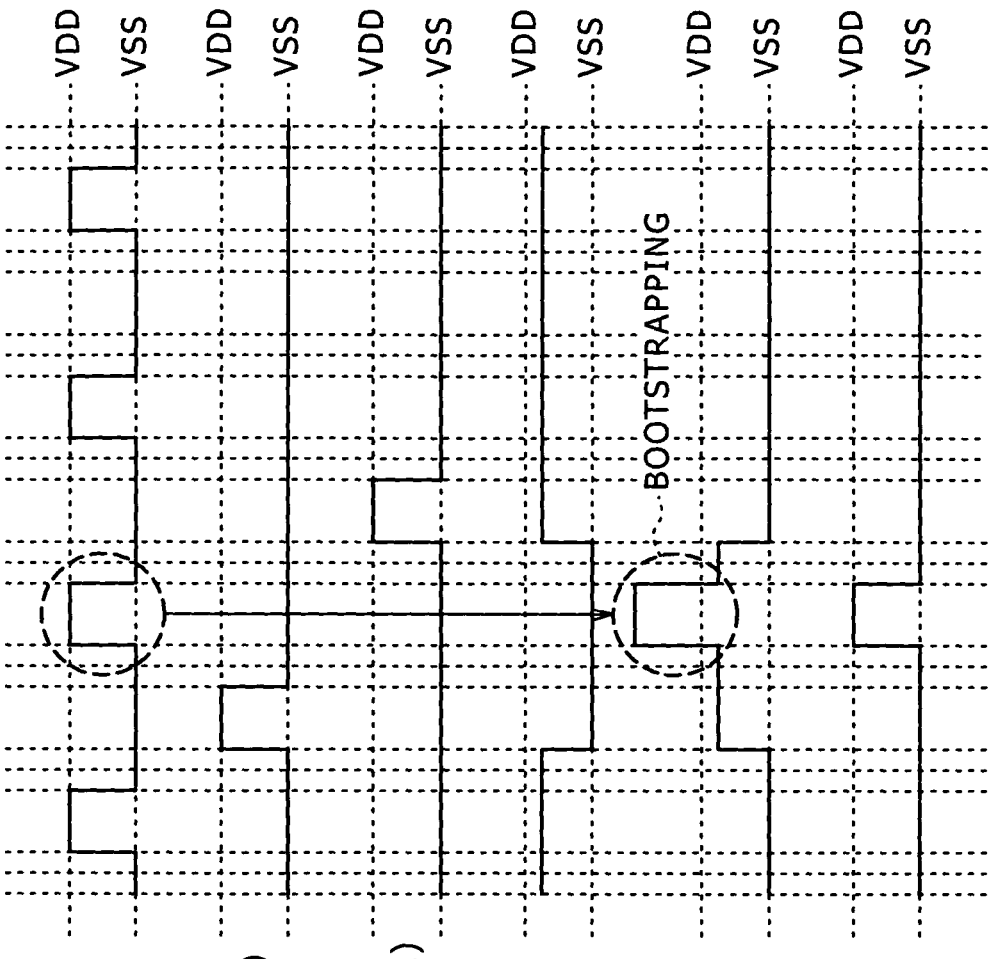
FIGS. 10A to 10F are a diagram for describing the input and output operations of the register stage using the bootstrapping action.
Figure 11:
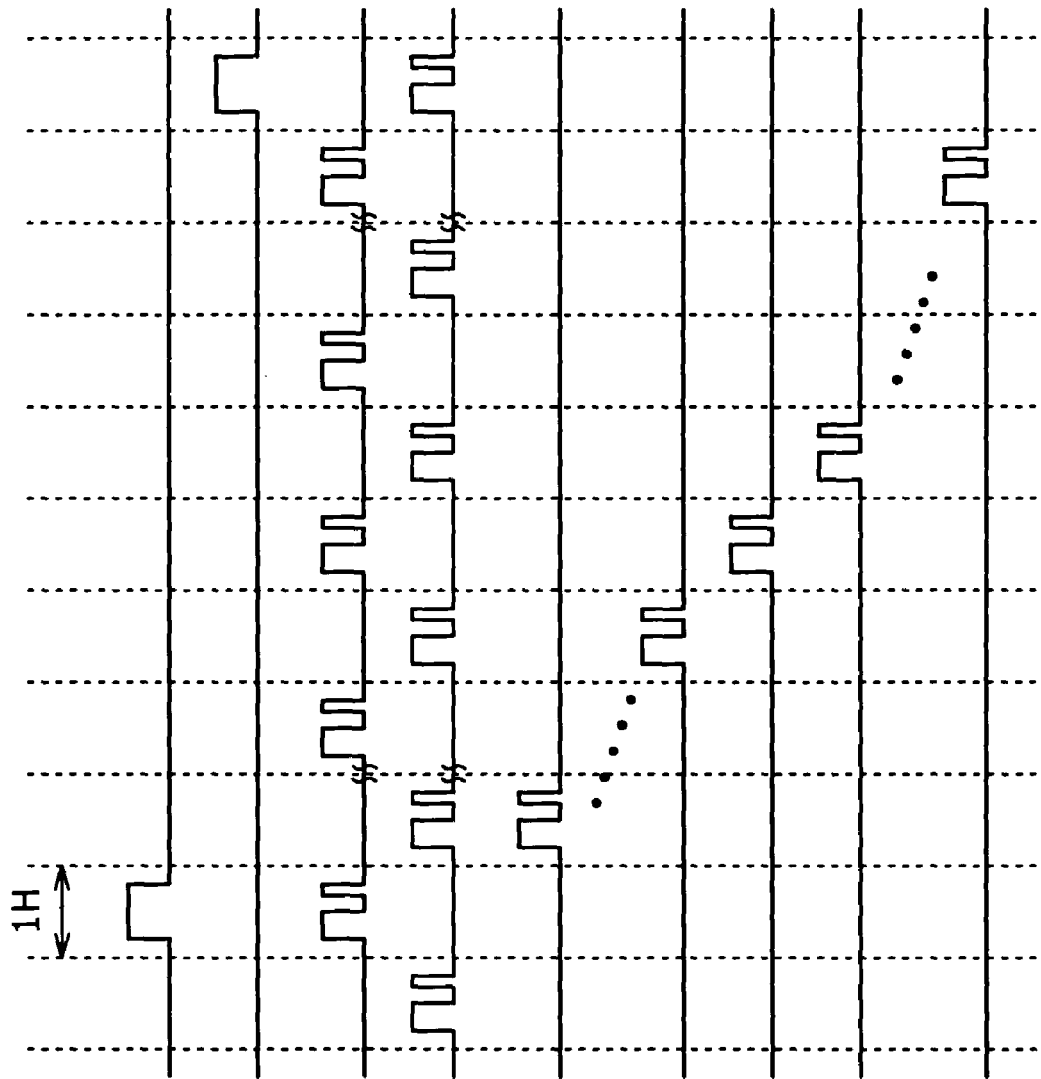
FIGS. 11A to 11I are a diagram for describing the relationship between the shapes of input clock pulses and the pulse shifting of the shift register.
Figure 12:
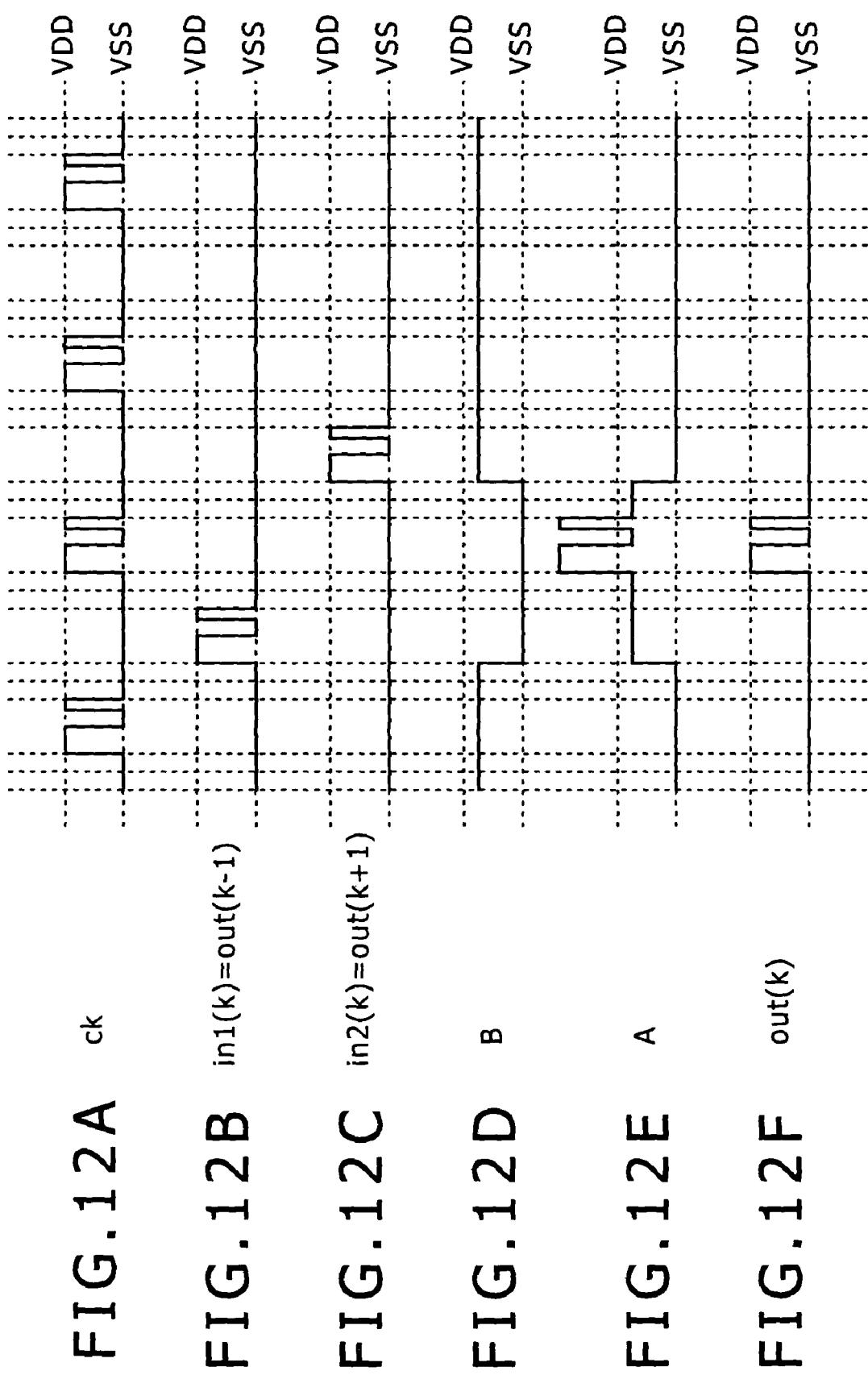
FIGS. 12A to 12F are a diagram for describing the input and output operations of the register stage using the bootstrapping action.
Figure 13:
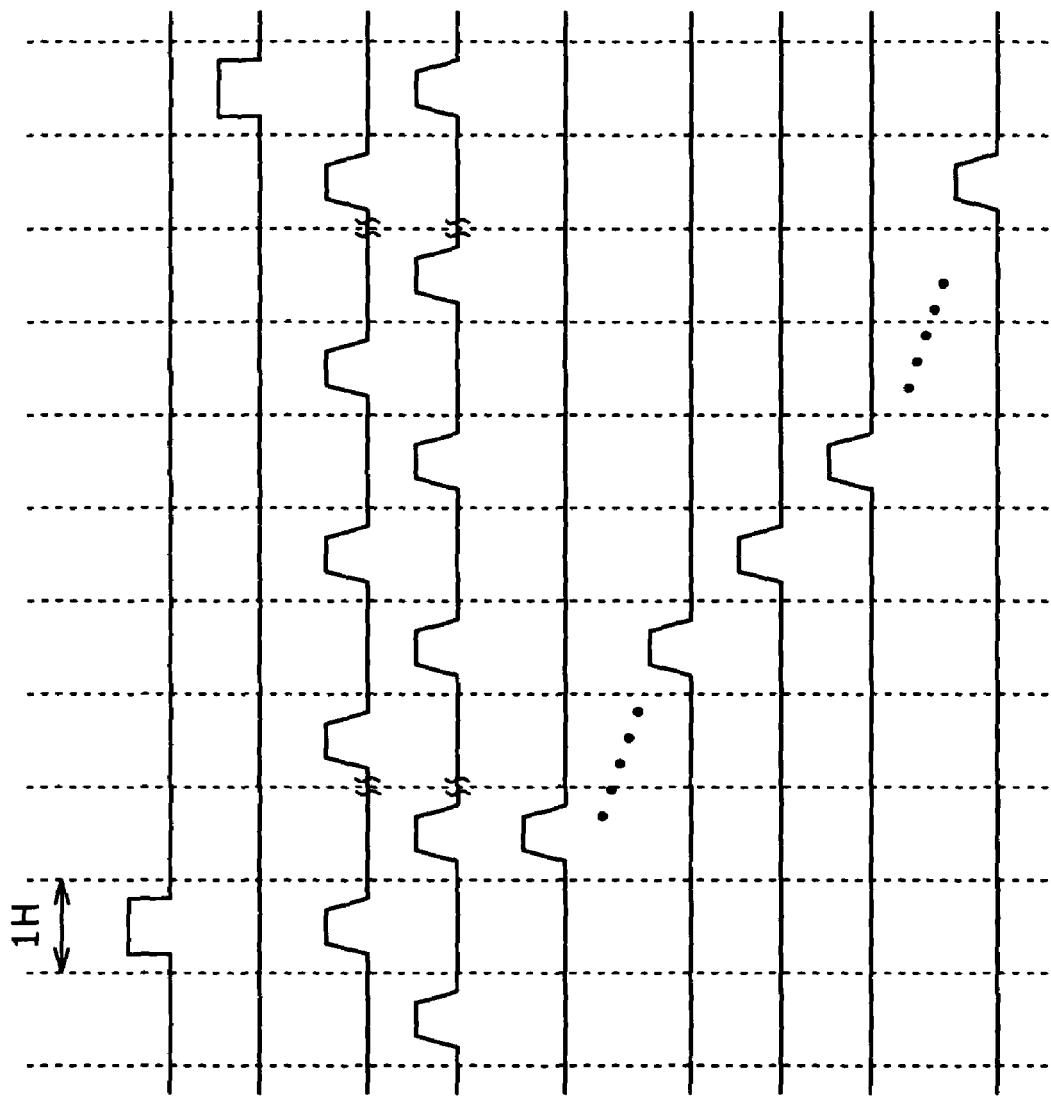
FIGS. 13A to 13I are a diagram for describing the relationship between the shapes of the input clock pulses and the pulse shifting of the shift register.
Figure 14:
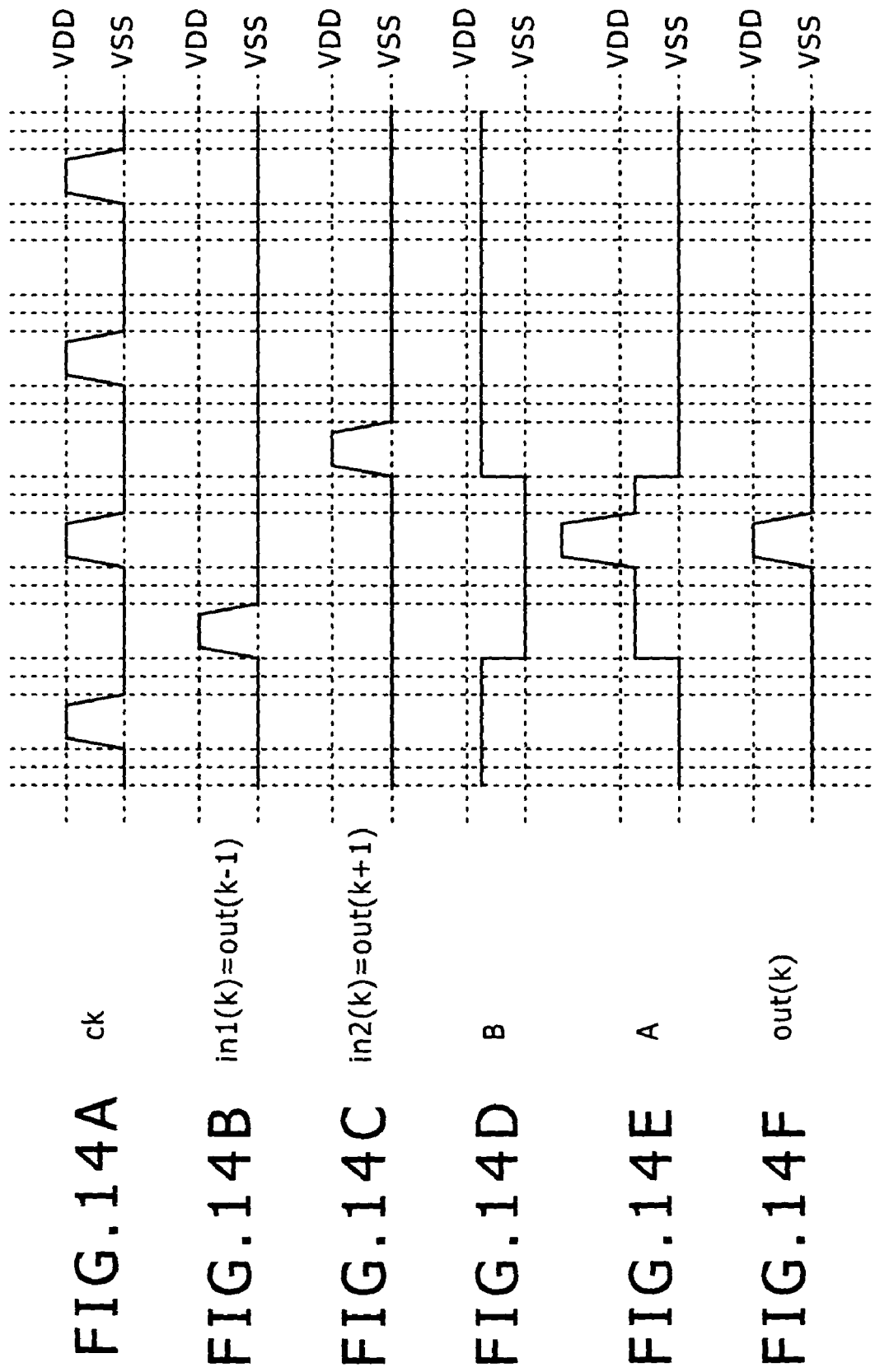
FIGS. 14A to 14F are a diagram for describing the input and output operations of the register stage using the bootstrapping action.
Figure 15:
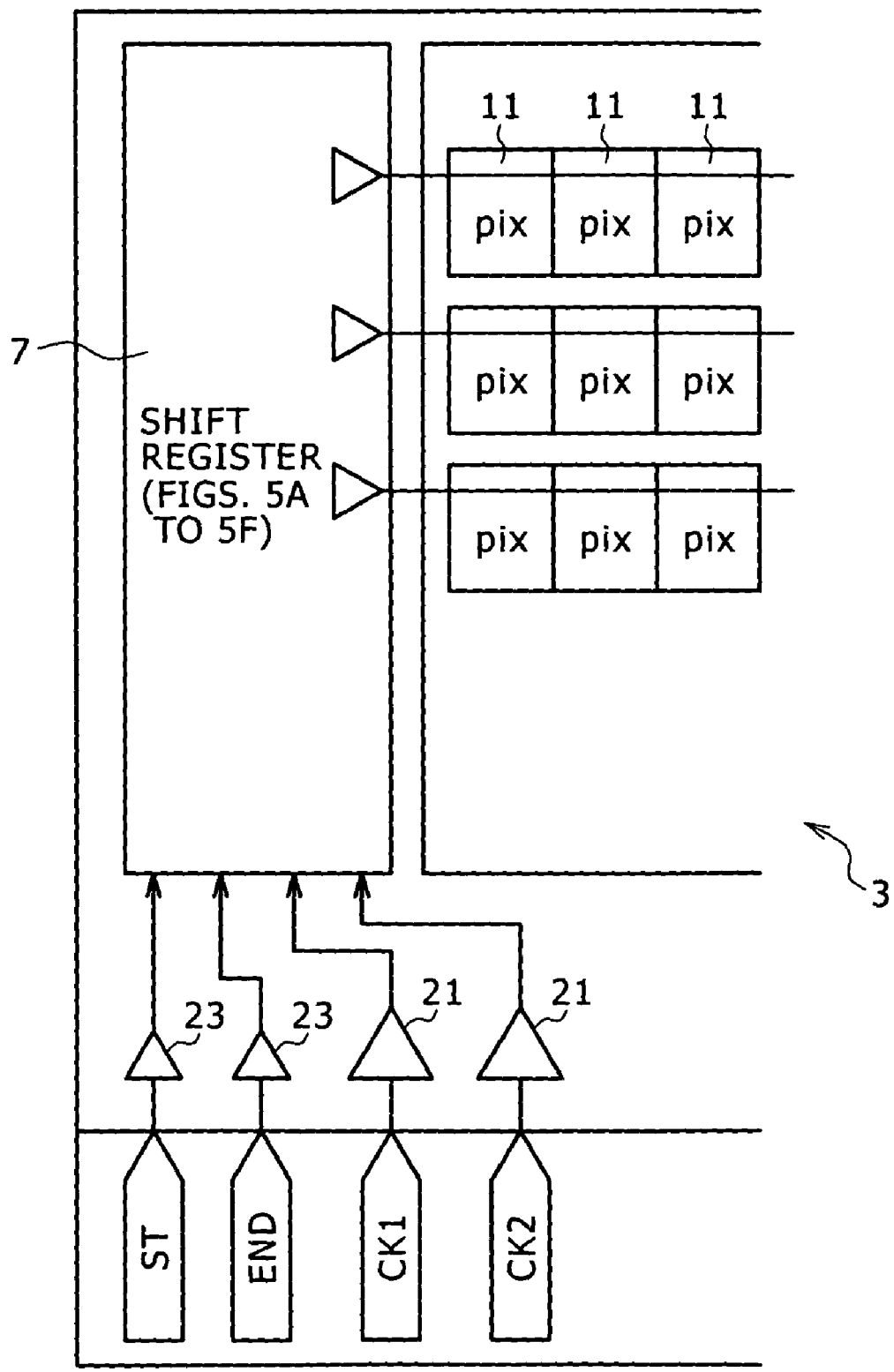
FIG. 15 is a diagram for describing the structure of a panel when an existing drive circuit is used.

In the case of this configuration, the scanner shifts the pulse to the next stage every horizontal scan period. However, when we focus on one of the output terminals (register stages SR), a control pulse can be output only every other horizontal scan period as illustrated in FIGS. 55A3 to 55A6.

Therefore, the scanner illustrated in FIG. 54A cannot be used when the control pulses must be continuously supplied to a single control line over a plurality of horizontal scan periods.

Therefore, the scanner configured as illustrated in FIG. 54B is provided. This scanner also uses two shift clocks CK1*b* and CK2*b*. However, this scanner externally outputs only the outputs of the register stages SR to which the shift clock CK1*b* is fed. The scanner uses the register stages SR to which the shift clock CK2*b* is fed in order to shift the pulse therein.

Here, the shift clocks CK1*b* and CK2*b* rise to high level every horizontal scan period as illustrated in FIGS. 55B1 and 55B2.

In the case of this configuration, the scanner can shift the pulse two stages per horizontal scan period thanks to the shift clocks CK1*b* and CK2*b*. As a result, when we focus on one output terminal, a control pulse can be output from that terminal every horizontal scan period as illustrated in FIGS. 55B3 to 55B6.

It should be noted that FIG. 54B assumes that the control pulses are continuously output over two horizontal scan periods. Therefore, the number of stages of the scanner must be adjusted according to the duration over which the control pulses are to be output. For example, in order to continuously output the control pulses over three horizontal scan periods, it is only necessary to provide three shift clocks CK having different phases from each other within a horizontal scan period and externally output the shift pulse as a control pulse every two other stages.

This type of scanner can be combined with one of the above buffer circuits to form the control line drive section.

Figure 56:
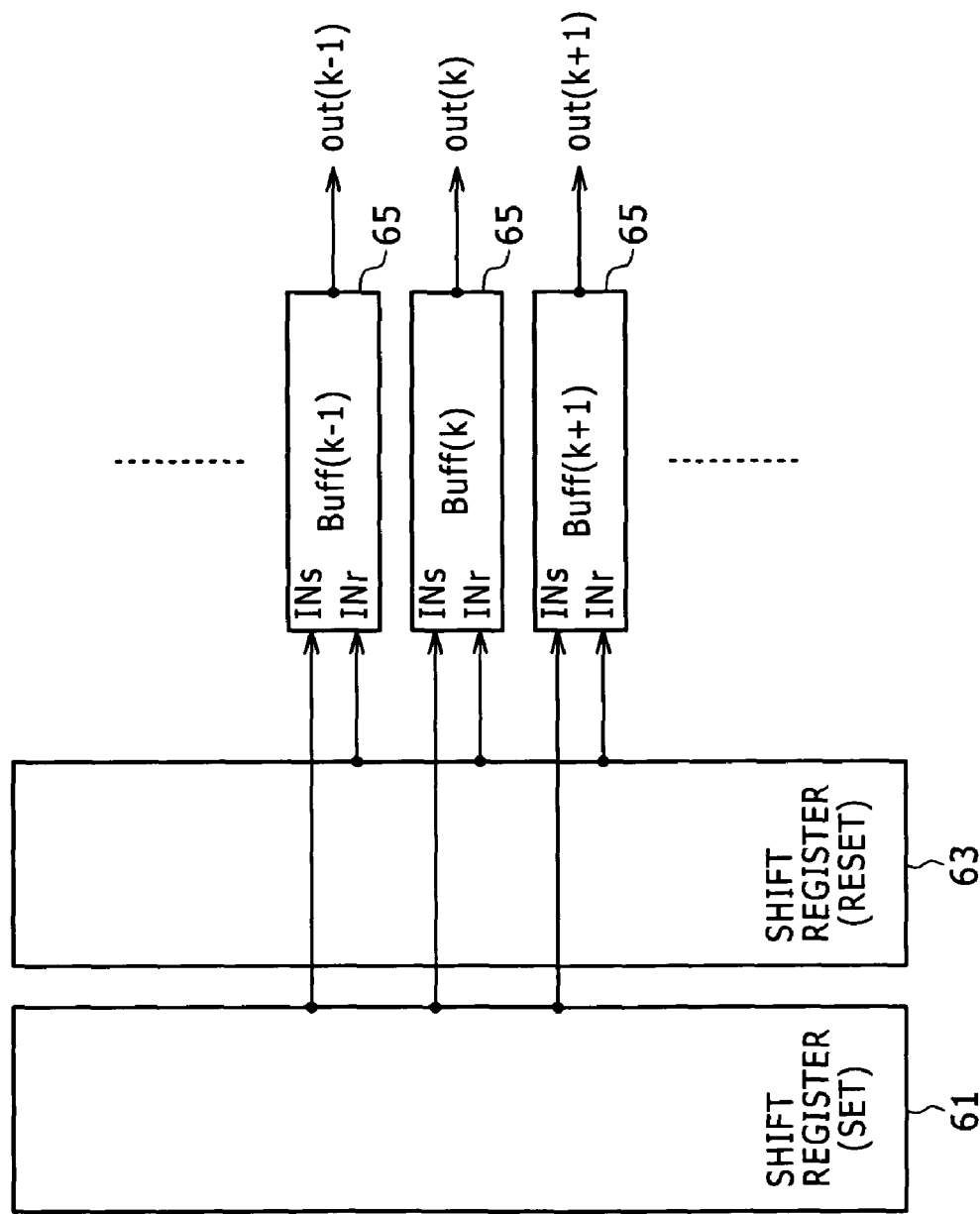
FIG. 56 is a diagram illustrating the circuit configuration of the control line drive section.

FIG. 56 illustrates a circuit example of the control line drive section. FIGS. 57A to 57I illustrate examples of the drive pulses. It should be noted that FIGS. 57A to 57I assume that the destination circuit includes only NMOS thin film transistors. Therefore, if the destination circuit includes only PMOS thin film transistors, the polarity is opposite.

Figure 57:
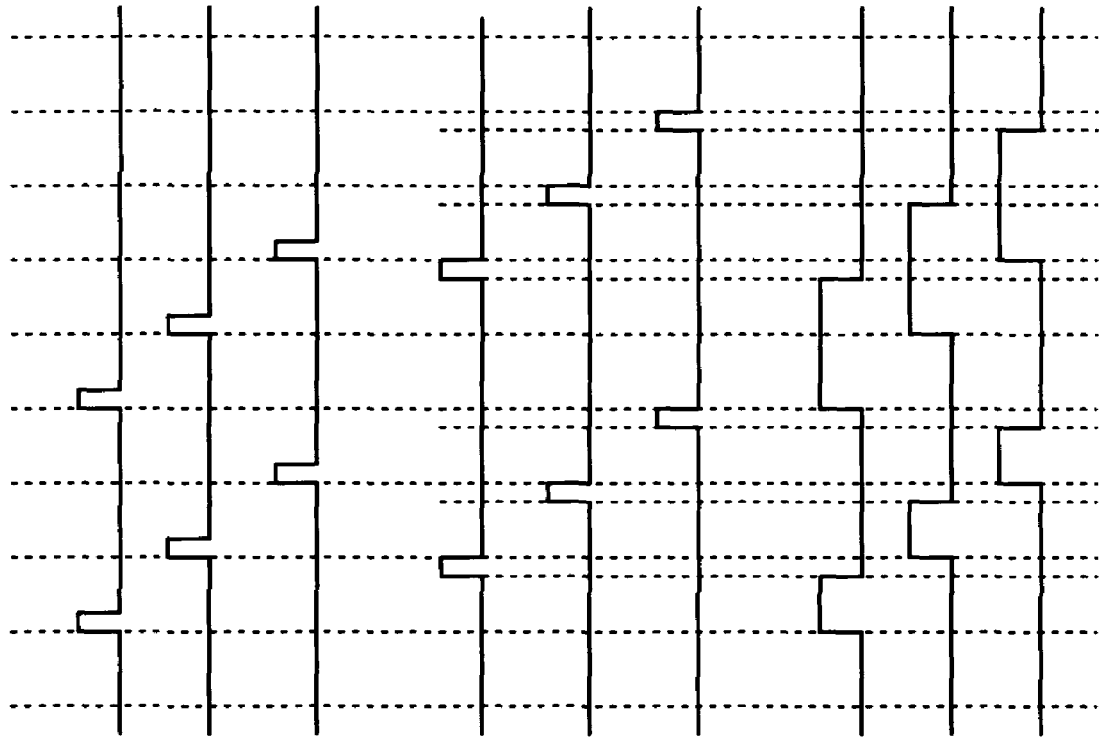
FIGS. 57A to 57I are a diagram illustrating examples of drive pulses of the control line drive section shown in FIG. 56.

The control line drive section illustrated in FIG. 56 includes a scanner 61 adapted to supply the set signal, a scanner 63 adapted to supply the reset signal and buffer circuits 65. One of the two types of scanners described above is selectively used as the scanners 61 and 63. The choice between the two types is made according to the output timings of the set signals (FIGS. 57A to 57C) and reset signals (FIGS. 57D to 57F) required for the pulse widths and intervals at which to output the pulses (FIGS. 57G to 57I).

It should be noted that the control line drive section illustrated in FIG. 56 is used to produce only rectangular output pulses as illustrated in FIG. 53. That is, this control line drive section is preferred for controlling the lighting control line LSL. Incidentally, if the subpixel 11 is configured as illustrated in FIG. 2, it is only necessary to use one of the buffer circuits configured as illustrated in Embodiments 1 to 4. Further, if the subpixel 11 is configured as illustrated in FIG. 3, it is only necessary to use one of the buffer circuits configured as illustrated in Embodiments 5 to 13. It should be noted that the type of buffer circuit used need only be selected according to the number of timings to be controlled.

Here, as far as the lighting periods are concerned, the period of time from the input of the set signal to that of the reset signal corresponds to the lighting time of the display panel (organic EL element). The switching between the lighting and non-lighting periods may be made once or a plurality of times per field period. As described above, the appropriate number of times and lighting time should be selected to provide improved motion image response and flicker characteristic.

Figure 58:
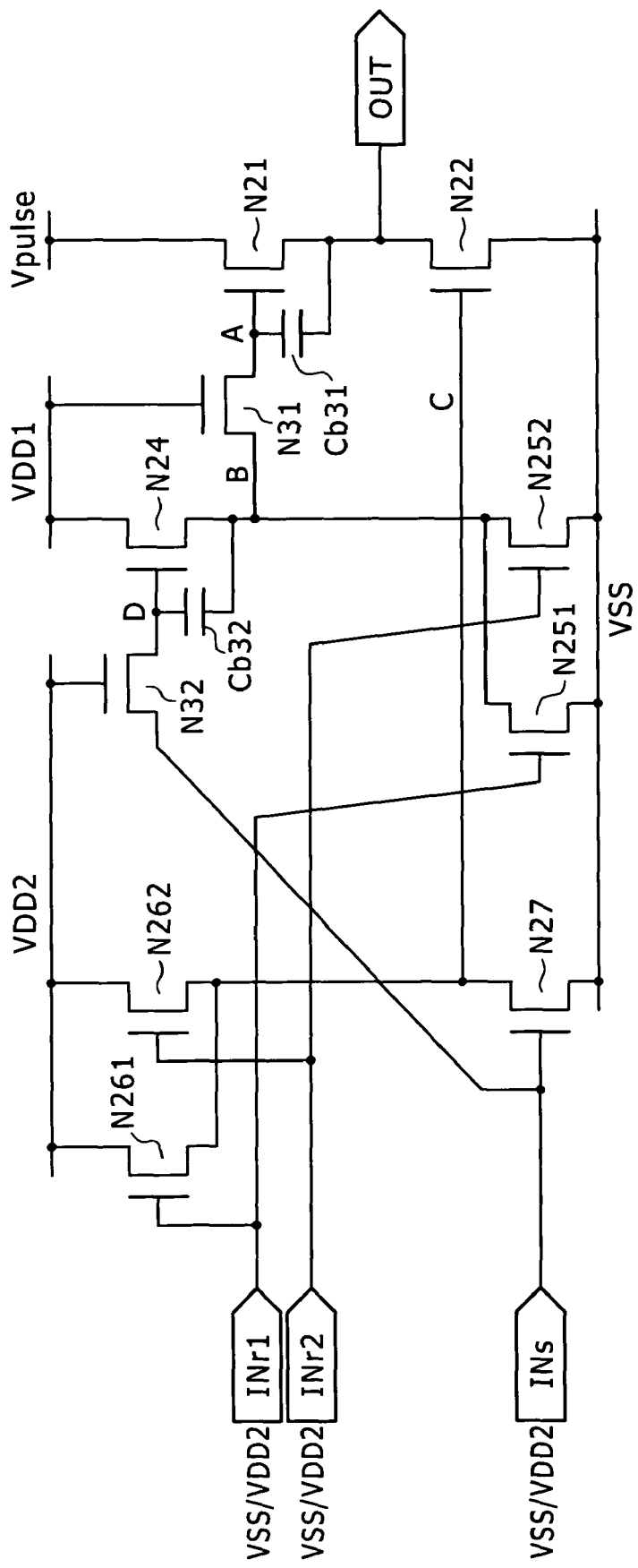
FIG. 58 is a diagram illustrating a specific example of the buffer circuit.

FIG. 58 illustrates a preferred example of the buffer circuit incorporated in the control line drive section adapted to drive the write control line WSL. Driving the write control line WSL may require the continuous output of a control pulse and the control of the pulse waveform, as illustrated in FIG. 53A.

FIG. 58 illustrates a circuit example when there are three supply timings, i.e., one supply timing of the set signal and two supply timings of the reset signal. It should be noted that the supply timings of the reset signal are given by a parallel circuit. Further, Vpulse is used to control the output pulse waveforms. Incidentally, the amplitude of Vpulse is given by VSS/VDD1. Still further, the circuit illustrated in FIG. 58 incorporates the bootstrapping capability.

Figure 59:
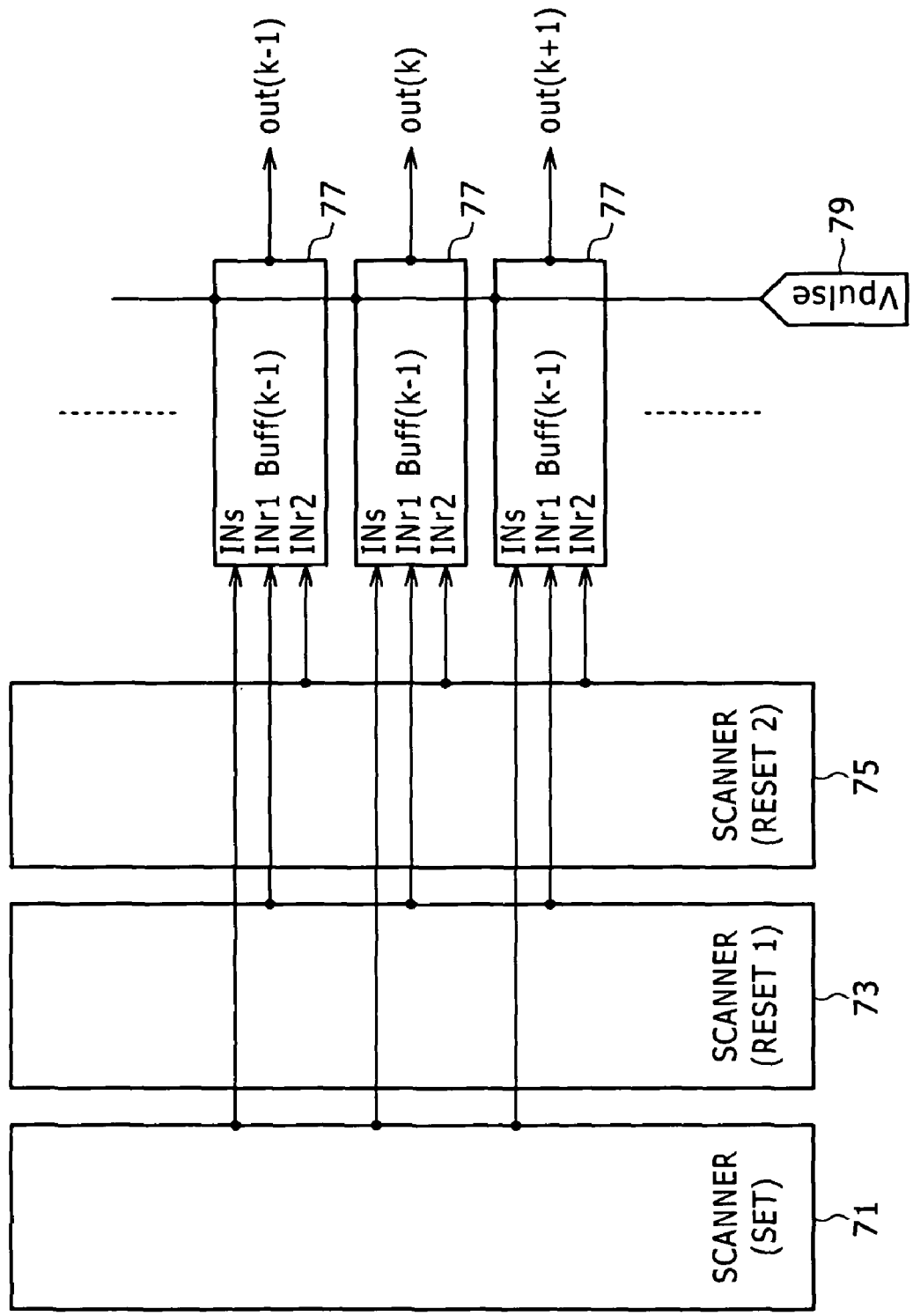
FIG. 59 is a diagram illustrating a system example of the control line drive section using the buffer circuit shown in FIG. 58.
Figure 60:
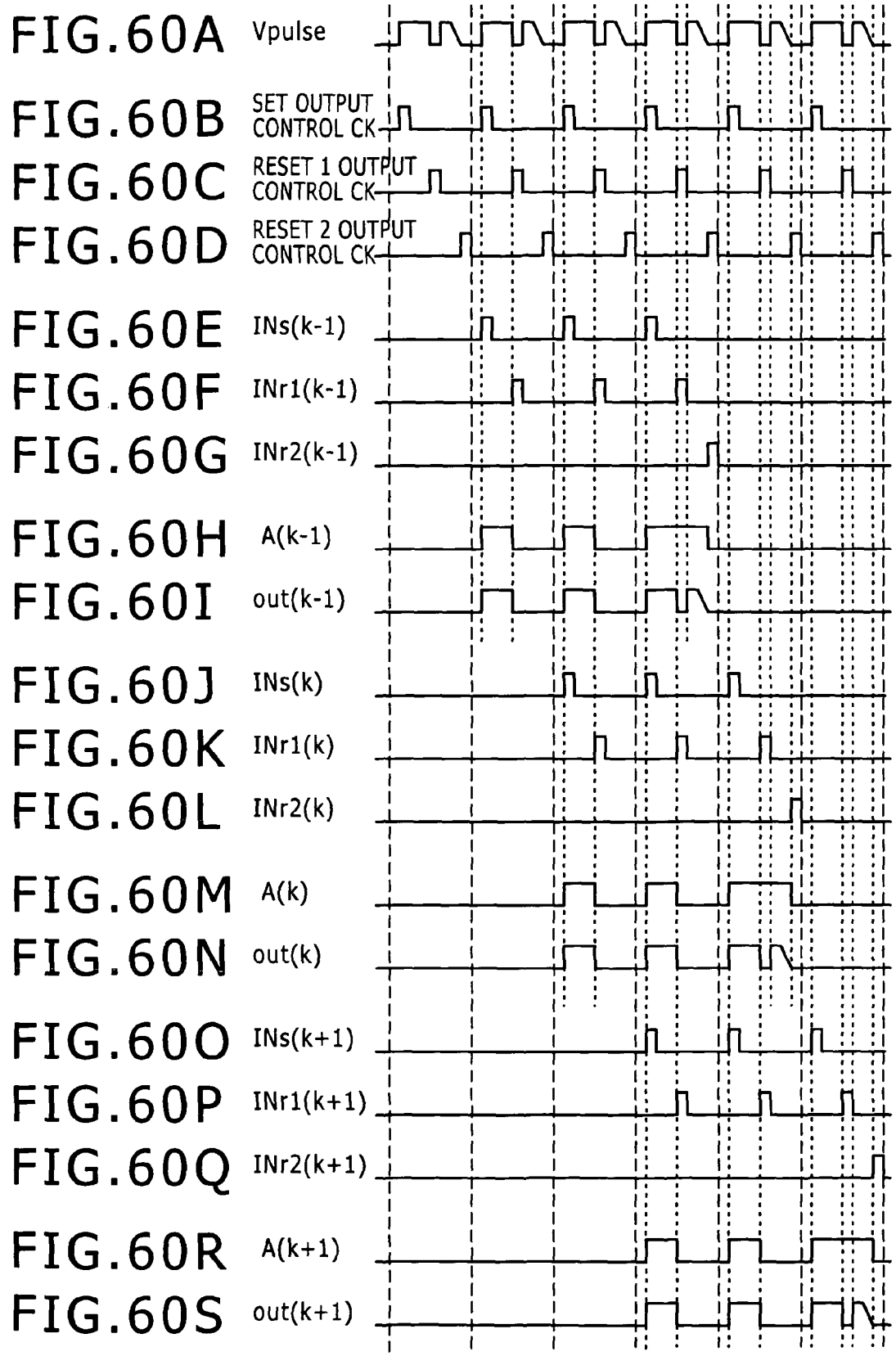
FIGS. 60A to 60S are a diagram illustrating the drive pulses of the control line drive section shown in FIG. 59.

FIG. 59 illustrates a circuit example of the control line drive section using the buffer circuit (FIG. 58). FIGS. 60A to 60S illustrate examples of the driving waveforms thereof. It should be noted that the examples of driving waveforms illustrated in FIGS. 60A to 60S assume that the scanner configured as illustrated in FIG. 54B is used as scanners 71, 73 and 75. Therefore, if the scanner configured as illustrated in FIG. 54A is used, these waveforms are output every other horizontal scan period.

The buffer circuits 77 each have a set signal input terminal INs, reset signal input terminals INr1 and INr2 and a pulse input terminal. Vpulse is applied to the pulse input terminal from a pulsed power source 79.

Incidentally, FIG. 60A illustrates the waveform of Vpulse which corresponds to the waveform over a period of time which combines the third threshold correction period and signal potential writing period (including the mobility correction period) shown in FIG. 53A.

Vpulse has two high levels, one adapted to provide a threshold correction period in the first half of the horizontal scan period and another adapted to provide a signal potential writing period in the second half of the horizontal scan period. This waveform is repeatedly supplied from the pulsed power source 79 every horizontal scan period.

FIGS. 60B to 60D illustrate the control clocks adapted to provide the output timings to the scanners 71, 73 and 75. These clocks correspond to the clock CK1b shown in FIG. 54B.

FIGS. 60E to 60I illustrate the driving waveforms of the buffer circuit 77 at the k−1th stage. It should be noted that the waveform of the node A potential shown in FIG. 60H corresponds to the gate potential of the thin film transistor N21 shown in FIG. 58.

FIGS. 60J to 60N illustrate the driving waveforms of the buffer circuit 77 at the kth stage. Similarly, the waveform of the node A potential shown in FIG. 60M also corresponds to the gate potential of the thin film transistor N21 shown in FIG. 58.

FIGS. 60O to 60S illustrate the driving waveforms of the buffer circuit 77 at the k+1th stage. It should be noted that the waveform of the node A potential shown in FIG. 60R corresponds to the gate potential of the thin film transistor N21 shown in FIG. 58.

As illustrated in FIGS. 60H, 60M and 60R, the waveforms formed by the set and reset signals are rectangular.

Actually, the output waveform corresponding to the first and second horizontal scan periods shown in FIG. 53A is achieved by the output pulse. This waveform is generated by two waveforms being at high level at the same time. One of these waveforms is that formed by the set signal and reset signal 1. Another waveform is Vpulse.

On the other hand, the output waveform corresponding to the third horizontal scan period shown in FIG. 53A is achieved by the output pulse. This waveform is generated by two waveforms being at high level at the same time. One of these waveforms is that formed by the set signal and reset signal 2. Another waveform is Vpulse.

It should be noted, however, that the circuit configuration described above requires three scanners and leads to a larger layout area.

For this reason, a description will be given below of a circuit example and its driving example which require only a small layout area.

Figure 61:
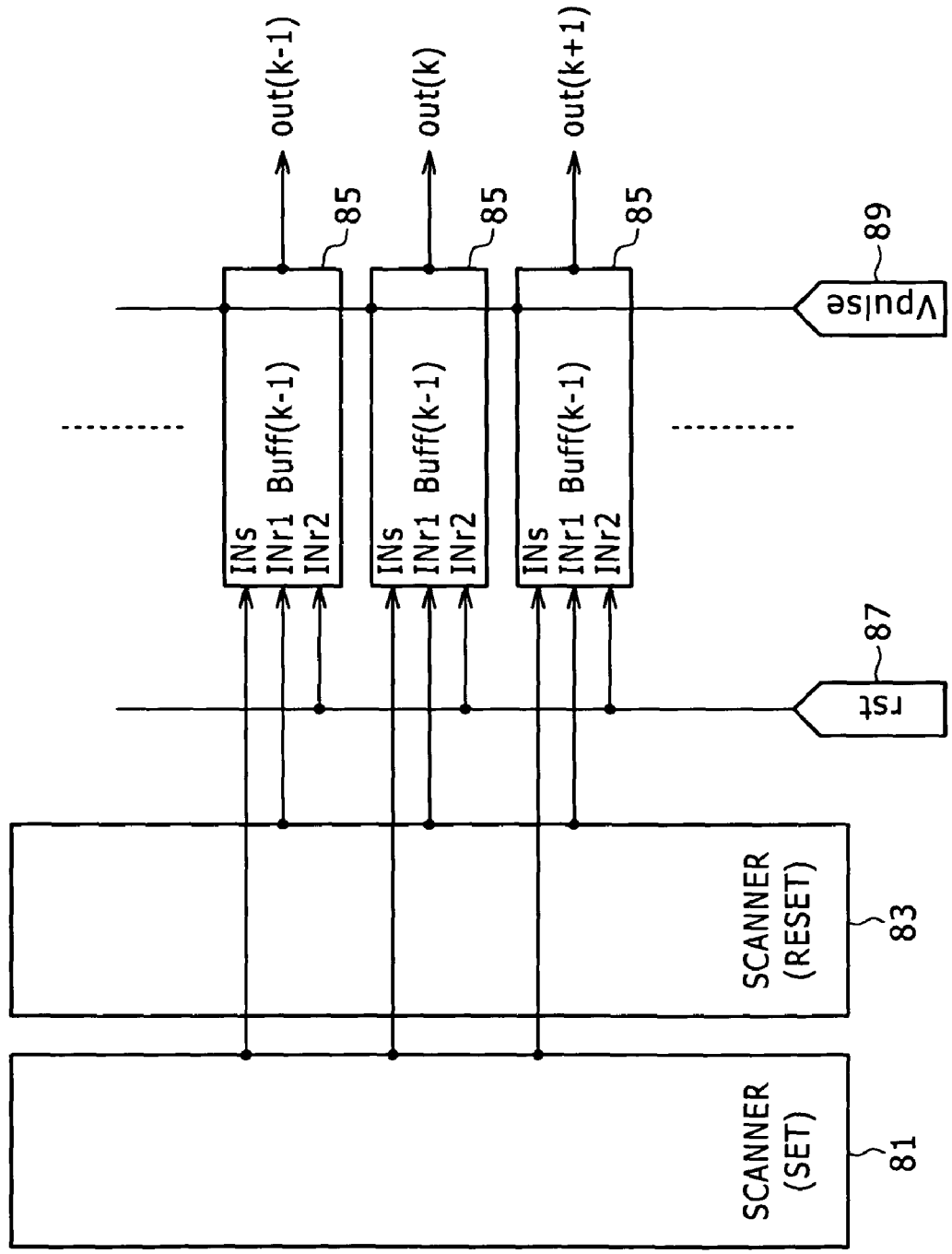
FIG. 61 is a diagram illustrating another system example of the control line drive section using the buffer circuit shown in FIG. 58.
Figure 62:
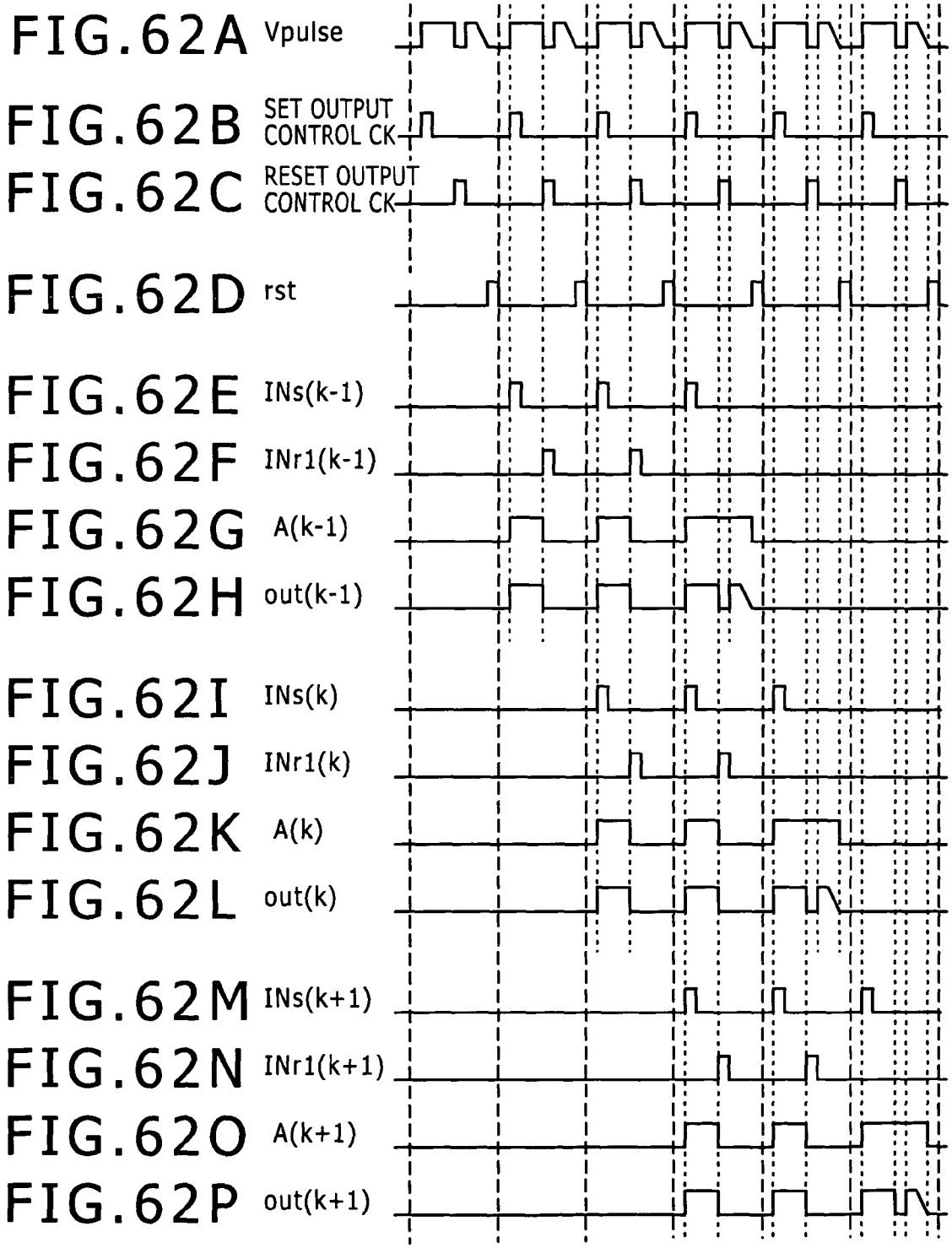
FIGS. 62A to 62P are a diagram illustrating the drive pulses of the control line drive section shown in FIG. 61.

FIG. 61 illustrates other circuit example of the control line drive section. FIGS. 62A to 62P illustrate examples of drive pulses. The control line drive section shown in FIG. 61 includes a scanner 81 adapted to supply the set signal, a scanner 83 adapted to supply the reset signal, buffer circuits 85, reset pulse source 87 and output pulse source 89.

The example illustrated in FIG. 61 provides a simpler circuit by taking advantage of the following. That is, the reset signal is fed only over two horizontal scan periods. No pulse is generated even when a reset pulse rst is fed during a horizontal scan period in which the set signal is not fed. If the reset signal and reset pulse rst are fed within the same horizontal scan period, the reset signal takes precedence over the reset pulse rst. As a result, the reset pulse rst does not have any effect on the pulse generation.

Incidentally, FIG. 62A illustrates the waveform of Vpulse corresponding to the third threshold correction period and signal potential writing period (including the mobility correction period) shown in FIG. 53A.

FIGS. 62B and 62C illustrate the control clocks adapted to provide the output timings to the scanners 81 and 83. These clocks correspond to the clock CK1$b$ shown in FIG. 54B.

FIG. 62D illustrates the waveform of the reset pulse rst output from the reset pulse source 87. Being a pulse source, the reset pulse source 87 outputs a pulse at the predetermined timing every horizontal scan period.

FIGS. 62E to 62H illustrate the driving waveforms of the buffer circuit 85 at the k−1th stage. It should be noted that the waveform of the node A potential shown in FIG. 62G corresponds to the gate potential of the thin film transistor N21 shown in FIG. 58.

FIGS. 62I to 62L illustrate the driving waveforms of the buffer circuit 85 at the kth stage. Similarly, the waveform of the node A potential shown in FIG. 62K also corresponds to the gate potential of the thin film transistor N21 shown in FIG. 58.

FIGS. 62M to 62P illustrate the driving waveforms of the buffer circuit 85 at the k+1th stage. It should be noted that the waveform of the node A potential shown in FIG. 62O corresponds to the gate potential of the thin film transistor N21 shown in FIG. 58.

As illustrated in FIGS. 62G, 62K and 62O, the waveforms formed by the set and reset signals are rectangular.

Actually, the output waveform corresponding to the first and second horizontal scan periods shown in FIG. 53A is achieved by the output pulse. This waveform is generated by two waveforms being at high level at the same time. One of these waveforms is that formed by the set and reset signals. Another waveform is Vpulse.

On the other hand, the output waveform corresponding to the third horizontal scan period shown in FIG. 53A is achieved by the output pulse. This waveform is generated by two waveforms being at high level at the same time. One of these waveforms is that formed by the set signal and reset pulse. Another waveform is Vpulse.

(D) Other Embodiments (D-1) Other Display Panels

The above embodiments were described assuming that the buffer circuit would be applied to an organic EL panel. The description was given based particularly on the assumption that the buffer circuit would be applied to the control line drive section adapted to shift the control pulses vertically.

However, the above buffer circuit is also applicable to the signal line drive section adapted to supply the timing at which to apply the signal potential Vsig to the signal line DTL.

Further, the drive circuit incorporating the above buffer circuit is applicable to display panels other than organic EL panels.

For example, the above buffer circuit is applicable as the drive circuit of an inorganic EL or LED panel. Further, the same circuit is applicable as the drive circuit of a plasma display panel. Still further, the same circuit is applicable as the drive circuit of a field emission display panel. Still further, the same circuit is applicable as the drive circuit of a liquid crystal display panel. Still further, the above buffer circuit described with reference to the embodiments is applicable as the drive circuit of a liquid crystal display panel when the backlight source includes LEDs. For example, the above buffer circuit is preferred to variably control the ratio of the lighting period to one field period. In order to accomplish this, the lighting period per field period is divided into a plurality of lighting periods so as to variably control the length of each of the lighting periods and the arrangement thereof.

(D-2) Product Examples of the Display Panel (a) Appearance

In the present specification, display panels include not only those panel modules having the pixel array section and drive circuits formed on an insulating substrate but also others having the drive circuits, manufactured as a different substrate (e.g., ASIC (Application Specific Integrated Circuit)), packaged on an insulating substrate on which the pixel array section is formed.

Figure 63:
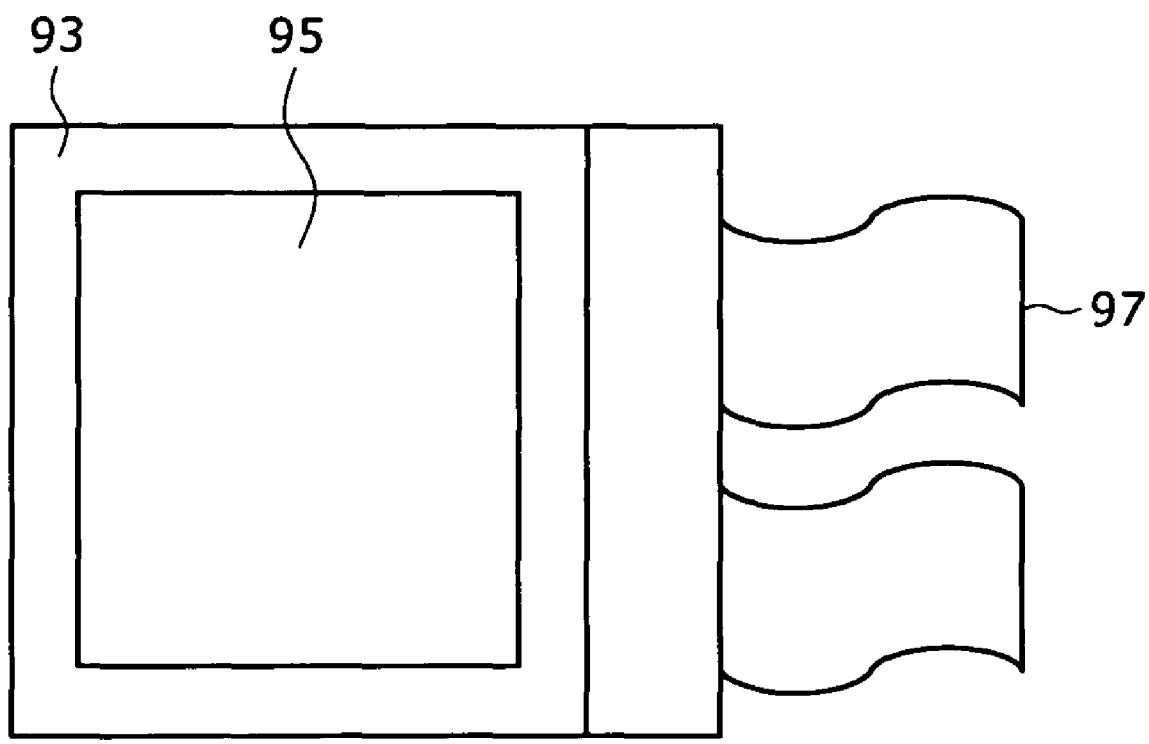
FIG. 63 is a diagram illustrating an example of appearance configuration of a display panel.

FIG. 63 illustrates an example of appearance configuration of the display panel. A display panel 91 includes a support substrate 93 and opposed substrate 95. The opposed substrate 95 is attached to the area of the support substrate 93 where the pixel array section is formed.

The support substrate 93 is made of glass, plastic or other insulating base material (insulating substrate).

The opposed substrate 95 is also made of glass, plastic or other insulating base material (insulating substrate).

It should be noted that the need for transparency of the base material varies depending on the type of display panel. In the case of a liquid crystal display panel, for example, both substrates must be highly transparent. In the case of a self-luminous display, on the other hand, only the substrate on the emitting side must be transparent.

In addition to the above, the organic EL panel module 91 includes, as necessary, an FPC (flexible printed circuit) 97 to receive external signals and drive power.

(b) Incorporation into Electronic Equipment

Figure 64:
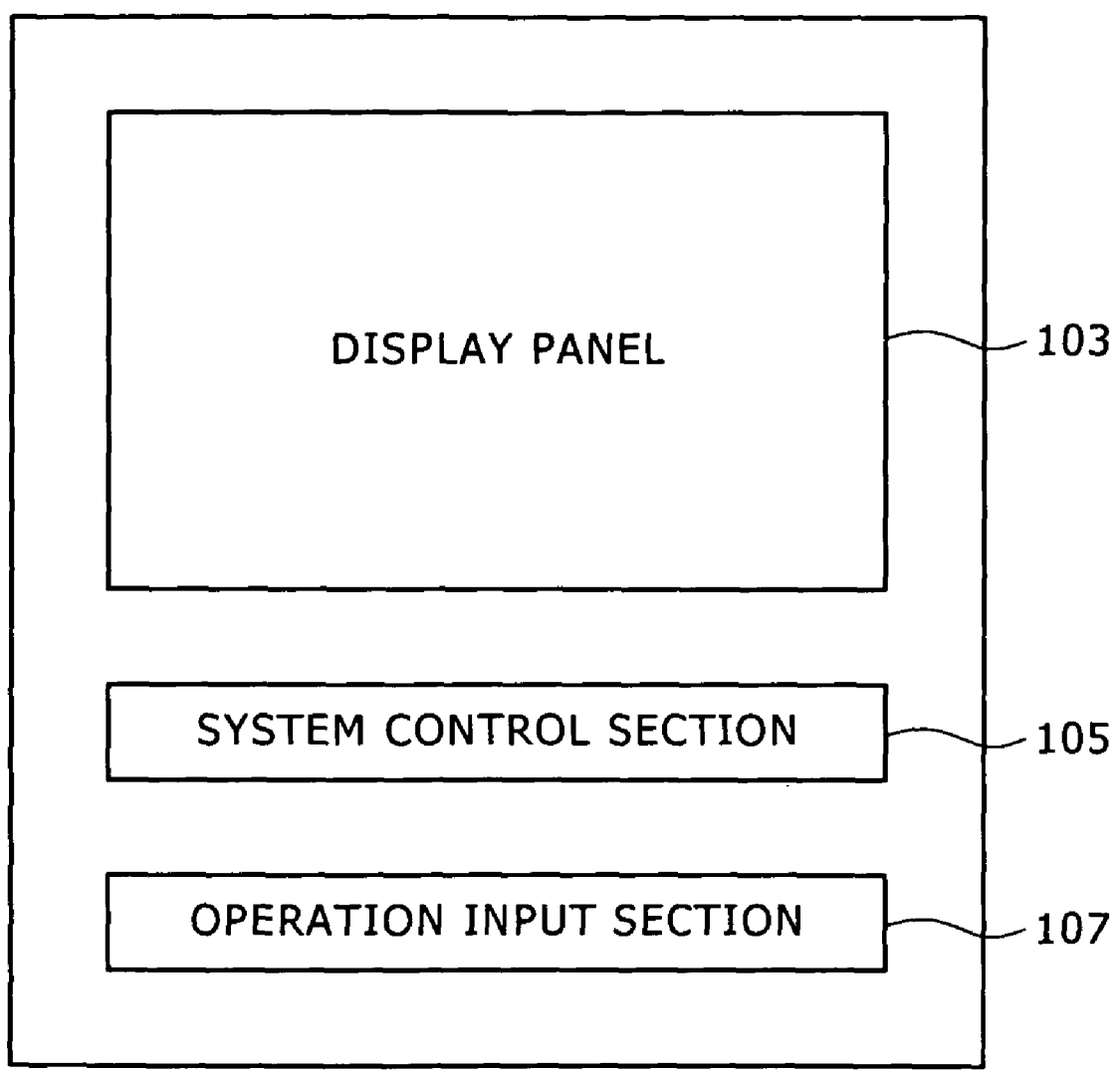
FIG. 64 is a diagram illustrating a product example of electronic equipment.

The above display panel may be in circulation in a form incorporated in a variety of electronic equipment. FIG. 64 illustrates a conceptual example of configuration of electronic equipment 101. The electronic equipment 101 includes a display panel 103 incorporating the drive circuits described above, system control section 105 and operation input section 107. The nature of processing performed by the system control section 105 varies depending on the product type of the electronic equipment 101. On the other hand, the operation input section 107 is a device adapted to accept operation inputs to the system control section 105. Mechanical interfaces such as switches, buttons and graphical interfaces are, for example, used as the operation input section 107.

Figure 65:
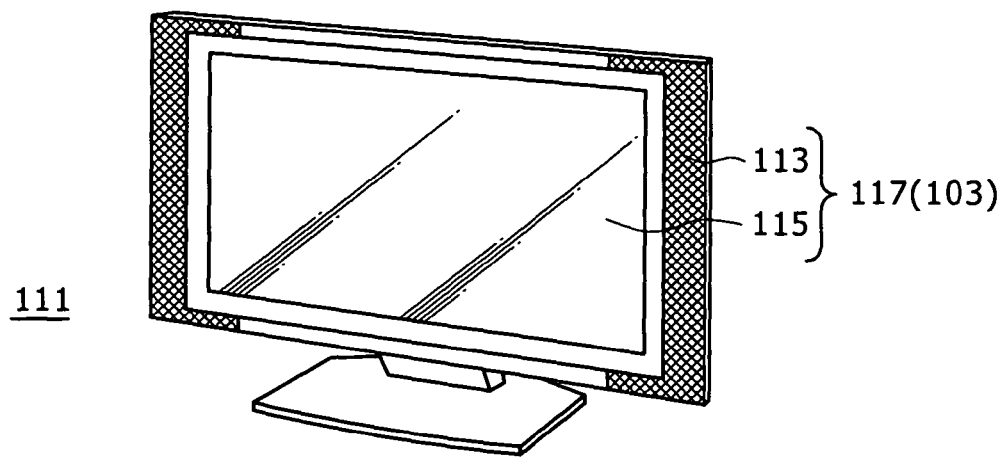
FIG. 65 is a diagram illustrating a product example of electronic equipment.

FIG. 65 illustrates an appearance example when the electronic equipment is a television set. A television set 111 has a display screen 117 on the front surface of its enclosure. The display screen 117 includes a front panel 113, filter glass 115 and other parts. The display screen 117 corresponds to the display panel 103 shown in FIG. 64.

Figure 66A:
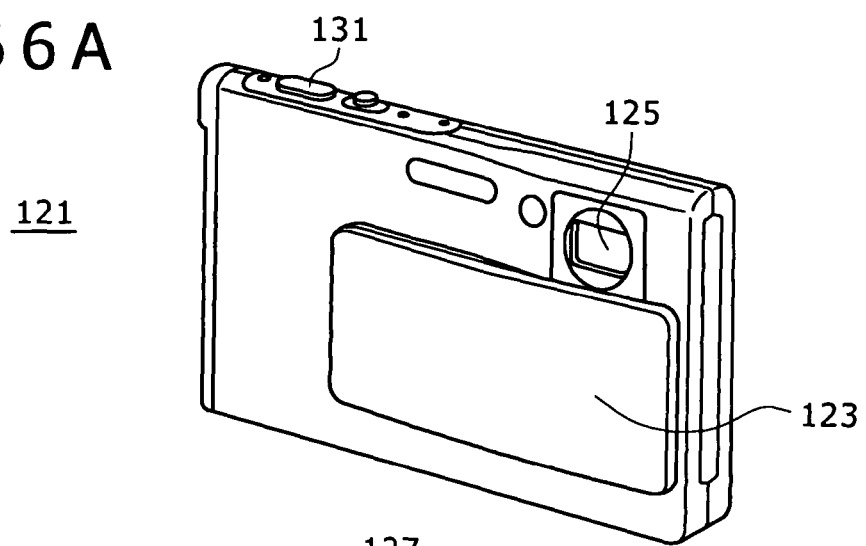
FIGS. 66A and 66B are diagrams illustrating product examples of electronic equipment.
Figure 66B:
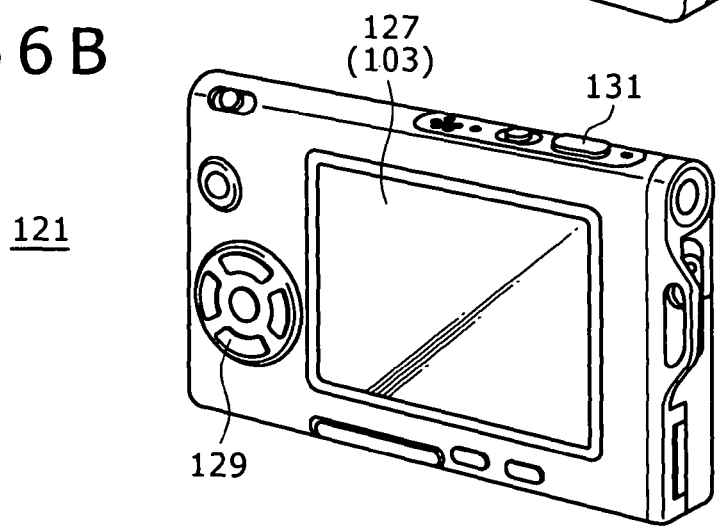

Further, this type of electronic equipment may be, for example, a digital camera. FIGS. 66A and 66B illustrate an appearance example of a digital camera 121. FIG. 66A illustrates an appearance example of the digital camera as seen from the front (as seen from the subject), and FIG. 66B illustrates an appearance example thereof as seen from the rear (as seen from the photographer).

The digital camera 121 includes a protective cover 123, imaging lens section 125, display screen 127, control switch 129 and shutter button 131. Of these, the display screen 127 corresponds to the display panel 103 shown in FIG. 64.

Figure 67:
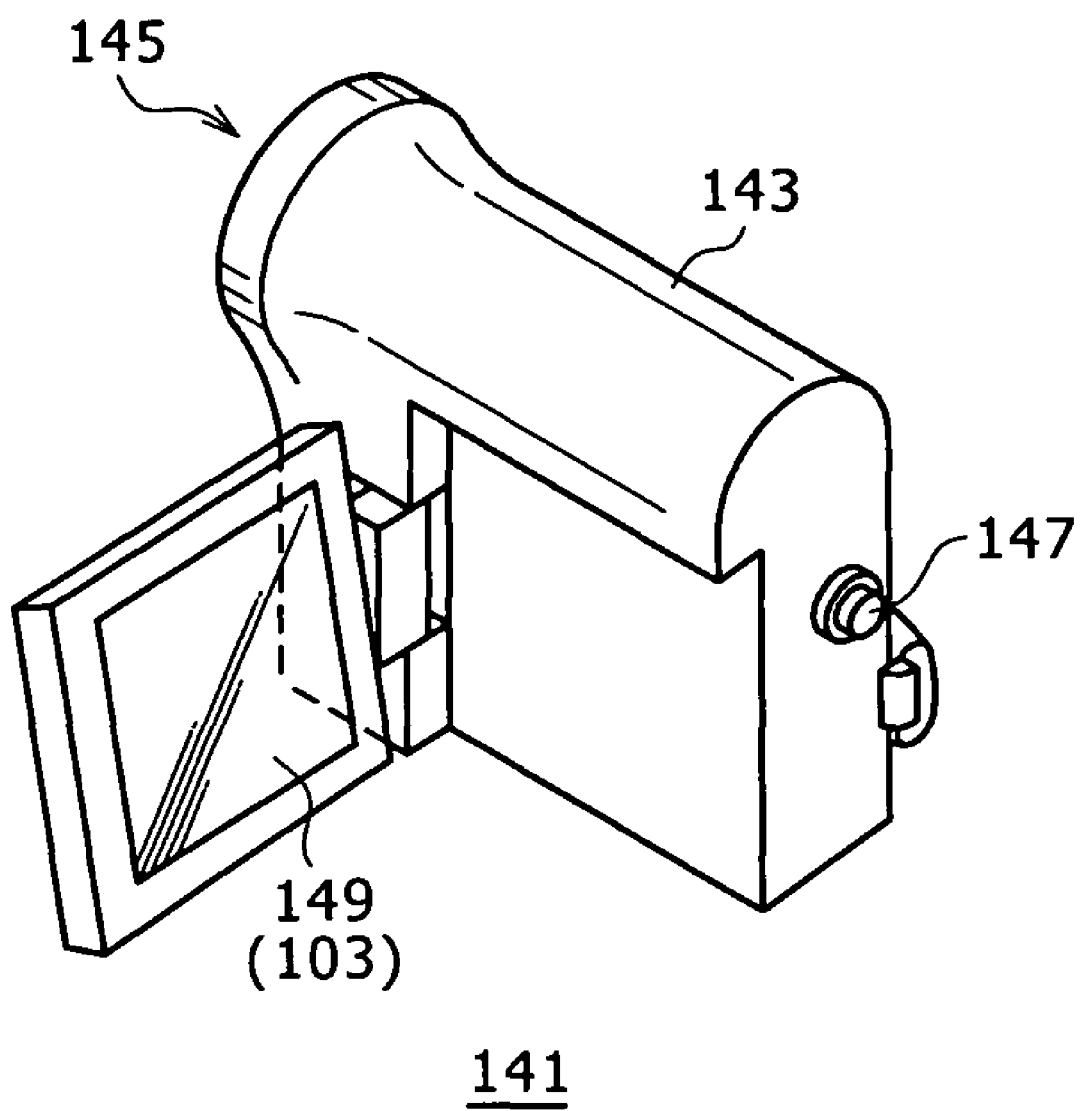
FIG. 67 is a diagram illustrating a product example of electronic equipment.

Still further, this type of electronic equipment may be, for example, a video camcorder. FIG. 67 illustrates an appearance example of a video camcorder 141.

The video camcorder 141 includes an imaging lens 145 provided to the front of a main body 143, imaging start/stop switch 147 and display screen 149. Of these, the display screen 149 corresponds to the display panel 103 shown in FIG. 64.

Figure 68A:
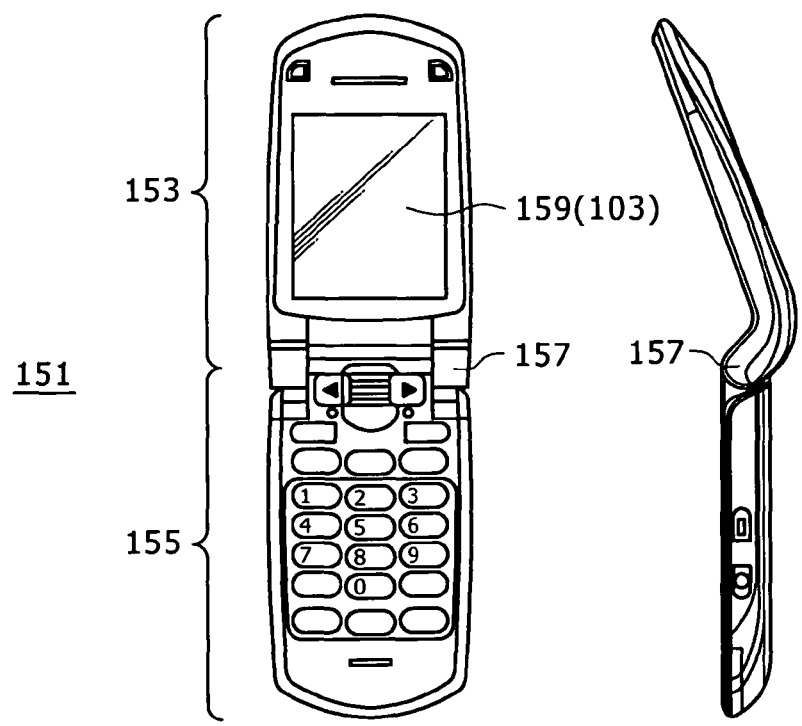
FIGS. 68A and 68B are diagrams illustrating product examples of electronic equipment.
Figure 68B:
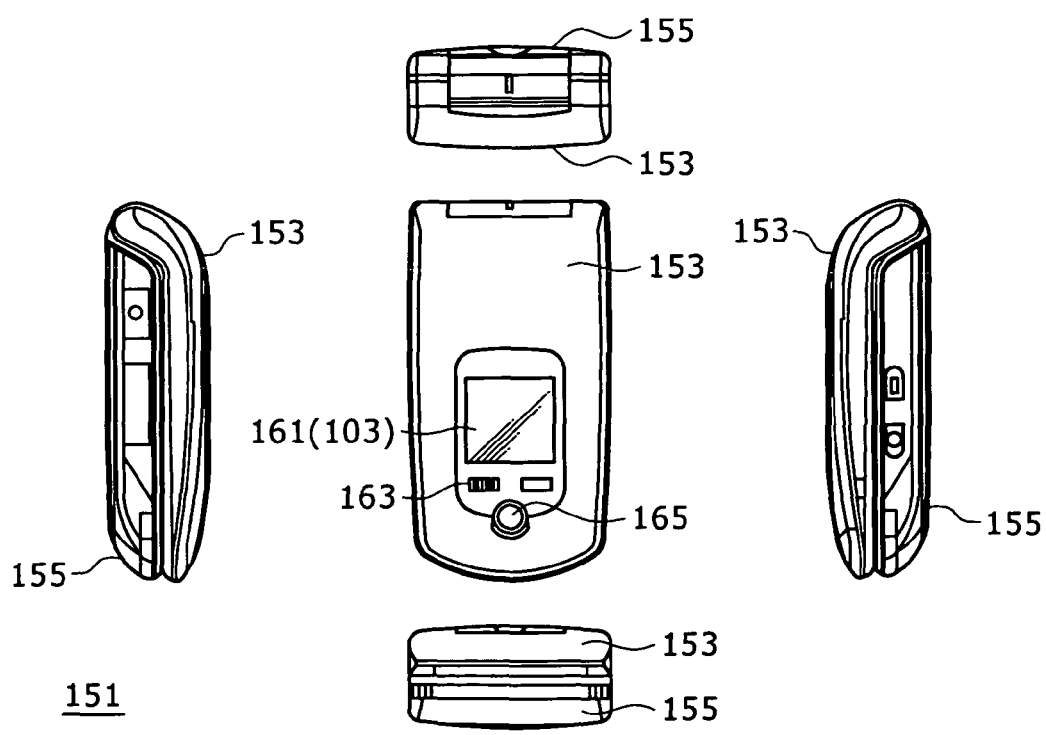

Still further, this type of electronic equipment may be, for example, a personal digital assistant. FIGS. 68A and 68B illustrate an appearance example of a mobile phone 151 as a personal digital assistant. The mobile phone 151 shown in FIGS. 68A and 68B is a folding mobile phone. FIG. 68A is an appearance example of the mobile phone in an open position. FIG. 68B is an appearance example of the mobile phone in a folded position.

The mobile phone 151 includes an upper enclosure 153, lower enclosure 155, connecting section (hinge section in this example) 157, display screen 159, subdisplay screen 161, picture light 163 and imaging lens 165. Of these, the display screen 159 and subdisplay screen 161 correspond to the display panel 103 shown in FIG. 64.

Figure 69:
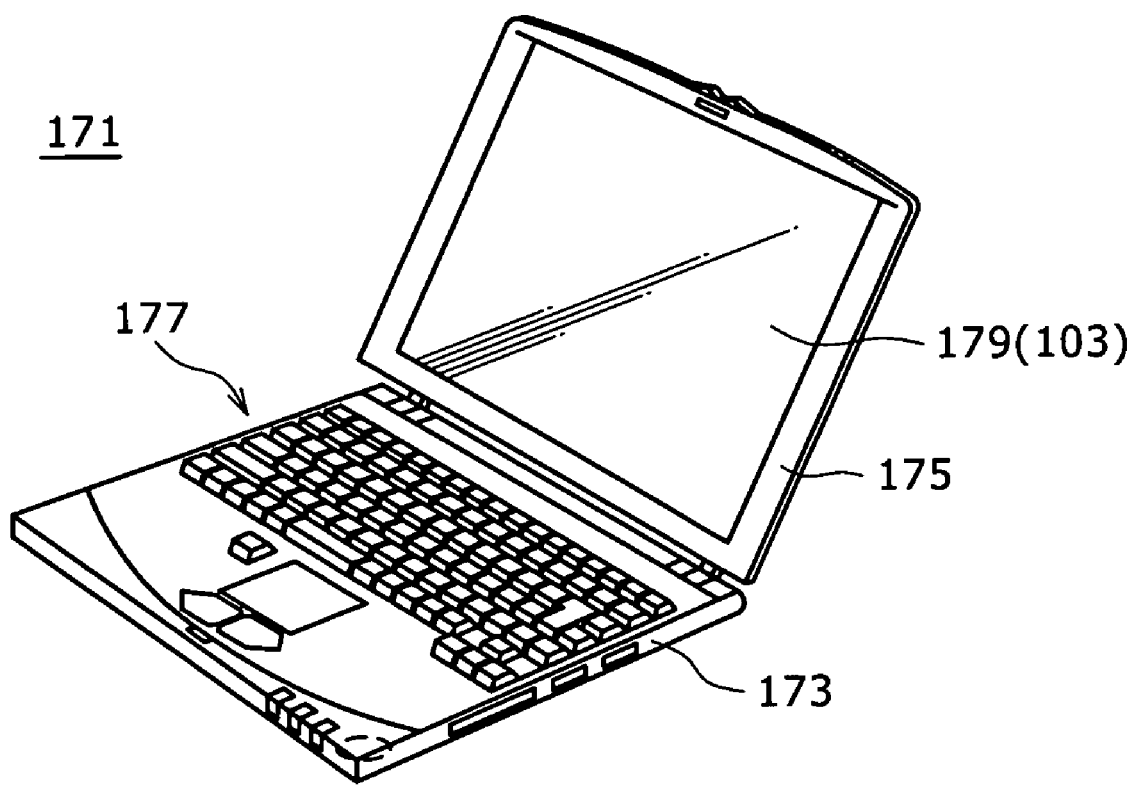
FIG. 69 is a diagram illustrating a product example of electronic equipment.

Still further, this type of electronic equipment may be, for example, a personal computer. FIG. 69 illustrates an appearance example of a laptop personal computer 171.

The laptop personal computer 171 includes a lower enclosure 173, upper enclosure 175, keyboard 177 and display screen 179. Of these, the display screen 179 corresponds to the display panel 103 shown in FIG. 64.

In addition to the above, this type of electronic equipment may be, for example, an audio player, gaming machine, electronic book or electronic dictionary.

(D-3) Application to Other than Display Panel Drive Circuits

In the description given above, applications of the buffer circuit to the drive circuits, adapted to shift the control pulses vertically in a display panel, were described.

Nonetheless, the present buffer circuit can be used to shift the control pulses horizontally. Further, the buffer circuit is applicable to all buffer circuits used on a display panel.

Still further, the buffer circuit is a highly versatile basic circuit and applicable to all semiconductor devices incorporating buffer circuits.

(D-4) Others

The embodiments described above may be modified in various manners without departing from the scope of the invention. Also, various modifications and applications may be possible which are created or combined based on the description in the present specification.

What is claimed is:

1. A semiconductor device having a buffer circuit formed on an insulating substrate using single-channel type thin film transistors, wherein
    the buffer circuit has an output stage which comprises first and second thin film transistors connected in series between first and second power sources, and
    an output terminal potential of the output stage is switched to the potential of the first or second power source in a complementary manner by the input timings of a set signal adapted to control the first thin film transistor and a reset signal adapted to control the second thin film transistor,
    wherein the buffer circuit has a first input stage whose output terminal potential is switched in a complementary manner by the input timings of the set and reset signals,
    wherein the buffer circuit has a second input stage whose output terminal potential is switched in a complementary manner by the input timings of the set and reset signals and whose output terminal potential changes in opposite phase with the output terminal potential of the first input stage, and
    wherein the output terminal potentials of the first and second input stages are used as the set and reset signals of the output stage.

2. The semiconductor device of claim 1, wherein
    an ON potential of the first or second thin film transistor is supplied by a bootstrapping of the gate potential as a result of the change of the output terminal potential.

3. The semiconductor device of claim 1, wherein
    each of the first and second input stages comprises third and fourth thin film transistors, the third thin film transistor being connected to the first or second power source, the fourth thin film transistor being connected in series to the third thin film transistor, and the other end of the fourth thin film transistor being connected to a third power source.

4. The semiconductor device of claim 1, wherein
    each of the first and second input stages comprises third and fourth thin film transistors, the third thin film transistor being a diode-connected transistor, the fourth thin film transistor being connected in series to the third thin film transistor, and the other end of the fourth thin film transistor being connected to the first or second power source.

5. The semiconductor device of claim 1, wherein
    the output terminal potential of the buffer circuit is used to control a current supply line of a display panel.

6. The semiconductor device of claim 1, wherein
    the set and reset signals are supplied from their associated shift registers.

7. The semiconductor device of claim 1, wherein
    one of the set and reset signals is supplied from a shift register, and the other from a pulse source.

8. The semiconductor device of claim 1, wherein
    the output terminal potential of the buffer circuit is used to control the lighting of a self-luminous display panel, and wherein
    the input time difference between the set and reset signals matches the lighting time length of a display panel.

9. The semiconductor device of claim 1, wherein
    the output terminal potential of the buffer circuit is used to control a sampling timing of a display panel.

10. A display panel having a pixel array section and its drive circuits formed on an insulating substrate using single-channel type thin film transistors, wherein
    some of the drive circuits have a buffer circuit,
    the buffer circuit has an output stage which comprises first and second thin film transistors connected in series between first and second power sources, and
    the output terminal potential of the output stage is switched to the potential of the first or second power source in a complementary manner by the input timings of a set signal adapted to control the first thin film transistor and a reset signal adapted to control the second thin film transistor, wherein the buffer circuit has a first input stage whose output terminal potential is switched in a complementary manner by the input timings of the set and reset signals, wherein the buffer circuit has a second input stage whose output terminal potential is switched in a complementary manner by the input timings of the set and reset signals and whose output terminal potential changes in opposite phase with the output terminal potential of the first input stage, and wherein the output terminal potentials of the first and second input stages are used as the set and reset signals of the output stage.

11. The display panel of claim 10, wherein an ON potential of the first or second thin film transistor is supplied by a bootstrapping of the gate potential as a result of the change of the output terminal potential.

12. The display panel of claim 10, wherein the output terminal of the output stage is connected to a current supply line disposed in the pixel array section.

13. The display panel of claim 10, wherein the drive circuit having the buffer circuit at its output stage has first and second shift registers as circuits adapted to supply the set and reset signals, the first shift register adapted to shift the set signal vertically in a time-sequential manner, and the second shift register adapted to shift the reset signal vertically in a time-sequential manner.

14. The display panel of claim 10, wherein the drive circuit having the buffer circuit at its output stage controls the sampling timing of each of pixel circuits making up the pixel array section.

15. Electronic equipment comprising:

a display panel having a pixel array section and its drive circuits formed on an insulating substrate using single-channel type thin film transistors;

a system control section; and an operation input section for the system control section, wherein some of the drive circuits have a buffer circuit, the buffer circuit has an output stage which includes first and second thin film transistors connected in series between first and second power sources, and the output terminal potential of the output stage is switched to the potential of the first or second power source in a complementary manner by the input timings of a set signal adapted to control the first thin film transistor and a reset signal adapted to control the second thin film transistor, wherein the buffer circuit has a first input stage whose output terminal potential is switched in a complementary manner by the input timings of the set and reset signals, wherein the buffer circuit has a second input stage whose output terminal potential is switched in a complementary manner by the input timings of the set and reset signals and whose output terminal potential changes in opposite phase with the output terminal potential of the first input stage, and wherein the output terminal potentials of the first and second input stages are used as the set and reset signals of the output stage.

\* \* \* \* \*